United States Patent [19]

Hyatt

[11] 4,364,110

[45] Dec. 14, 1982

[54] COMPUTERIZED MACHINE CONTROL SYSTEM

[76] Inventor: Gilbert P. Hyatt, P.O. Box 4584, Anaheim, Calif. 92803

[21] Appl. No.: 476,743

[22] Filed: Jun. 5, 1974

Related U.S. Application Data

[63] Continuation-in-part of Ser. No. 101,881, Dec. 28, 1970, abandoned, Ser. No. 134,958, Apr. 19, 1971, Ser. No. 135,040, Apr. 19, 1971, Ser. No. 229,213, Apr. 13, 1972, Pat. No. 3,820,894, Ser. No. 230,872, Mar. 1, 1972, Ser. No. 232,459, Mar. 7, 1972, Ser. No. 246,867, Apr. 24, 1972, Pat. No. 4,310,878, Ser. No. 288,247, Sep. 11, 1972, Pat. No. 4,121,284, Ser. No. 291,394, Sep. 22, 1972, Ser. No. 302,771, Nov. 1, 1972, Ser. No. 325,941, Jan. 22, 1973, Pat. No. 4,016,540, and Ser. No. 339,817, Mar. 9, 1973, Pat. No. 4,034,276.

[51] Int. Cl.$^2$ ............................................. G06F 15/46
[52] U.S. Cl. ..................................... 364/107; 364/120; 364/200; 364/474
[58] Field of Search ................... 235/151.11; 364/474, 364/107, 118, 120, 200 MS File, 900 MS File, 131-136, 167-171, 188-190

[56] References Cited

U.S. PATENT DOCUMENTS

| | | | |
|---|---|---|---|
| 3,110,865 | 11/1963 | Scuitto | 235/151.11 |
| 3,122,691 | 2/1964 | Centner et al. | 235/151.11 |
| 3,174,367 | 3/1965 | Lukens | 235/151.11 |
| 3,187,321 | 6/1965 | Kameny . | |
| 3,283,129 | 11/1966 | Kelling | 124/151.11 |
| 3,308,279 | 3/1967 | Kelling | 235/151.11 |
| 3,312,884 | 4/1967 | Gabor | 235/151.11 |
| 3,315,235 | 4/1967 | Carnevale et al. | 340/172.5 |
| 3,324,458 | 6/1967 | MacArthur | 340/172.5 |
| 3,346,853 | 10/1967 | Koster . | |
| 3,349,229 | 10/1967 | Evans | 235/151.11 |
| 3,389,404 | 6/1968 | Koster . | |
| 3,406,379 | 10/1968 | Palevsky . | |
| 3,462,742 | 8/1969 | Miller et al. | 364/200 |
| 3,548,172 | 12/1970 | Centner et al. | 235/151.11 |
| 3,566,365 | 2/1971 | Rawson . | |
| 3,569,814 | 3/1971 | Rosenberg | 364/107 |
| 3,573,738 | 4/1971 | Bottles et al. | 364/107 |
| 3,582,749 | 6/1971 | Wenzel | 318/571 |
| 3,593,313 | 7/1971 | Tomaszewski | 364/200 |
| 3,596,256 | 7/1971 | Alpert . | |
| 3,602,994 | 9/1971 | Layman | 318/571 |
| 3,612,841 | 10/1971 | Kosem et al. | 235/151.11 |
| 3,626,385 | 12/1971 | Bouman | 340/172.5 |
| 3,629,560 | 12/1971 | Slawson | 364/107 |
| 3,633,011 | 1/1972 | Bederman et al. | 340/172.5 |
| 3,634,662 | 1/1972 | Slawson | 235/151.11 |
| 3,634,664 | 1/1972 | Valek | 235/151.11 |
| 3,646,522 | 2/1972 | Furman | 364/200 |
| 3,656,377 | 4/1972 | Kosem | 235/151.11 |
| 3,665,493 | 5/1972 | Glowzewski | 235/151.11 |
| 3,668,503 | 6/1972 | Lindner | 318/665 |
| 3,668,653 | 6/1972 | Fair et al. | 235/151.11 X |
| 3,671,727 | 6/1972 | Rhoades | 235/151.11 |
| 3,684,873 | 8/1972 | Meyer et al. | 235/151.11 |
| 3,686,556 | 8/1972 | Anger et al. | 318/595 |
| 3,699,317 | 10/1972 | Middleditch | 235/151.11 |
| 3,701,888 | 10/1972 | McDaniel | 234/150.1 |
| 3,702,988 | 11/1972 | Haney et al. | 340/172.5 |
| 3,715,938 | 2/1973 | Ledergerber et al. | 235/151.11 |
| 3,720,120 | 3/1973 | Cutler | 235/151.11 |
| 3,731,177 | 5/1973 | Commander et al. | 318/603 |
| 3,739,158 | 6/1973 | Woodward | 235/151.11 |
| 3,746,845 | 7/1973 | Henegar et al. | 235/151.11 |
| 3,818,303 | 6/1974 | Rossel | 235/151.11 X |

OTHER PUBLICATIONS

Boysel–"Adder on a Chip": LSI Helps Reduce Cost of Small Machine"–Electronics, Mar. 1968, pp. 119–124.
Hopkins–"Electronic Navigator Charts Man's Path to the Moon", Electronics, Jan. 1967, pp. 109–118.
Levy–"System Utilization of LSI" IEEE vol. EC-16, No. 5, Oct. 1967, pp. 562–566.
Beelitz et al.–"System Architecture for LSI" AFIPS Conf. Proc. vol. 31, Nov. 14–16, 1967, pp. 185–200.
"The Technical Ins and Outs of Computerized Numerical Control" by Mesniaeff, Control Engineering, Mar. 1971, pp. 65–84.
Koster: "A Stored Program Display Console: Bunker Ramo Model 90"; Sixth National Symposium on Information Display: Society for Information Display: 1965.
Bauer et al.: "DODDAC-An Integrated System for Data Processing, Interrogation, and Display": Proceedings of the Eastern Joint Computer Conference; Dec. 12–14, 1961.

Booth and Booth; Automatic Digital Calculations (1953).

Computerized NC-A Step Toward the Automated Factory by Budzilovich, Control Engineering, Jul. 1969, pp. 62-68.

"Three Machine Tool Shows-or Were They Control Show?", in Control Engineering, Nov. 1970, pp. 53-56.

Miller, "Microcircuits Boost Minuteman Capability", Aviation Week, Oct. 1963, pp. 70-87.

Potter et al., "Integrated Scratch Pads Give New Generation of Computers", Electronics, Apr. 1966, pp. 119-126.

*Primary Examiner*—Joseph F. Ruggiero
*Attorney, Agent, or Firm*—Gilbert P. Hyatt

[57] ABSTRACT

An improved machine control system having a display for operator interaction is provided. Feedback machine control is provided with an integrated circuit computer. Display of edges having rotation, translation, scaling, and smoothing is also provided.

38 Claims, 33 Drawing Figures

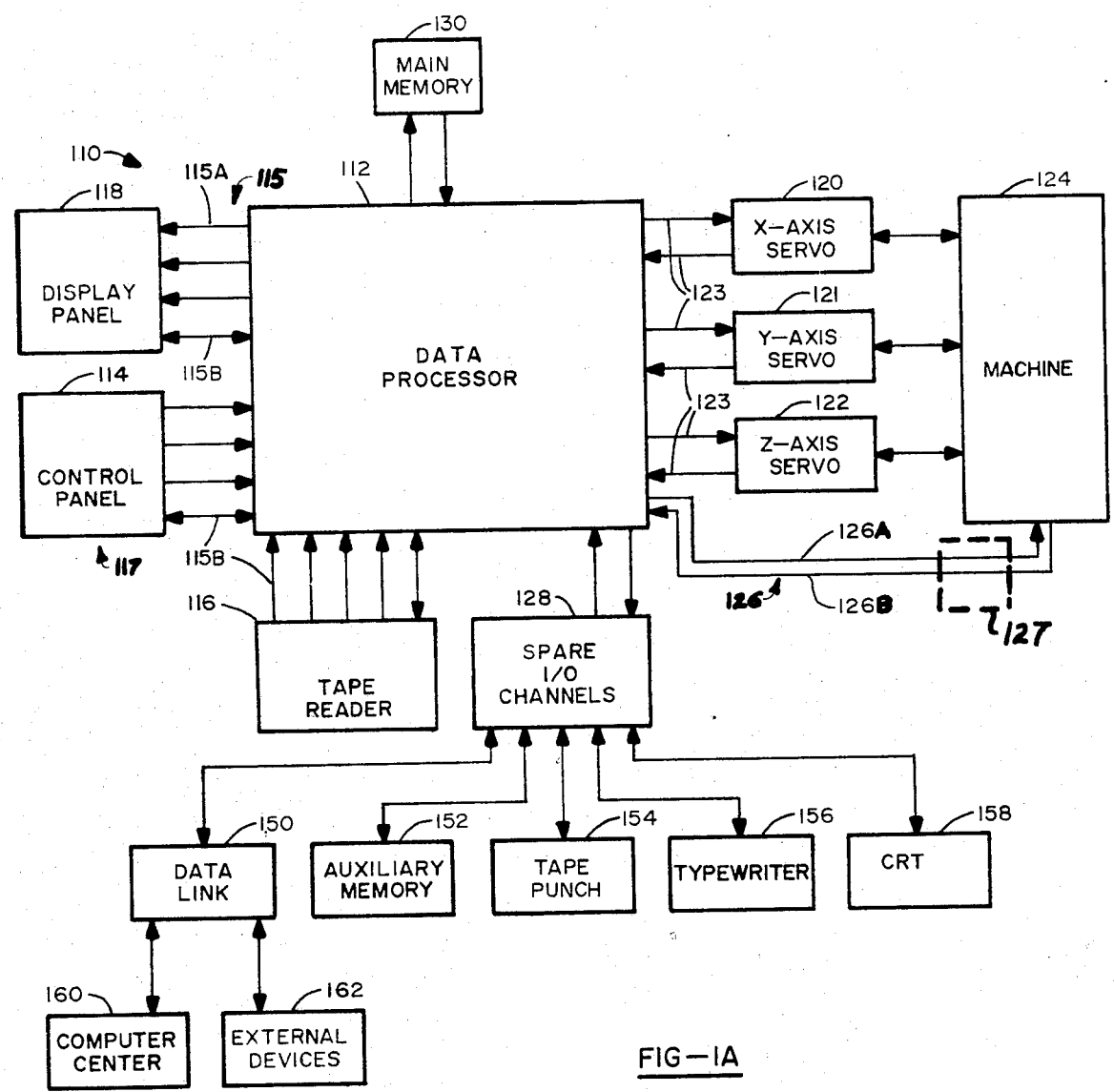
FIG—1A
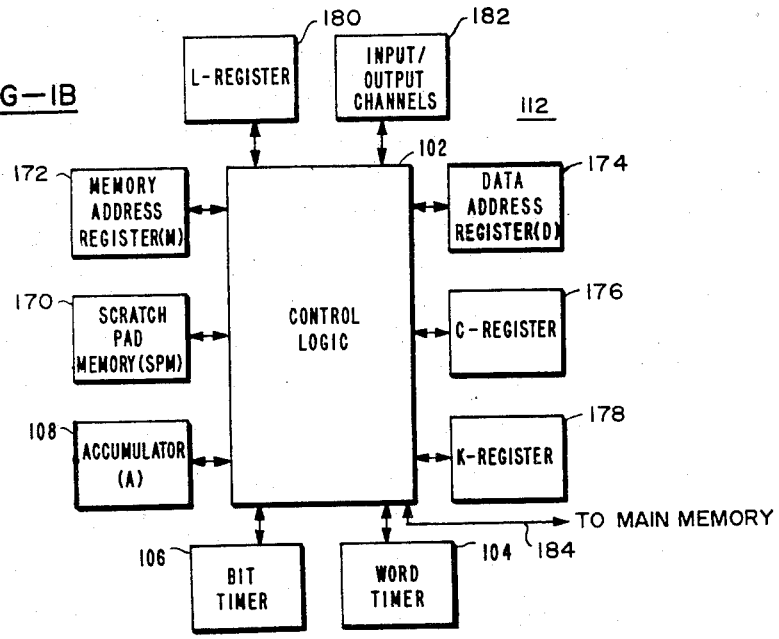
FIG—1B

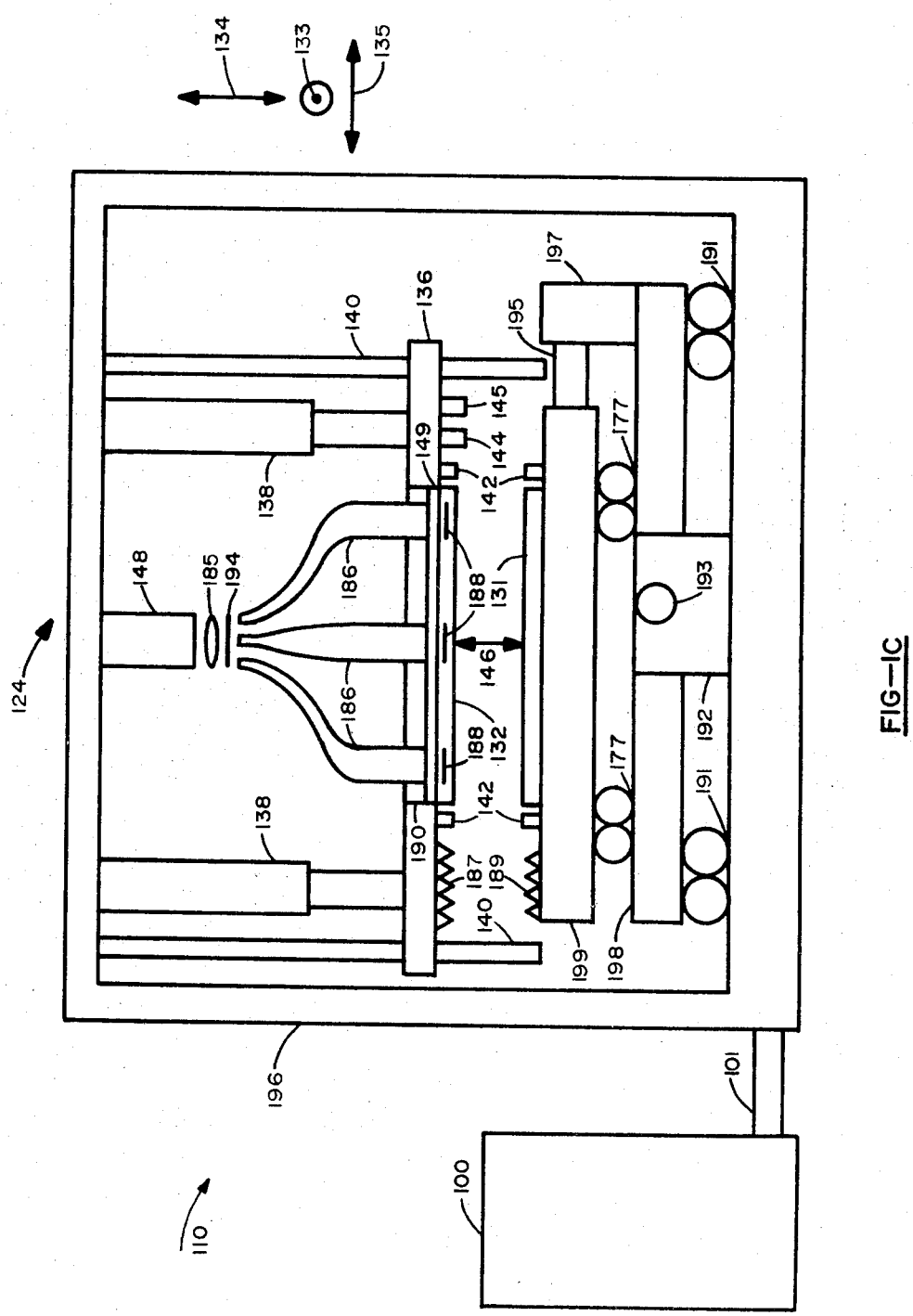

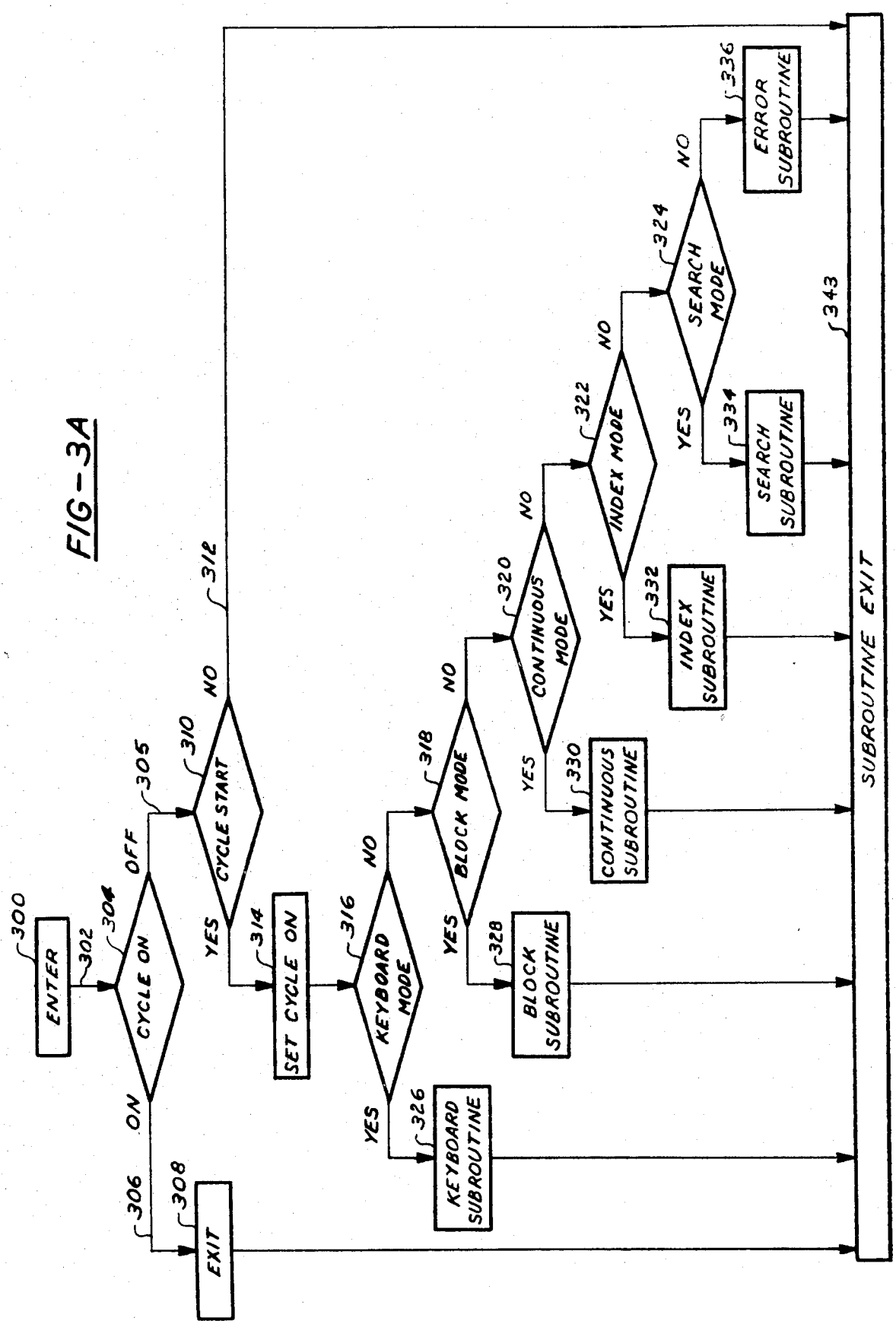

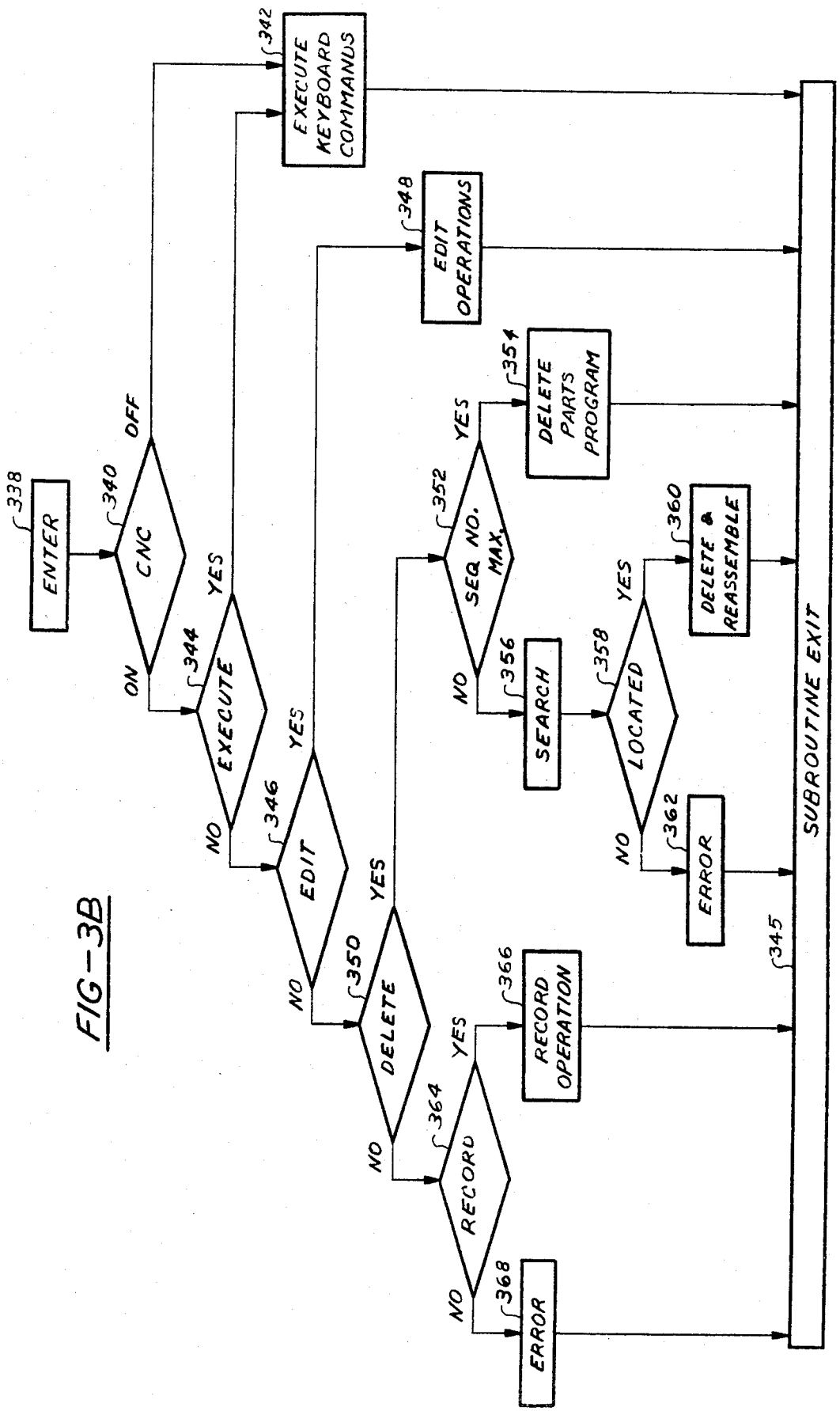

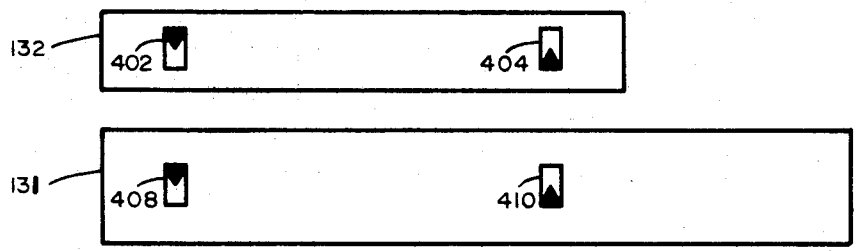
FIG-4A
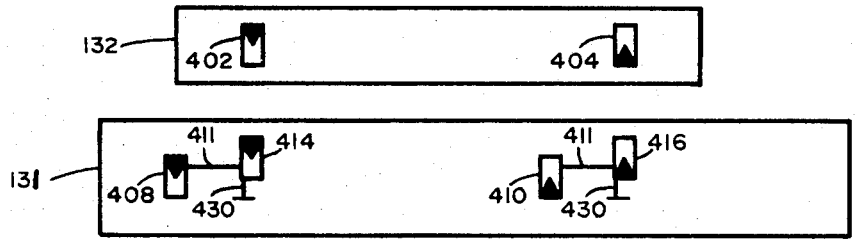
FIG-4B
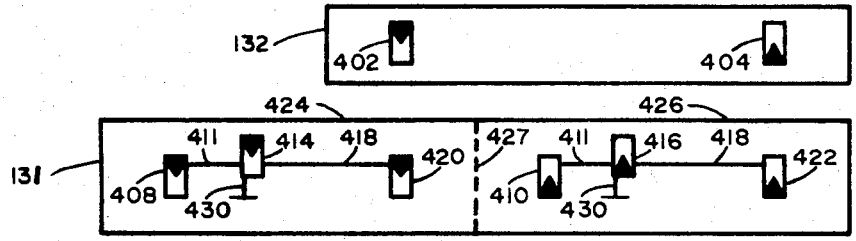
FIG-4C
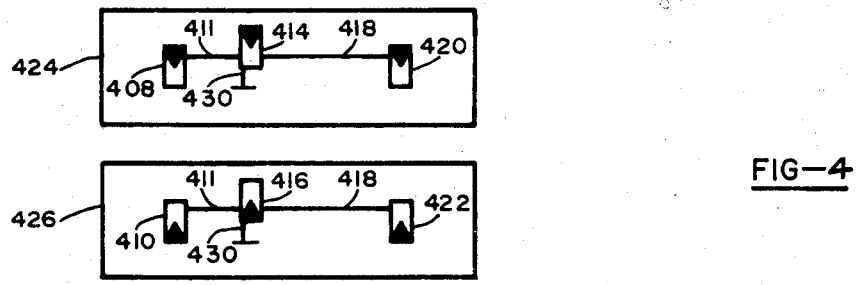
FIG-4D
FIG-4E
FIG-4

COMPUTERIZED MACHINE CONTROL SYSTEM

CROSS REFERENCE TO RELATED APPLICATIONS

This application is a continuation-in-part of copending patent applications:

(1) Factored Data Processing System for Dedicated Applications Ser. No. 101,881 filed on Dec. 28, 1970 abandoned:

(2) Control System and Method; Ser. No. 134,958 filed on Apr. 19, 1971:

(3) Control Apparatus; Ser. No. 135,040 filed on Apr. 19, 1971:

(4) Apparatus and Method For Producing High Registration Photo-Masks; Ser. No. 229,213 filed on Apr. 13, 1972; now U.S. Pat. No. 3,820,894 issued on June 28, 1974:

(5) Computerized Numerical Control System For Parts Program Checkout, Editing and Execution; Ser. No. 230,872 filed on Mar. 1, 1972:

(6) Coordinate Rotation For Machine Control Systems; Ser. No. 232,459 filed on Mar. 7, 1972:

(7) Digital Feedback Control System; Ser. No. 246,867 filed On Apr. 24, 1972 now U.S. Pat. No. 4,310,878;

(8) Computerized System For Operator Interaction; Ser. No. 288,247 filed on Sept. 11, 1972; now U.S. Pat. No. 4,121,284 issued on Oct. 17, 1978:

(9) Stored Program Data Processing System For Direct Control of A machine In Real Time with Discrete Signals; Ser. No. 291,394 filed on Sept. 22, 1972:

(10) Digital Arrangement For Processing Squarewave Signals; Ser. No. 302,771 filed on Nov. 1, 1972:

(11) Apparatus And Method For Providing Interactive Audio Communication; Ser. No. 325,941 filed on Jan. 22, 1973; now U.S. Pat. No. 4,016,540 issued on Apr. 5, 1977: and

(12) Digital Signal Processor For Servo Velocity Control; Ser. No. 339,817 filed on Mar. 9, 1973; now U.S. Pat. No. 4,034,276 issued on July 5, 1977:

all by Gilbert P. Hyatt:

wherein the benfits of the filing dates of these parent applications are herein claimed under 35 USC 120 and other authority provided therefore:

wherein this application is further related to copending applications:

(13) Interactive Control System; Ser. No. 354,590 filed on Apr. 24, 1973 by Lee, Cole, Hirsch, Hyatt, and Wimmer; now U.S. Pat. No. 4,038,640 issued on July 26, 1977: and

(14) Adaptive Illumination Source Intensity Control Device; Ser. No. 327,918 filed on Jan. 30, 1973 by Lee, Wimmer, and Hyatt; now U.S. Pat. No. 3,818,496 issued on June 18, 1974:

wherein all of the above referenced applications and patents are incorporated herein by reference.

The relationship of the above referenced applications will become apparent to those skilled in the art from the disclosures therein, the disclosures herein, the wealth of prior art knowledge and the commonality between the disclosures therein and the disclosures herein.

In order to facilitate incorporation by reference; the files of said applications Ser. No. 101,881; Ser. No. 134,958; Ser. No. 135,040; Ser. No. 230,872; Ser. No. 232,459; Ser. No. 246,867; Ser. No. 291,394; and Ser. No. 302,771 are hereby opened to the public for the limited purpose of obtaining a copy of the disclosure as-filed but not for obtaining copies of other papers therein.

BACKGROUND OF THE INVENTION

1. Field of the Invention

The field of the invention is a machine control system.

2. Prior Art

The prior art is characterized by the art-of-record of the instant application.

An improved computer system for machine control is provided. A preferred embodiment is described by using a monolithic computer in combination with direct interfacing to eliminate conventional core memories and to reduce interface logic. The data processor dedicated to the numerical control system of this invention executes parts program and operator commands to control a machine in real time to generate a part. The data processor communicates substantially directly with peripheral subsystems such as a tape reader, operator panel, servos, and a machine to reduce hardware interfaces and to improve flexibility under program control. Prior art numerical control systems are special purpose arrangements with "hardwired" logic and limited capability and flexibility. The stored program data processor arrangement of this invention significantly improves capability and flexibility through such operation under program control.

The data processor arrangement of this invention operates in real time as related to the operational requirements of the electro-mechanical devices in the system such as the machine, where prior art data processor arrangements do not operate in real time but have special purpose equipment such as a "hardwired" numerical control system to convert parts program information to real time machine commands.

A numerical control system using a stored program data processor operating under program control to perform numerical control operations according to the teachings of this invention reduces special purpose hardware yielding reduced costs, where this computerized numerical control system is low in cost yet provides the computational capability and flexibility of a stored program data processor to enhance substantially all phases of numercial control operation.

An object of this invention is to provide an improved computerized machine control system.

A further object of this invention is to provide a monolithic computer for machine control.

A still further object of this invention is to provide a system with reduced interface circuits.

A still further object of this invention is to provide a display for improved operator interaction.

The forgoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the detailed description hereinafter taken in conjunction with the drawings, as briefly described below.

FIG. 1 is a schematic and block diagram representation of the system of the present invention comprising FIGS. 1A, 1B and 1C wherein FIG. 1A is a schematic and block diagram representation of a machine control system, FIG. 1B is a block diagram representation of a data processor, and FIG. 1C is a schematic and block diagram representation of a contact print machine.

FIG. 2 is a schematic and block diagram representation of an operator panel comprising FIGS. 2A and 2B wherein

FIG. 4 is a schematic representation of high registration contact print operations comprising FIGS. 4A-4E showing sequential operations.

Figure 2A:
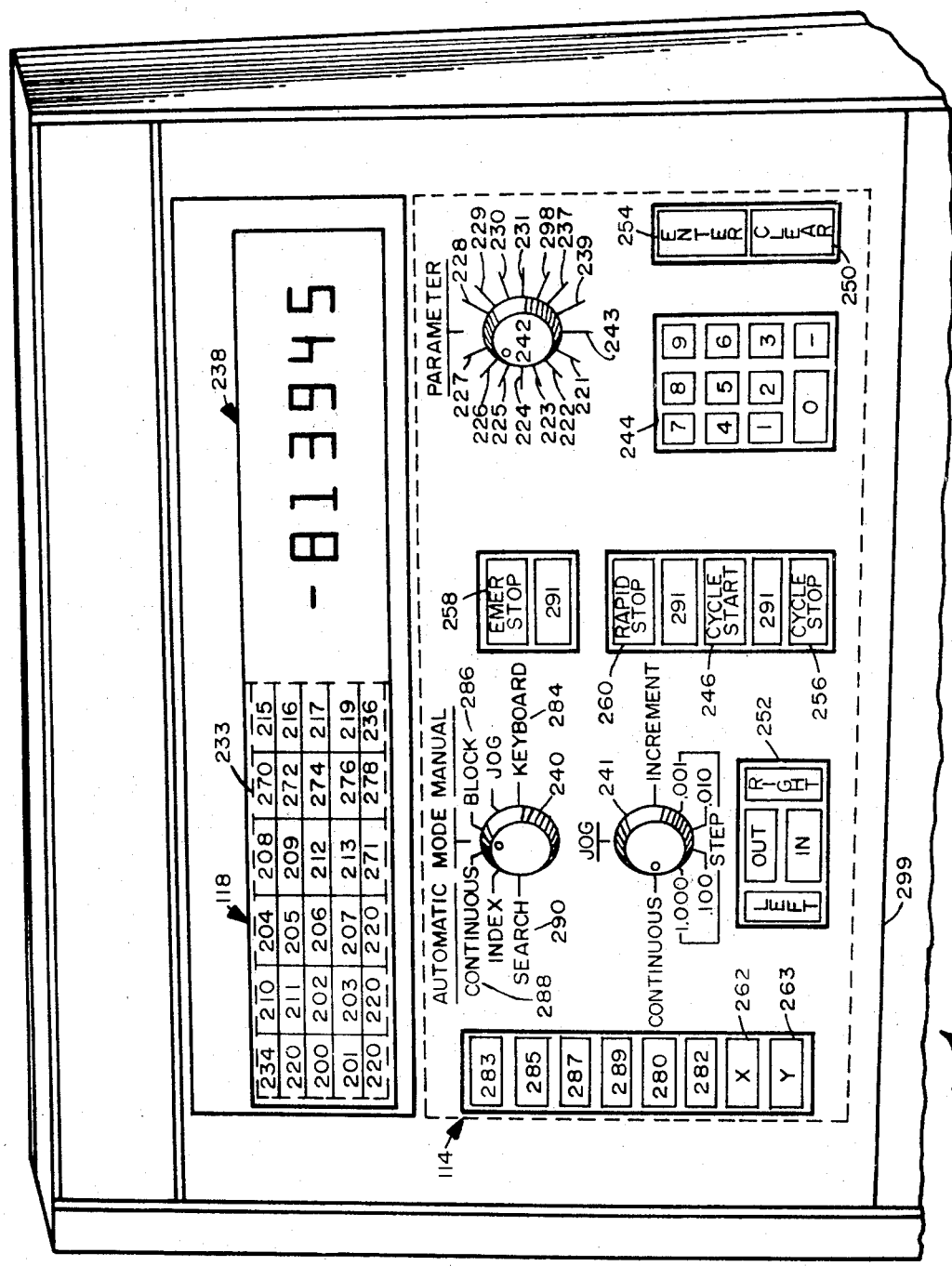
FIG. 2A shows a front view of the operator panel and FIG. 2B shows a front view of the operator panel that is partially broken away and panel circuit components.

By way of introduction of the illustrated embodiments, the components shown in FIGS. 1 through 9 of the drawings have been assigned general reference numerals and a brief description of each such component is given in the following description. The components in each figure have in general been assigned three digit reference numerals wherein the hundreds digit of the reference numeral is related to the figure number where for example the components in FIG. 1 have reference numerals between 100 and 199 and the components in FIG. 2 have reference numerals between 200 and 299 except that the same component appearing in successive drawing figures has maintained the first reference numeral.

FIGS. 1C, 3A-3F and 4 are discussed in detail in the material that is incorporated by reference from related application Ser. No. 752,751 now U.S. Pat. No. 4,120,583.

DETAILED DESCRIPTION OF THE INVENTION

A contact print photo-optical machine embodiment is disclosed in related application Ser. No. 752,751 at page 10 line 2 to page 42 line 21 (now U.S. Pat. No. 4,120,583 at column 5 line 57 to column 21 line 23); which disclosure is herein incorporated by reference.

Control Unit

A numerical control system embodiment is disclosed in related application Ser. No. 752,751 at page 43 line 2 to page 56 line 31 (now U.S. Pat. No. 4,120,583 at column 21 line 26 to column 28 line 13); which disclosure is herein incorporated by reference.

The CNC system of the present invention is represented in block diagram form in FIG. 1A as a numerical control system 110, including an electronic data processor 112, arranged in accordance with the invention. A specific example referred to here and described hereafter relates to a multi-axis controlled machine, but it will readily be appreciated that systems in accordance with the invention may be applied to a wide variety of tasks including communication, process control, processing of business data and other control functions such as photo optical pattern generators and multiturret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a main memory 130. The basic architecture of this data processor will permit an integrated circuit memory, such as a read-only memory (ROM), or a random-access memory (RAM) or flip-flop type memory to be substituted for the main memory 130, which might be called a monolithic computer.

The architecture of the computer is oriented towards a factored computer system to permit the data processor to operate in close conjunction with the extremities for this factored computer system. The special organization and instruction repertoire aid in implementing this factored computer system.

The operator panel 117 operates with the data processor in a mutually interdependent fashion to yield interactive capability for operator functions.

The photoelectric tape reader 116 is an extremity that inputs programs to define a part for the machine 124. The real time non-adapted signal form intrinsic to the tape reader 116 includes not only data but tape reader characteristics caused by photo-optical, electromechanical, and electrical effects that are inherent to the tape reader. The data processor accepts these intrinsic signal forms directly from the tape reader and derives the required data from the ambiguity and errors present in this intrinsic signal form.

The machine 124 may be an extremity of the system which can be implemented as an elemental extremity in conjunction with the data processor. Direct control of the various machine operations, such as storing the tool positions, compensating for tool characteristics, and controlling a turret motor for tool selection, reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 120, 121, 122 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole number square wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer operations of controlling, performing mathematical operations, and storing data into a physically distributed, operatively dispersed system providing concurrent internal control of coaction with associated extremities. Although interfacing is not prohibited, these systems utilize substantially direct communication with elemental subsystems as needed for a chosen class of tasks.

One technical area in which systems in accordance with the invention have particular advantage is in the control of multi-axis machine tools and the control of photo optical plotters to provide output products. Other areas of particular advantage include the processing of communications and business data, for instance, payroll processing and inventory control. In all of these applications the data processor 112 in the system can receive rudimentary data in intrinsic signal form from an elemental extremity such as an axis servo, process the non-adapted intrinsic signals in real time, and provide data to the system. The data processor 112 in the system in turn commands an output device in a signal form which may be readily useable by or intrinsic to the output device, such as a servo system. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign but primarily involves changes in the data processor program.

A general purpose data processor in accordance with this invention may include multiple data and program registers, a random access memory and a scratch pad memory, and non-buffered, directly coupled input-output lines connected to elemental input-output devices. These elements perform basic or prime functions and are physically distributed at different locations in the system, with operative dispersion making them functionally available throughout the system. This system comprises a numerical control machine, e.g. for multi-axis controlled machine, and closely integrates the operator and other input and output operations into the numerical control tasks. Minimal structure input-output extremities in this particular example comprise an elemental tape reader 116 and operator panels 114 and 118, servos 120, 121, 122 for independent servo axis control and a passive data display 118. The data processor, in real time, concurrently monitors these extremities, pre-processes the external manifestations into machine-adaptable or intrinsic data, and generates extremity intrinsic or extremity-adapted extrinsic commands. The system concurrently operates under program control to perform the other aspects of the task, including carrying out complex computations for path control, generating servo commands for each of the controlled axes, sequencing through the program, providing other machine controls and generating graphical and printed output data if needed.

Part program inputs are provided by a photoelectric punched tape reader 116 having Model No. RRSO30-4RA, manufactured by Remex Electronics.

Data and program storage is provided by a main memory 130 which may be a commercially available memory having Part No. 909838-A01, manufactured by Electronic Memories, Inc. This is an 8 bit 4096 word core memory which is primarily devoted to program storage. Remaining portions may be used for data storage if desired. In one embodiment, the main memory 130 may be replaced by a read-only memory (ROM) or flip-flop memory.

In a typical example of the operation of the system of FIG. 1A for control of a machine 124, the data processor 112 accepts part program data from the tape reader 116 and operator inputs from the control panel 114 to commence the computation of servo commands. As the reader 116 and panel 114 are operated, the processor 112 is under program control to monitor the operative states and pre-process the rudimentary data. Concurrently, and also under program control, the display panel 118 is activated by exciting the passive elements to form desired characters at a flicker-free rate. These time related monitoring and pre-processing subtask operations concerned with the extremities continue to be carried out as needed as the processor 112 performs the computational and processing operations concerned with its main task, that of executing the parts program in real time.

Thereafter, command data is translated into servo commands for the individual servos 120, 121, and 122, in intrinsic servo signal form. Feedback signals in the intrinsic servo format are likewise returned to the processor 112, pre-processed by the data processor 112 under program control for conversion into the processor base language and utilized in further computations.

There are profound differences between systems thus arranged and operated and systems of the prior art. In the physical and operational sense, the data processor 112 is a much greater portion of the whole, and the associated units 114, 116, 118, 120, 121, and 122 are extremities of the processor 112. These extremities, which may not be independent in terms of control, are largely directly coupled to the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing of the nonadapted signal forms for interpretation of signals and meaningful time related data transfer. In this respect, digital buffering, conversion, and signal conditioning operations ordinarily provided by interface logic circuits are also avoided. Furthermore, the processor 112 itself need not be tailored in configuration to cooperate with predetermined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified with a minimum of hardware changes to perform another task. Such change primarily involves modification of the system program and also modification of the subtask programs and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general purpose computational capability of the system hereafter described may perform many additional operations such as contouring.

The data processor 112 is organized to operate in a manner somewhat similar to presently known stored program digital computers. The fundamental theory and technology of such presently known systems are described in Chapter 11 of *DIGITAL COMPUTER DESIGN FUNDAMENTALS*, Yaohan Chu, McGraw-Hill Book Co., Inc. (New York 1962) incorporated herein by reference.

The data processor 112 includes a 12-bit memory address register (M-Register) which defines a memory location being accessed in the main memory. A memory data register (D-Register) provides communication with the memory and an accumulator (A-Register) receives the results of numerical and logical operations and communicates with several input/output (I/O) channels. Scratch Pad Memory (SPM) Registers provide alterable intermediate operand storage separated from the main memory. A three bit counter divides the execution of program instructions into word times and a four bit counter subdivides the word times into bit times.

The data processor operates by performing programmed instructions received from main memory 130 at other storage. When an instruction is received, control logic causes the data processor to progress through a sequence of micro-operations, the exact path being related to the instruction being executed. Each micro-operation occurs during one of eight word times, 0 thru 7 executing a micro-operation portion of the instruction being executed. Upon completion of a last micro-operation, the data processor returns to a first micro-operation to begin execution of the next instruction accessed from the main memory 130.

Referring now to FIG. 1A, the tape reader 116 may be a commercially available paper tape puncher and reader such as Model RRSO304RA manufactured by Remex Electronics. However, it has been found that by implementing this tape reader 116 as an Elemental Extremity and using the Intrinsic Signal Form concept and Operative Dispersion concept, significant advantages can be achieved. One arrangement is described in detail in application, "A Method and Apparatus for Processing the Digital Output of an Input Means," Ser. No. 879,293, filed Nov. 24, 1969, by Gilbert Hyatt; incorporated herein by reference. Generally, the system operates by having the data processor sample the output of the tape reader 116 at a cyclic rate which is much faster than the operation of the tape reader 116 in a manner similar to the sampling of the control panel outputs. Punching and formatting of the paper tape is in accordance with EIA standards RS-274-B, interchangeable perforated tape variable block format for contouring and contouring/positioning numerically controlled machines incorporated herein by reference.

In the CNC system shown in FIG. 1A, the data processor 112 communicates with the operator panel 117 comprising the control panel 114 and the display panel 118 over signal lines 115. The primary purpose of the main memory 130 is to contain the stored program for the data processor 112. In one embodiment, this main memory may be a core memory and may also be used to store a parts program. The tape reader 116 is used to load a parts program and other data. In one mode of operation, this tape reader 116 is used to access the parts program for execution by the data processor 112 to control the machine 124. In another mode of operation, this tape reader is used to access the parts program for loading a parts program memory, which may be a portion of the main memory 130 or auxiliary parts program memory 152.

Various CNC commands may be entered through the tape reader 116 and the control panel 114 to provide the CNC capability described in conjunction with the flow diagrams in FIGS. 3A–3G. In addition, special CNC panel controls can be provided for entering CNC commands in place of or in addition to the tape reader means of entering these CNC commands. Other embodiments and methods for providing this capability will become obvious to those skilled in the art from the teachings of the present invention.

The data processor 112 may access other subsystems through the spare I/O channels 128 for alternate sources of CNC commands, alternate sources of parts programs, and alternate parts program memories. The machine 124 is controlled with multiple axis servos 120, 121, and 122 operating from data processor real time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in the parent patent application, Control System and Method; and machine response time such as for tool change and spindle speed change requirements. These machine command requirements place a real time operation constraint on the control system 110. Real time machine commands are herein intended to mean commands to the machine 124 with time constraints dictated by machine requirements.

Parts program information is typically accessed by a punched tape reader 116 but may be obtained from other sources. One source may be a remote large scale computer system that generates the parts program with an APT compiler, then transmits this program over a data link 150 to the CNC system 110. The data link 150 could be a telephone line or other well known means with appropriate terminal devices such as modems that are well known in the art. This data link 150 would connect to this CNC system 110 through the auxiliary I/O channels 128 for access of the data by the data processor 112. Another source of parts program data is from a typewriter 156 such as a Teletype model ASR-33 or from other well known sources of digital information such as computer peripherals.

The parts program memory in one embodiment is a portion of the data processor main core memory; but may be a drum memory, disc memory, shift register memory or other such memory well known in the computer art. This parts program memory may be an internal part of the CNC system 110 as with the main memory 130 and the data processor scratch pad memory, or may be a peripheral of the CNC system 110 with communication through the spare I/O channels 128. In some cases interface controllers such as a disc memory controller may be required with the peripheral memory. These memories, controllers, and associated devices are well known in the computer art.

A well known auxiliary input and output channel 128 is a 110 baud auxiliary channel for communication with a typewriter such as a Teletype Corporation Model ASR-33, a data link 150, an alpha-numeric CRT 158, a remote large scale computer center 160, or other devices. This 110 baud auxiliary channel provides serial data at a rate of approximately 110 bits per second. Eleven bits are required for each word; comprising a start pulse, eight data pulses and two stop pulses. In this invention, the data processor 112 performs the timing, control, sequencing, and buffering operations associated with the signal processing and command signal generation under program control, thereby eliminating the requirement for prior art interface control devices.

For data inputs, a well-known transistor line receiver circuit provides digital integrated circuit signal levels. Now referring to FIG. 5, the data processor periodically samples the input line with a Skip-On-Discrete SD instruction thru Discrete Input-2 DI-2 on pin 69 (which is a Skip On ASR input relating to the Teletype Corporation typewriter Model ASR-33) under program control to detect a start pulse. If a start pulse is not detected, the data processor performs other program operations. If a start pulse is detected, the data processor branches to an input program, performing time delay calculations to determine when to sample each successive input sequential bit. This sample time delay precludes errors due to noise such as switch bounce that occurs at the transition between binary states. The data processor assembles the successive serial bits from this input into a digital word, further processes that word for a parity check and a BCD to binary conversion and stores the data for later use. The data processor treats these input signals as rudimentary signals which have a quasi-digital characteristic rather than as absolute digital signals because these rudimentary signals have non-digital characteristics.

For data outputs, the data processor generates commands by loading a sequence of digital command bits into an interface command flip-flop at approximately that 110 cycle bit rate. The data processor assembles the eight bit data word with a one bit leading start pulse and two bit trailing start pulses in the A-Register 108 (FIG. 1B). This word as updated is stored in the data processor for successive output iterations. The data processor fetches this word from storage, then outputs this assembled word to the appropriate auxiliary output channel at a 110 baud rate (approximately 0.009 second intervals), where the appropriate data bit is latched in an interface flip-flop for this period of time inbetween outputs, where this output flip-flop latch excites a well known interface line driver to drive the output device. Two auxiliary output channels will be described for this system, while others will then become obvious to those skilled in the art.

The first output channel will be described with reference to FIG. 5B. The output word is assembled with the start pulse in the most significant position of the A-Register ($A_{15}Q$), with the next sequential data bits in descending order in that register. The Z11 flip-flop is used as the output flip-flop latch to generate the YL-5 output signal on pin 50 to the line driver and output device. The A-Register word is output under control of the EX-7 input/output instruction, where the A-Register contents are shifted into the Z-Register as $P4(A_0Q)$ on pin 48, with the EX-7 instruction gated clock provided as OW-7 on pin 5. The most significant bit of that output word is latched up in the Z11 flip-flop to provide the YL-5 output signal. The assembled word is loaded into the A-Register and is next shifted left to place the next sequential data bit in the most significant position for the next output iteration, then stored in the data processor for further use.

The second output channel will be described with reference to FIG. 5A. The output word is assembled with the start pulse in the least significant position of the A-Register ($A_0Q$), with next sequential data bits in ascending order in that register. An interface flip-flop latch such as latches $I_1$–$I_4$ (FIG. 5A) is used to generate an output signal to a line driver (not shown) and output device. The A-Register least significant bit signal $A_0Q$ on pin 80 is presented to that interface flip-flop, which is then clocked with the DO-1 pulse on pin 71 (which is the ASR Output Set relating to the Teletype Corporation typewriter model ASR-33) generated with a Discrete Output-1, DC-1, instruction. The least significant bit of the A-Register word $A_0Q$ is therefore latched up in the interface flip-flop to provide the output signal. The assembled word is loaded into the A-Register and is shifted right to place the next sequential data bit in the least significant position prior to the next output iteration, then stored in the data processor for further use.

The auxiliary I/O channels 128 can accommodate various other I/O devices 152-158 and the data link 150 can accommodate various other external devices 162 as will now become obvious to those skilled in the art.

In yet another embodiment of this invention, the numerical control system 110 receives parts program commands from a remote computer facility over a data link 150 such as a telephone line. The data processor 112 is responsive to this parts program information and generates response over the data link 150 to verify receipt of the information, request more information, or other such communication. For example, the parts program can be transmitted over the data link 150 to the CNC system 110 one block at a time. The CNC system 110 executes each block as received to control the machine 124 as commanded by the parts program. The CNC system 110 also requests a new block when required. This form of operation permits CNC operations without the requirement for the parts program memory or the tape reader as the sources of parts program commands.

CNC operations may use the operator panel controls such as the selector switches and momentary switches. The control panel 114 permits convenient addition of switches as described herein. The lamp and numeric displays inform the operator of the system conditions. Position of the Mode selector switch 240 in conjunction with the CNC condition lamp displays 270, 272, 274, 276, 278 define the response of the data processor 112 to operator commands.

One of the modes of operation provides typewriter inputs such as with a Teletype Model ASR-33, connected to the system with well known interface devices for communication between the operator and the system. Various letter symbols typed by the operator are used as commands to the data processor such as E for edit or input a tape, C for check a tape, R for record or output data and other such symbolic commands. Numbers following a letter command further define the command parameters.

Still another means for providing CNC commands is over a data link 150 such as communicating with a remote computer system. This remote computer system may be a time share system, a remote batch processing system, or other computer system such as the System 360 manufactured by International Business Machines and the Model 1108 manufactured by Univac.

CNC commands can be obtained from many sources to select the modes of operation, the sources of parts program commands, and other commands.

Data Processor Description

As shown in FIG. 1A, the data processor 112 receives data from the various input sources, performs calculations or otherwise manipulates data in accordance with the input information and outputs processed information to control the machine 124 through servos 120, 121 and 122 and auxiliary control signals 126. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The data processor of the present invention is discussed in detail herein; is discussed in further detail in the material that is incorporated by reference from parent application Ser. No. 246,867 now U.S. Pat. No. 4,310,878; is discussed in still further detail in the material that is incorporated by reference from parent application Ser. No. 232,459 issuing cotemporaneously with the instant application; and is discussed in further detail in the material that is incorporated by reference from parent application Ser. No. 101,881 copending with the instant application.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor wherein the digital portion is constructed wholly of integrated circuit components.

A general purpose data processor is provided which is fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this data processing system.

The data processor 112 is organized to process 8 bit words with most working and storage registers having a 16 bit capacity permitting the storage of two words. Serial transfer of data is used throughout the data processor 112 to minimize the control logic required.

In a simplified block diagram, the data processor 112 is shown in FIG. 1B as control logic 102 interconnecting registers, timers and communication channels.

The basic timing operations of the data processor 112 are performed by a word timer 104 and a bit timer 106. The synchronization of the data processor 112 is provided by an 8 MHz clock signal which is included as part of the control logic 102. A synchronizing clock signal is an asymmetric square wave, the positive portion of which is designated $P_3$ and the negative portion of which is designated $\overline{P}_3$. An asymmetrical character of the clock signal permits a longer clock period without sacrifice of processing speed. The word timer 104 is a three-bit counter with associated decode logic. It counts from 0 to 7 as the data processor cycles through the micro-operations during the performance of an instruction with each micro-operation being performed in a different word time. The associated decode logic provides eight output lines, each being true during one of the eight different counting states of the word timer 104. These output signals are used by the control logic 102 for sequencing the data processor through the micro-operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro-operation or word time.

An accumulator (A-Register) 108 is the basic arithmetic register and is used as the repository of the results of arithmetic and logical operations. It is also the source and destination of the Input/Output (I/O) parameters. The A-Register is a 16 bit serial-in, serial-out shift register. Associated with the A-Register 108 is a serial full adder which is included within the control logic 102.

A scratch pad memory (SPM) 170 provides storage for intermediate computational results, return addresses, indexes and other pertinent information. The SPM 170 provides rapid internal storage without the need for transferring data to the main memory. It is a group of 32 16 bit serial in, serial out registers which are divided into two pages with 16 registers on each page. Paging is accomplished by toggling a flip-flop which automatically selects page 0 when the power is turned on.

A memory address register (M-Register) 172 holds the 12 bit address of an eight-bit byte to be accessed from the program memory. The M-Register 172 is a 12-bit shift register having the capacity to address up to 4,096 different memory locations. It has a serial input and both serial and parallel outputs. Associated with the M-Register 172 but represented as being within the control logic 102 is a serial full adder which increments the M-Register to access sequential instructions or, as applicable, the next two bytes of in-line instructions. The M-Register is incremented by two for a TX instruction when the condition for that transfer is not met, resulting in a skip of two bytes. The M-Register is incremented by three for a Skip-On-Discrete (SD) instruction. The M-Register is exchanged with the $SPM_2$ register for transfer type instructions and exchanged with a data address register (D-Register) 174 to access operands from the main memory. The M-Register is also exchanged with the $SPM_2$ register at the start of an ST instruction which causes the contents of the A-Register to be stored in main memory.

The data address register (D-Register) 174 is a 12 bit shift register that usually contains an operand address and is used to select: (a) SPM register, (b) I/O channel, and (c) number of shifts; depending upon the type of instruction being executed. The D-Register has a serial input and serial output, with the eight least significant bits ($D_0$–$D_7$) having parallel outputs in addition.

A C-Register 176 is composed of six flip-flops which store the six most significant bits of an eight-bit instruction byte obtained from program memory. The flip-flops $C_3$, $C_2$, $C_1$, $C_0$, $K_{11}$, and $K_{10}$ store the instruction bits designated $I_7$, $I_6$, $I_5$, $I_4$ $I_3$ and $I_2$, respectively as received from the main memory output lines (I). These instruction bits are stored by the C-Register during the execution of an instruction to control the sequence of micro-operations executed during the performance of the instruction.

An element designated K-Register 178 is a group of miscellaneous flip-flops for various operations. The $K_0$, $K_1$, and $K_2$ flip-flops are used primarily to control sequencing through the micro-operations. A $K_1$ flip-flop is also used to store the sign of the operand in the A-Register and the sign of a decremented number during a TX instruction. A $K_2$ flip-flop is also used to extend the A-Register during a shift left operation where the $K_2$ Register acts as the $A_{-1}$ stage of the A-Register. $K_3$, $K_4$, and $K_5$ flip-flops may be grouped together and designated a KA-Register and may be used to store the address of the index. The KA-Register is also used as an extension of the A-Register during a shift left operation with $K_3$ as an $A_{-2}$ stage, $K_4$ as an $A_{-3}$ stage, and $K_5$ as an $A_{-4}$ stage of the A-Register. A $K_7$ flip-flop is used as a carry flip-flop in conjunction with the A-Register full adder. It is also used in a transfer of the D-Register contents to the M-Register as a shift left operation to multiply the D-Register word address to the level of the M-Register byte address. A $K_8$ flip-flop is used as a carry flip-flop in conjunction with the M-Register full adder. As previously described, the $K_{10}$ and $K_{11}$ flip-flops form the two least significant bits of the C-Register.

An element designated L-Register 180 is a group of miscellaneous flip-flops for performing control operations. The most significant is the $L_1$ flip-flop which controls turn-on and turn-off of the data processor.

Input/Output (I/O) channels 182 connect the A-Register with the various entities and extremities. The I/O channels are arranged in pairs so that as the output from the least significant bit ($A_0Q$) of the A-Register shifts information to an output channel a corresponding input channel may simultaneously shift information into the A-Register through the input to the most significant bit ($A_{15}D$).

A data path 184 provides two-way communication between the data processor and the main memory. This path carries the main memory address stored in the M-Register and transfers operands to or from the main memory data register (I).

The program instructions for the numerical control system 110 are encoded as 8-bit bytes, each byte being stored in a different program memory location of the main memory. Instructions may have multiple bytes, but most have a length of only 1-byte. Each instruction contains an operation code in the most significant portion and, when required, an operand address in the least significant portion, Indexing is achieved with an index functional modifier byte preceding the instruction byte containing an operand address is to be indexed. Operands can be located in any of the SPM Registers, the constant memory part of the main memory or in two bytes following an instruction (in line) in main memory.

A brief description of data processor interface instructions will now be presented to exemplify data processor operation. A detailed description of the data processor instruction repetoire is provided in the co-pending application Ser. No. 101,881.

The Input/Output (EX) instruction is a one-byte indexable instruction, wherein the four most significant bits identify the operation code and the four least significant bits identify an I/O channel address. When an EX-instruction is executed, the contents of the A-Register is output to the addressed channel defined by the operand address portion of the instructions and the contents of the addressed channel are simultaneously loaded into the A-Register. A shift enable signal FAB is output to gate 16 clock pulses to the selected channel. The FAB micro-operation occurs in word time 1 for an Input/Output instruction and has a duration of 16-bit times. The contents of the A-Register 108 are shifted to a selected output channel while the contents of a selected selected input channel are simultaneously shifted into the A-Register.

The data processor 112 can generate discrete outputs (DO) with a Discrete Output instruction under program control. The DO assignments are:

DO-0: Spare.
DO-1: Provide clock pulses to ASR-33 (teletypewriter).
DO-2: Provides a clock to set the power turn-on interrupt, $L_1$. A DO-2 instruction (1100–0010) will be contained in program memory location $40_{16}$ to reset $L_1$ during power turn-on.
DO-3: Iteration timer reset
DO-4: Trigger to $I_2$ latch, the discrete input 4(DI-4) input. The $I_2$ flip-flop is automatically zero set during the power on sequence.
DO-5: Trigger to $I_3$ latch, the discrete input-5(DI-5) input. The $I_3$ flip-flop is automatically zero set during the power turn-on sequence.

DO-6: Trigger to $I_4$ latch, the discrete input-6 (DI-6) input. The $I_4$ flip-flop is automatically zero set during the power turn-on sequence.
DO-7: Intensity control
DO-8: Toggles the $I_1$ flip-flop causing scratch pad memory paging.
DO-9: Main memory paging.
DO-10: Not implemented.
DO-11: Servo set.

The Discrete Output (DC) instruction is a one-byte indexably instruction, wherein the three most significant bits define the operation code and the five least significant bits define an output channel address. An FAH discrete output signal, an inverted 3 microsecond pulse, is generated on the addressed output channel.

The data processor 112 can operate on a discrete input (DI) with a Skip-On-Discrete instruction under program control. The discrete inputs are various low frequency digital signals. The purpose of the discrete inputs is to define a status or condition. The DI assignments are:

DI-0: Not implemented.
DI-1: Skip unconditional.
DI-2: Skip on ASR-33 (teletypewriter).
DI-3: Skip on the sign of (A).
DI-4: Skip on $I_2Q$ latch (DO-4 trigger).
DI-5: Skip on $I_3Q$ latch (DO-5 trigger).
DI-6: skip on $I_4Q$ latch (DO-6 trigger).
DI-7: Skip on logical overflow in A-Register
DI-8: Used for troubleshooting.
DI-9: Skip on arithmetic carry from A-Register.
DI-10: Skip on positive.
DI-11: Skip on servo ready.

The Skip-On-Discrete (SK) instruction is a one-byte indexable instruction, wherein the three most significant bits identify the operation code and the five least significant bits identify a discrete input channel address. If a discrete exists on the addressed channel, three bytes (usually a transfer instruction) are skipped and the next instruction is obtained from the fourth byte following the Skip-On-Discrete instruction. If a discrete does not exist on the addressed channel, the next instruction (usually a three-byte transfer instruction) is obtained from the three bytes immediately following the Skip-On-Discrete instruction. The FAG micro-operation occurs in word time 1 for the Skip-On-Discrete instruction and has a duration of 12 bit times. If the selected discrete is true, the M-Register 172 is clocked and incremented by three. If the selected discrete is false, the M-Register 172 is not clocked and is therefore not incremented.

Operator Panel

An operator panel in accordance with the present invention provides bidirectional communication between an operator and a data processing system via intermediary binary digital words. The interactive control system may be an elemental extremity of the data processing system, providing unprocessed rudimentary data for a data processor and receiving preprocessed data for control of display illumination from the data processor. This elemental control system is dependent on data processor coaction for performance of the task of interactive communication with an operator. The data processor 112 operates under the control of a selected stored program to interpret input words, produce an appropriate system response, and provide output words having an appropriate format.

An elemental panel 114 for use in systems of the type disclosed herein are processor dependent structures having means for receiving panel elements, having circuit conductors for coupling elements, and having electronic means in the conductive paths for signal processing. By this arrangement, uncommitted elements can be added or changed and the significance of given panel positions can be determined at processor option under program control without being previously committed through wired operations. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is them sampled and interpreted by the data processor.

A display panel 118 is composed of both lamp displays and numeric displays. Each lamp display driver may be connected to operate in response to a different bit of a lamp display register. In one embodiment, when a register bit stores a binary "1" or is "set", the lamp display element is lighted. The data processor provides an output word to the lamp display register comprising packed discrete lamp control bits, wherein each bit controls a corresponding lamp which is lighted in response to the storage of a "1" or extinguished in response to a "0" bit.

The numeric display elements may be segmented tubes, Nixie tubes, or other devices for displaying a selected character. A single numeric character display register may be used to control all of the numeric displays. Output words may be transferred to the numeric display register at a rapid periodic rate for refreshing the display. One portion of these words contains a tube (element) select code identifying a particular element of a plurality of elements and a second part of the word contains a segment select code identifying the segments to be illuminated for a character to be displayed on the selected element. Decoding logic, element select drivers, and character drivers are responsive to signals from the numeric display register to excite the selected segment drivers of the selected numeric display tube to be activated to display the output character. Each numeric display element is selected in turn, sequentially, to display a related character. In order to refresh the numeric display at a flicker-free rate which, in one embodiment, may be thirty times per second; the data processor operating under program control outputs a sequence of display words to be stored in the numeric display register at a cyclic rate of thirty times the number of numeric word displays desired each second. In an embodiment having eight numeric display elements and refreshed at a thirty displays per second rate, the data processor word output rate would be 240 times per second. This output rate may consume only a small part of the operating time of a modern high speed data processor.

Figure 5A:
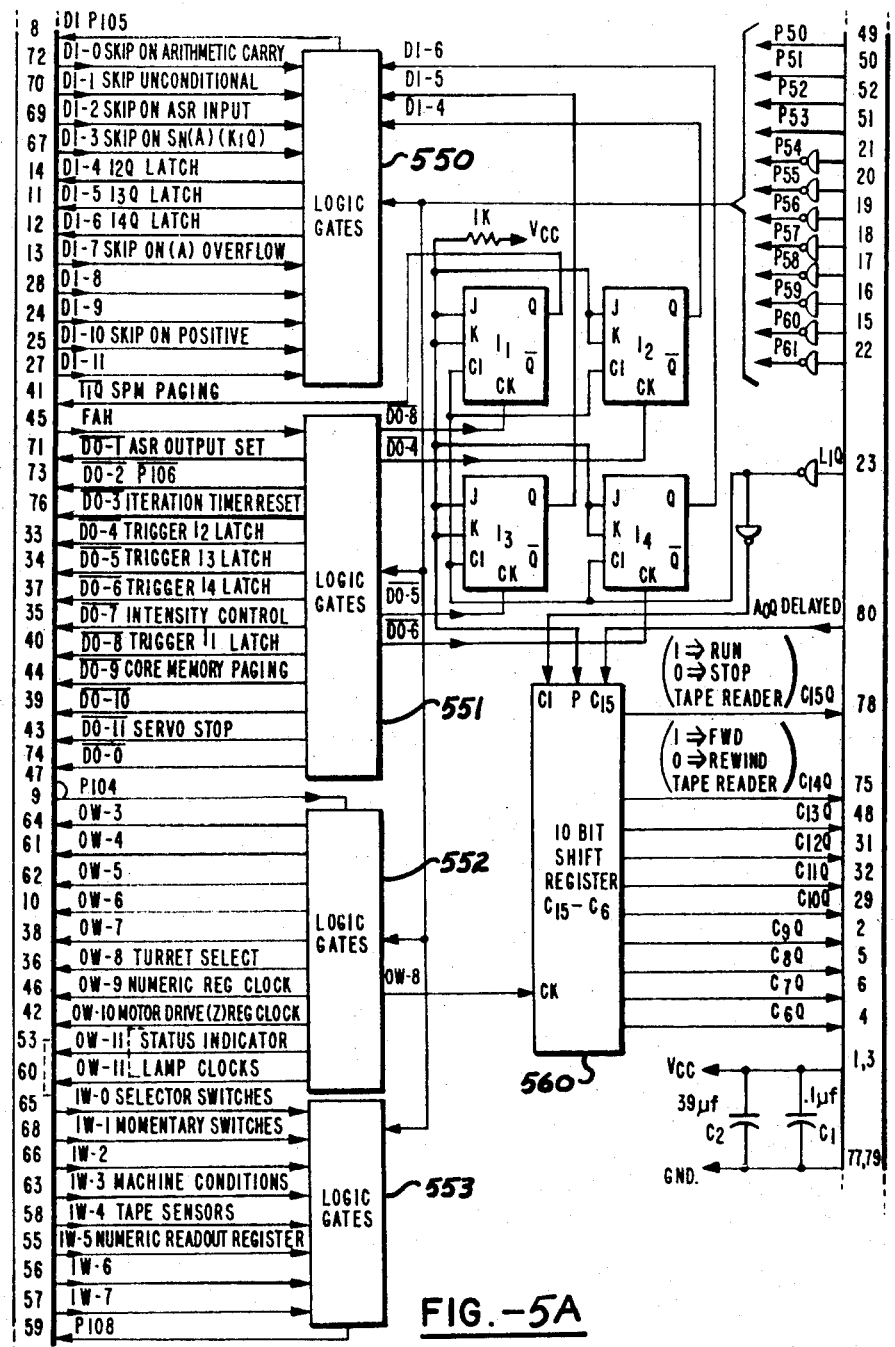
FIG. 5 is a schematic and block diagram representation of the system IFA comprising FIG. 5A showing IFA-1 logic, FIGS. 5B and 5C showing IFA-2 logic, and FIG. 5D showing the form in which FIGS. 5B and 5C connect together.
Figure 6:
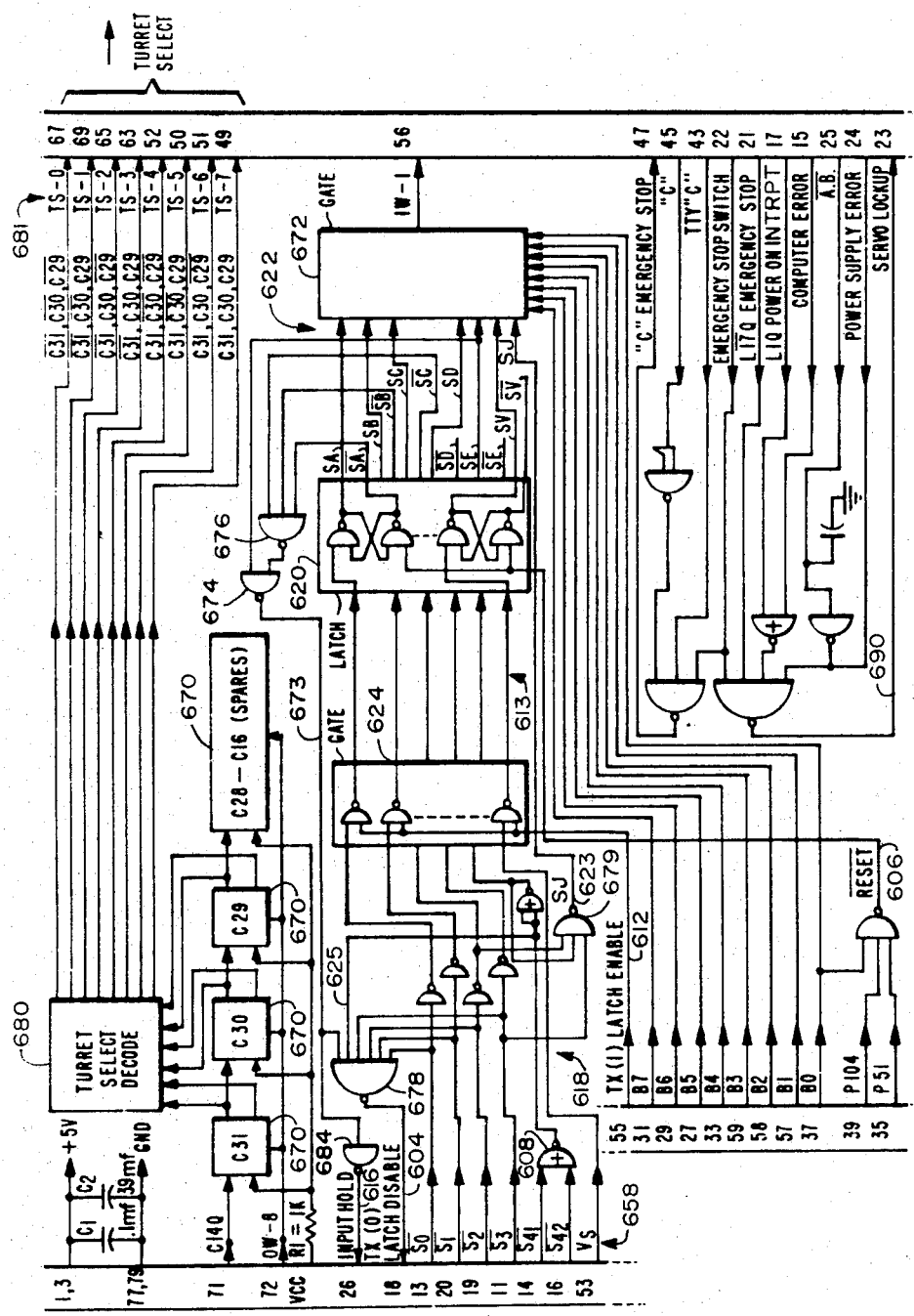
FIG. 6 is a schematic and block diagram representation of IFA-3 logic.

The lamp display register and the numeric character display register may each be well known registers, but in a preferred embodiment are registers such as the C-Register 560 and the C-Register extension 670 shown in FIGS. 5A and 6, respectively.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting spare switches and spare displays and by changing associated captions or legends which identify panel elements to an operator in the interactive control system. Corresponding changes in data processor responses are accomplished by making appropriate changes in the stored program.

This invention provides an interactive control system establishing bidirectional communication between an operator and a data processing system. Control and data information passing between an operator and the system passes through an electronic data processor via the medium of intermediary binary digital words.

Figure 7A:
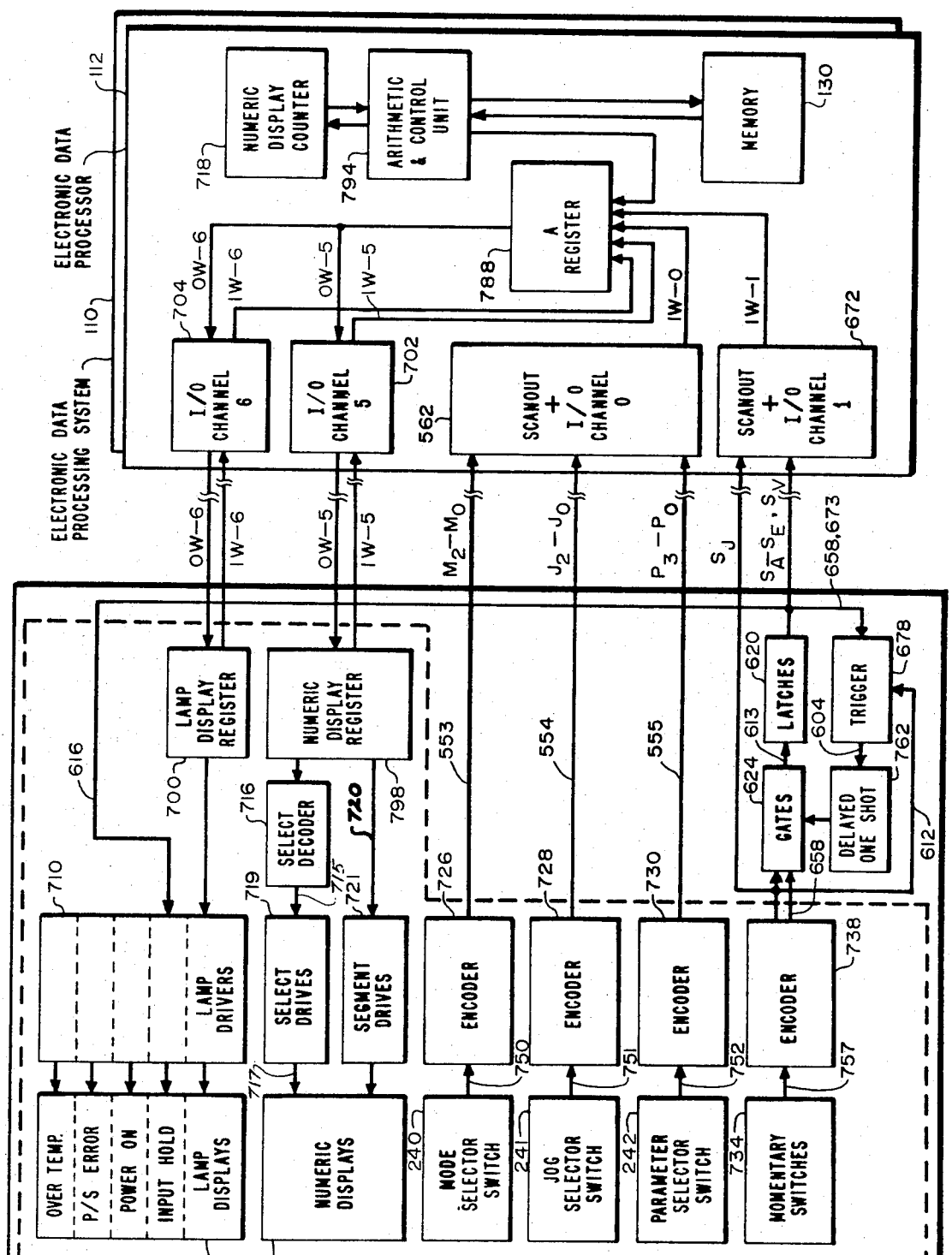
FIG. 7 is a schematic and block diagram representation of the operator panel comprising FIG. 7A showing logic for communication between the data processor and the operator panel and FIG. 7B showing logic for a numeric display.

As shown in FIGS. 1A and 7A, an electronic data processing system 110 includes an electronic data processor 112 and an interactive control system 117. In general, the electronic data processing system may be any such system but the full advantages of this invention are best realized when used in conjunction with a system which has been committed or dedicated to a specific task or family of tasks such as numerical control, payroll, accounting, or inventory control. It will be assumed herein, however, that the electronic data processing system 110 is committed to the task of numerical control of a machine.

The interactive control system 780 includes an operator panel assembly 117 mounting various panel devices and may include devices such as gates 624, one shot 762, trigger logic 678, and latches 620 which are physically located on available space of a printed circuit board within the electronic data processor 112 but which may operate as part of the interactive control system 117.

Figure 2B:
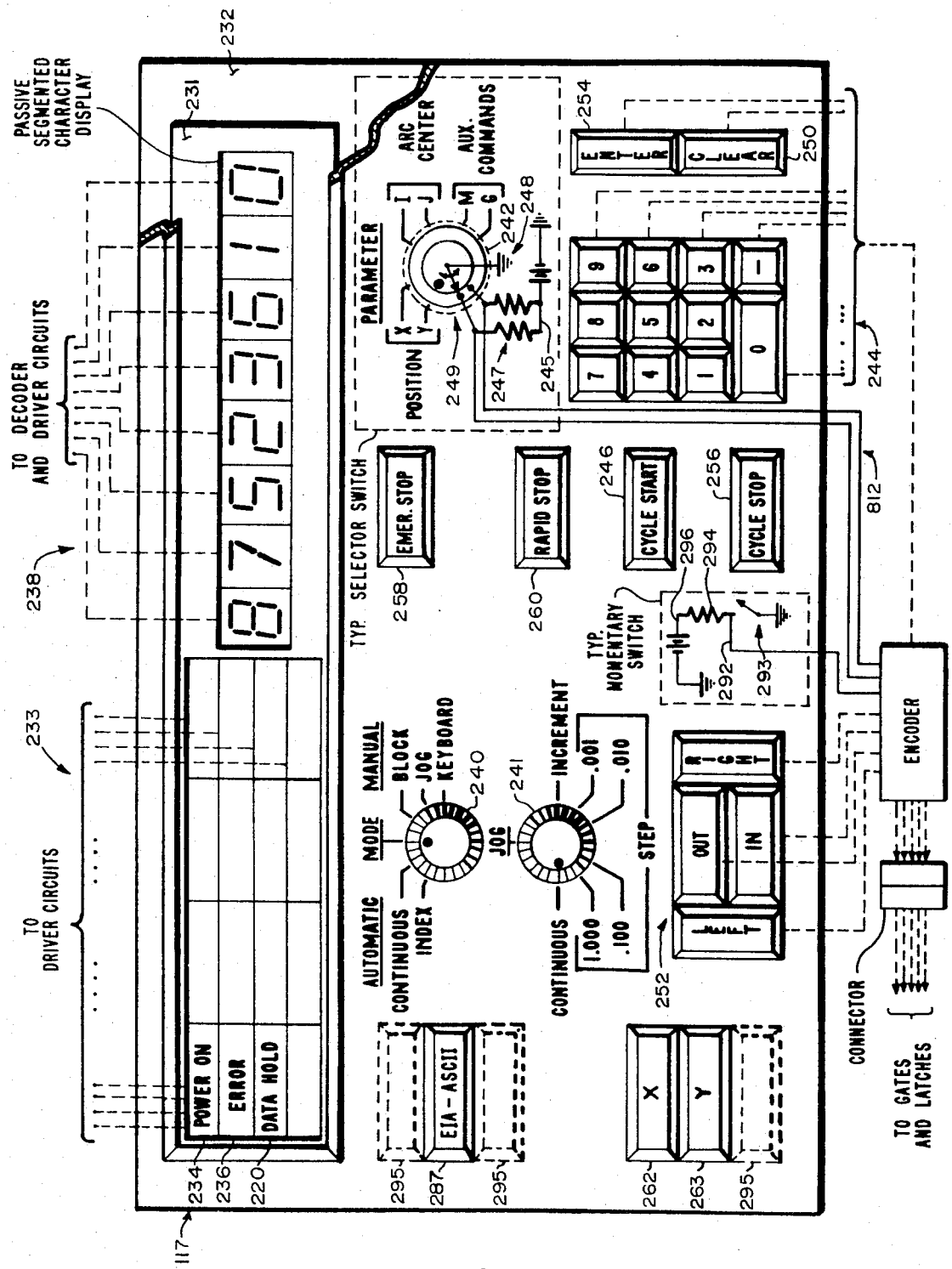

As shown in FIG. 2B a master panel board 232 provides physical support and interconnection for components and circuits including a display portion 118 and a control portion 114 of the operator panel 117. The panel board 232 may be a printed circuit board having conventional spaced apart apertures or recepticles such as at switch locations 240 and 241 into which selector switches may be inserted and 246 and 260 into which momentary switches may be inserted. Printed circuit wiring to each of the element positions and some electronic circuitry may be mounted on the back of the panel board 232 to facilitate error free communication with the data processor 112. By placing this circuitry in close proximity to the switches and displays, signal lines are reduced in length and quantity and wire bundles are reduced or eliminated.

As illustrated in FIG. 2A, the Interactive Control System 117 comprises a control panel 114 and a display panel 118 mounted in a single rectangular plane with the display panel 118 occupying the upper portion of the plane and the control panel 114 occupying the lower portion of the plane. The lefthand portion of the display panel 118 is occupied by status indicator lamp displays 233 such as the Power On indicator lamp 234 and an error indicator lamp 236. These lamp displays provide feedback to the operator by indicating system modes and conditions. All status indicator lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 233 are a bank of troubleshooting lamps such as an error indication lamp 236, which are normally obscured behind the filter, but become flashing displays if a malfunction or error should occur. The righthand portion of the display panel 118 is composed of eight numeric displays 238 which may be used to identify the magnitude of system parameters.

Each lamp display 233 is driven by a well known lamp driver circuit which is controlled by one bit in a lamp display register 700. The lamp display register 700 stores an intermediary output word output from the data processor 112, which defines the status of the lamp displays 233. In contrast, the numeric displays 238 are driven sequentially in accordance with an intermediary output word stored in a numeric display register 798.

Each numeric display lamp 238 is excited at a 30 cycle per second flicker free rate under program control in accordance with information contained within a numeric display register 798. Since the numeric display register 798 controls the excitation of all eight numeric display tubes 238, its content may change at a cyclic rate of $8 \times 30 = 240$ times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The control panel has three selector switches and a plurality of momentary switches as shown in FIGS. 2A and 2B. The three selector switches; a Mode switch 240, a Jog switch 241, and a Parameter switch 242; are multiple position rotary switches. The Mode selector switch 240 defines one of the six operating modes of the system, the Jog selector switch 241 defines the machine displacement for each jog command executed when in the jog mode, and the Parameter selector switch 242 defines the parameter to be displayed on the numeric displays 238 and, when in the keyboard mode, defines the address of the parameter to be entered through the keyboard 244. The remaining switches are momentary switches which maintain contact only so long as they are held down.

The Mode selector switch 240 defines the major operating conditions of the system which are: (1) Search, (2) Index, (3) Continuous, (4) Block, (5) Jog, and (6) Keyboard. The Search position 290 of the Mode selector switch 240 permits an operator to identify a desired part program block of commands from a punched tape or from a self-contained parts program memory such as the main memory 130 in systems where this capability is provided, and then initiate an automatic search for that block of commands. A sequence number, which is used to identify the selected block of commands, is entered by an operator through a keyboard 244. The number which is entered through the keyboard 244 is processed by the data processor under program control and displayed on the numeric displays 238 to permit the operator to verify the number which has been entered.

The numerical control system 110 uses a machine index point as a reference for machine positions. The Index position of the Mode selector switch 240 causes the data processor 112 to command the machine axes to return to the previously defined index point. When in the index mode, depression of the Cycle Start switch 246 will command the data processor 112 to generate commands 123 to the servos 120–122 to drive the machine to the index position.

The Continuous position of the Mode selector switch 240 is used after system initialization and initial work piece setup. Depression of the Cycle Start switch 246 by an operator while in the Continuous mode 288 commands the data processor 112 to initiate automatic operation in response to the parts program commands from the tape reader 116 or other source of parts programs.

The Block position 286 of the Mode selector switch 240 permits an operator to control the numerical control system 110 in a semi-automatic mode for operations such as parts program checkout. In this mode, the data processor 112 accesses a single block of commands from a parts program, executes the accessed commands, then enters the Cycle Stop condition. When in the block mode, a parts program can be executed one block at a time by having an operator depress the Cycle Start switch 246 for each block executed.

The Keyboard position 284 of the Mode selector switch 240 permits an operator to control the system in a semi-automatic mode. A block of parts program commands can be entered by the operator through the keyboard 244 and then executed by the data processor when the Cycle Start switch 246 is depressed by the operator. When commands are loaded through the keyboard 244, the data processor 112 will process these commands and display the loaded commands on the numeric display 238. Data input errors can be easily corrected by the operator depressing Clear switch 250, causing the data processor 112 to blank the numeric display 238, and by the operator reentering the parameter through the Keyboard 244, causing the data processor 112 to display the new commands entered by the operator.

The Jog position of the Mode selector switch 240 permits an operator to command the data processor to reposition the machine in a semi-automatic manner for operations such as initial workpiece setup or index position definition. The Jog selector switch 241 and the Jog Direction switches 252 may be used by the operator to command the data processor 112 to reposition the machine. In this manner, the data processor can be commanded by an operator to control the machine through the servos so that the machine may be positioned with a minimum of effort, fixtures, readouts, and optics within the resolution of a system (0.0005 inch). The data processor 112 in the numerical control system 110 generates position commands under program control in accordance with the distances and directions selected by the operator without burdening the operator with tedious measuring functions. In addition, the data processor 112 controls the numeric displays 238 to show the machine position, providing verification for an operator while in this mode.

The Jog selector switch 241 becomes operative when the Mode Selector switch 240 is in the Jog position and defines the magnitude of machine displacement for each jog command executed. The selectable positions are: (1) Continuous, (2) 1.0000 inch step, (3) 0.1000 inch step, (4) 0.0100 inch step, (5) 0.0010 inch step, and (6) Increment.

The Continuous position of the Jog Selector switch 241 commands the data processor in the system to control the servos to drive continuously in a direction wherein the direction is commanded by one of four Jog Direction switches 252. These direction switches 252 are interrogated by the data processor and command the data processor to control the servos to drive the machine left, right, in, or out depending upon which one of the four Jog Direction switches is depressed. While in the Continuous Jog position, the machine is driven continuously by the servos as commanded by the data processor in the commanded direction for the duration of time that a Jog Direction switch is maintained in a depressed state.

The four step positions of the Jog selector switch 240 cause the data processor to command the servos to drive the machine a selected step distance each time a Jog Direction switch is depressed.

The Increment position of the Jog selector switch 241 commands the data processor to control the servos to drive the machine a single least significant increment of distance each time a Jog Direction switch 252 is depressed, 0.0005 inch in this embodiment of the invention. When in the Step or Increment positions, regardless of whether a Jog Direction switch 252 is maintained in a depressed state for a short time or continuously, the data processor will command the machine to reposition by only the single commanded step and then to halt. Additional motion can be initiated by the operator by releasing and again depressing a Jog Direction switch 252. This data processor interlock eliminates the need for rapid operator response, since the precise step commanded will be executed independent of the duration of time that a Jog Direction switch 252 is depressed.

The position of the Parameter selector switch 242 defines for the data processor the parameter that the operator selects to be displayed on the numeric displays 238 and, when the Mode selector switch 240 is in the Keyboard position 284, defines for the data processor the block of commands being entered by the operator through the keyboard 244 for entering into the data processor and for display to the operator. Selectable parameters for display with one embodiment include: (1) Sequence No.-N 223, (2) Absolute Position-X 227, (3) Absolute Position-Y 226, (4) Arc Center-I 228, (5) Arc Center-J 229, (6) Auxiliary Command-M 231, and (7) Auxiliary Command-G 298.

The Sequence Number position commands the data processor to control the numeric displays 238 to show the address of a block of punched tape commands being read from the punched tape while the Mode selector switch is in the Continuous or Block positions and commands the data processor to control the numeric displays 238 to show the sequence number being entered by the operator through the keyboard 244 while the Mode selector switch is in the Keyboard position. This keyboard entry operation is performed prior to initiating a tape search in the Search mode.

The Absolute Position locations of the Parameter selector switch 242 commands the data processor to control the numeric display 238 to display the position of the machine relative to the floating zero or index point. When the Mode selector switch 240 is in the Keyboard location 284 and the Parameter selector switch 242 is in one of the Position locations, the data processor is commanded to enter the position commanded by the operator through the keyboard 244 and to display the entered position on the numeric display 238. For example, when the operator wishes to position to machine to an X coordinate of 05.6000, he positions the Mode selector switch 240 to the Keyboard position 284 and the Parameter selector switch 242 to the Absolute Position X position 227, then he enters the numbers 05.6000 with the keyboard 244. The data processor will enter and display this position number on the numeric display 238 and the data processor will command the servos to move the machine to this X position when the operator depresses the Cycle Start switch 246.

In similar manner the Arc Center and Auxiliary Command locations of the Parameter selector switch 242 are used in the Keyboard mode to enter the commands from the keyboard 244.

The momentary switches may be hermetically sealed reed relay switches. A latching interlock is provided to make the system insensitive to dynamic switch conditions such as switch bounce. In addition, operation is independent of the duration of time of switch depression where additional switch commands that may result in ambiguities are automatically locked-out as long as a previously depressed momentary switch remains depressed.

Momentary switches are grouped into functional arrays for operator convenience. For example, the keyboard switches 244 and the Jog Direction switches 252 are grouped into functional arrays.

The keyboard 244 is composed of ten numeric switches, defined as switches 0 through 9, and a negative sign switch. The 0 key can be used to command the data processor to load a plus sign when required. The numeric and sign keys of the keyboard 244 are used to command the data processor to enter data in the Keyboard mode and a Clear key 250, adjacent to the keyboard 244, is used to command the data processor to blank the numeric displays 238 prior to the operator entering data from the keyboard 244. An Enter key 254 causes a parameter to be accepted by the data processor after it has been entered through the keyboard 244 and verified by the operator's observation of the numeric display 238. In the Keyboard mode the various parameters can be entered or changed as required by an operator. Parameter verification is achieved by an operator positioning the Parameter selector switch 242 to the desired parameter position, which commands the data processor to display the selected parameter on the numeric display 238. Parameter modification is accomplished by the operator depressing the Clear key 250, commanding the data processor to blank the numeric display 238, followed by the operator sequentially depressing the sign and numeric switches of the keyboard 244. The data processor loads the parameter entered through the keyboard and provides a presentation of the entered parameter on the numeric display 238. The entered parameter may be automatically accepted by the computer for processing and for display under program control.

The Cycle Start switch 246 and the Cycle Stop switch 256 are used by the operator to command the data processor to initiate and to terminate automatic operation, respectively. When in the cycle off condition, as identified by the data processor illuminating the Cycle Off status indicator lamp 271, the operator can command the data processor to initiate automatic operation by depressing the Cycle Start switch 246. The data processor will automatically execute parts program commands until detecting a condition that commands a cycle stop condition. Such conditions are enabled by the Mode Selector switch and include:

(1) detecting the required tape location in the search mode, (2) completing repositioning of the machine to the floating zero point in the index mode, (3) completing execution of a block of tape commands in response to appropriate G or M commands contained therein or if the operator has depressed the Cycle Stop switch 256 in the continuous mode, (4) completing execution of a single block of tape commands in the block mode, (5) completing execution of the jog command in the jog mode, and (6) completing execution of a single block of keyboard commands in the keyboard mode.

When in the continuous mode with the cycle on condition activated as identified by the Cycle On status indicator lamp 213 illuminated, the operator can command the data processor to discontinue automatic operation by depressing the Cycle Stop switch 256. The data processor will complete the execution of the block of parts program commands in process and then enter the cycle off condition as identified by the Cycle Off lamp 271 being illuminated. When the data processor is operating in a mode other than the continuous mode with the cycle on condition displayed, it is not necessary for the operator to depress the Cycle Stop switch to discontinue automatic operation because, in all modes other than the continuous mode, the data processor executes a single set of commands and then automatically enters the cycle off condition.

An Emergency Stop switch 258 is used to discontinue automatic operation rapidly and to force the system into a reinitialization condition. After the Emergency Stop switch has been depressed, it is necessary for the operator to perform the system initialization sequence prior to operating the system. The system initialization sequence involves:

(1) positioning the Mode selector switch 240 to the Jog position, (2) jogging the machine tool to the index position, (3) positioning the Mode selector switch 240 to the Index location, (4) depressing the Cycle Start switch 246 to load the index position of the machine tool, and, (5) if required, loading the punched tape in the tape reader 116.

The Jog Direction switches 252 are used by the operator to define direction of motion and to command the data processor to initiate this motion, but only when the system is in the jog mode. In addition, the position of the Jog selector switch 241 defines for the data processor the type of motion, i.e. Continuous, Step, or Increment. The jog directions of (1) Right, (2) Left, (3) In, and (4) Out, may be defined by facing the machine from the control panel side. A Jog Direction switch is provided for each direction of each axis or two Jog Direction switches per axis. For simplicity, only four Jog Direction switches are shown to exemplify operation in two axis. Additional axis of control can be provided such as with additional pairs of Jog Direction switches.

The Rapid Stop switch 260 commands the data processor to control machine motion to stop immediately, but permits operation to be resumed by the data processor when the operator depresses the Cycle Start switch.

A pair of Mirror Image switches 262, 263 are used by the operator to command the data processor to selectively reverse the commanded directions of motion. Alternate depression of the X or Y Mirror Image switches 262, 263, respectively, will command the data processor to cause the Mirror Image status indicator lamps, contained in the bank of lamp displays 233, to change state from +X or +Y to −X or −Y and conversely. The operational condition presented by the data processor on the Mirror Image status indicator lamps 233 defines system conditions to the operator. Additional Mirror Image switches and lamps can be provided for additional axis of control.

The control switches of the control panel are not hardwired directly into the control panel lamps and other functions. Instead, the data processor periodically samples the status of the various switches under program control. The data processor then further acts under program control to operate the various entities of the system in accordance with the status of the control switches. Because the switches are sampled in this way as opposed to being hard wired, the basic numerical control system 110 can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the data processor 112. The encoded positions of the Mode selector switch 240, Jog selector switch 241, and Parameter selector switch are shown in Tables I, II, and III respectively.

TABLE I

| M2 | M1 | M0 | |
|---|---|---|---|
| 0 | 0 | 0 | Spare (Error) |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

TABLE II

| J2 | J1 | J0 | |
|---|---|---|---|
| 0 | 0 | 0 | Spare (Error) |
| 0 | 0 | 1 | Continuous |
| 0 | 1 | 0 | 1.000 inch |
| 0 | -1 | 1 | 0.100 |
| 1 | 0 | 0 | 0.010 inch |
| 1 | 0 | 1 | 0.001 inch |
| 1 | 1 | 0 | Increment |
| 1 | 1 | 1 | Spare |

TABLE III

| P3 | P2 | P1 | P0 | |
|---|---|---|---|---|
| 0 | 0 | 0 | 0 | Spare (Error) |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Arc Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3, S4, as shown in Table IV. These five bits can accommodate up to 31 momentary switches. In addition, a sixth bit, $V_s$ provides a verify function for the stop switches.

Figure 5B:
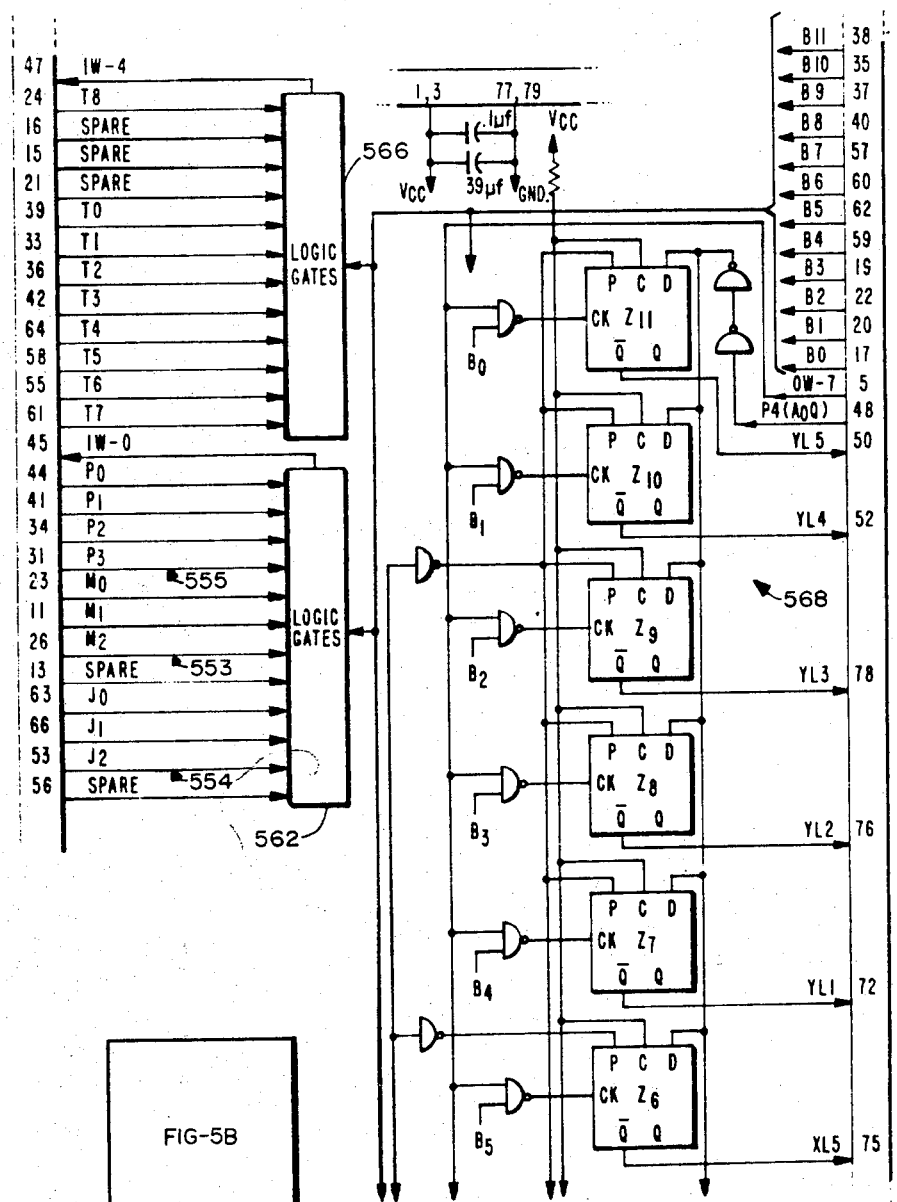
Figure 5D:
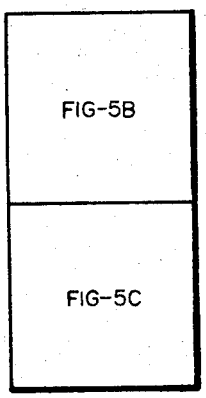

The encoded selector switch bits are combined into a single sixteen bit word having the format of P3, P2, P1, P0, Spare, J2, J1, J0, M2, M1, M0, Spare, and four zero states shown in FIG. 5B with logic gates 562. This word is serially scanned into the central data processor 112 with logic gates 526 (FIG. 5B) whenever the selector switches are to be sampled under program control. Similarly, the encoded outputs of the momentary switches make up a separate word which is periodically sampled under program control with logic gates 672 shown in FIG. 6.

Three multi-position selector switches, a Mode selector switch 240, a Jog selector switch 241 and a Parameter selector switch 242 provide primarily control type functions. Because hardwiring of switch controls is avoided by having intermediary output words communicated to and interpreted by the data processor 112, the number of selector switches as well as the number of contacts on each selector switch can be easily varied to meet the requirements of a specific application. The selector switches are implemented by grounding the wiper arm 249 and connecting each switch contact 248 to a positive voltage 245 through a resistor 247. This arrangement causes the signals 812 from the contact outputs to represent the inverse of the selector switch position, a condition particularly suitable to modern integrated circuit logic gates.

As shown in FIG. 7, the 7 signals 750 from the contacts of the Mode selector switch 240 and the 7 signals 751 from the contacts of the Jog selector switch 241 are each converted by encoders 726 and 728 respectively into 3-bit binary coded signals 553 and 554, respectively. Similarly, the 15 signals 752 from the contacts of the Parameter selector switch 242 are converted by an encoder 730 to 4-bit binary coded signals 555. These encoded signals are connected to Scanout and I/O Channel-0 562 which converts the parallel signals 553, 554, 555 to a serial intermediary binary digital word IW-0 as they are shifted into the A-Register 788 of the data processor 112 under control of an input instruction.

Although each of the encoders 726, 728 and 730 can accommodate one more input signal, the binary coded output represented by binary all zeros is not implemented to permit the data processor to detect a switching error. If a wiper arm of a selector switch 240, 241 or 242 is between contacts or fails to make proper contact with a contact, the associated encoder 726, 728, or 730 provides an all zero output. The data processor 112 interprets an all zero output as an error condition and, after a short delay to allow for normal switching time, commands an "error" display lamp 236 to be illuminated.

Referring now to FIG. 2B, 24 momentary switches 734 (FIG. 7A) typified by switches 262, 263 are mounted on the panel board 232. As described for the selector switches 240, 241, 242; the number of momentary switches 734 can be easily varied to meet the requirements of a specific application. The circuitry of the present embodiment can accommodate up to 31 momentary switches with locations for possible additional switches represented by dotted outlines 295.

In a preferred embodiment, reed switches are mounted in apertures in the panel board 232. Other well known switches may also be used. As described for the selector switches, the momentary switches 734 are implemented by grounding the wiper contacts 293 and connecting the stationary contacts 292 through a pull-down resistor 294 to a positive voltage 296.

As shown in FIGS. 6 and 7A, the 31 switch outputs 757 are converted to a 5-bit binary coded signal 658 by encoder 738, thereby reducing the number of transfer lines to minimize interconnections and circuitry. The five binary signals are $\overline{S_0}$ through $\overline{S_4}$ with two partial signals $S_4^1$ and $S_4^2$ being NORed together with gate 608 to form the $\overline{S_4}$ signal. In addition a redundant sixth signal VS performs a verify function by indicating depression of either a Rapid Stop switch 260 or an Emergency Stop switch 258. The signals $\overline{S_0}$ through $\overline{S_4}$ 658 are connected through inverting logic gates 618 to logic gates 624. The signal VS is connected directly to logic gates 624. The logic gates 624 connect gated signals $S_0$–$S_4$ and Vs to latches 620, but only when an enable signal 612 is received from a delayed one shot 762.

The latches 620 permit the data processor 112 to sample the intermediary binary digital output word represented by the latch outputs (SA, SB, SC, SD, SE, SV) 622 at a programmed rate which may be 10-times each second. This rate is sufficiently high to avoid inconvenience to an operator who should not depress a subsequent momentary switch until the output from a previously depressed momentary switch has been sampled by the data processor 112; where sampling by the data processor resets latches 620 with reset signal 606 upon completion of the sampling operation.

A system of lockouts and lockout overrides is used to minimize errors while still permitting the interactive control system 780 to accomplish all necessary operations. An Inhibit signal 673 is produced by logic gates 674 and 676 whenever any of the latches 620 are set which by logically ORing the the output signals SA–SE of latches 620. One of the latches 620 is set by the VS verify signal, but does not contribute to the Inhibit signal 673. The Inhibit signal 673 is connected to a NAND gate 678 which provides a trigger signal 604 to the delayed one-shot 762 as an output. The gate 678 is also connected to binary signals $\overline{S_0}$–$\overline{S_4}$ and produces a trigger signal 604 only when a signal is produced on at least one of the binary outputs $\overline{S_0}$–$\overline{S_4}$ subsequent to a condition in which there is no Inhibit signal and no signal on any of the binary outputs $\overline{S_0}$–$\overline{S_4}$. In other words, the output of a subsequent momentary switch cannot be gated by signal 612 and latched until the latches 620 have been reset with reset signal 606 and all previously depressed momentary switches have been released.

The delayed one shot 762 produces a 3 $\mu$S pulse following a 10 ms delay. The 10 ms delay permits transient switching conditions such as switch bounce, inherent in all momentary switches, to subside before the binary outputs $S_0$–$S_4$ and VS are gated to the latches 620. Thus, the lockout arrangement not only prevents errors created by the depression of more than one momentary switch but also prevents errors due to transient switching conditions.

A special signal is provided by NAND gate 679 which produces a signal on output $\overline{S_J}$ 623 whenever the condition $S_4 \cdot S_3 \cdot \overline{S_2}$ exists. This $\overline{S_J}$ signal is related to the jog direction switches 252 as will be obvious from the codes shown in Table IV. The signal $\overline{S_J}$ indicated depression of one of the Jog Direction switches 252, Left, Right, In or Out. This permits the data processor to identify if a jog direction switch is maintained in the depressed state for the jog continuous condition.

The inhibit signal 673 is inverted by a NAND gate 684 to provide a data hold signal 616. This data hold signal controls a Data Hold lamp display 220 which becomes illuminated to indicate a set condition of at least one of the latches 620. As long as the Data Hold lamp display is illuminated, the operator knows he should not depress another momentary switch.

The binary codes for the momentary switches are presented in Table IV.

TABLE IV

| Vs | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Referring now to FIG. 7A, the binary coded outputs 553–555 from the three selector switches 240, 241, 242 are combined to form a single intermediary binary digital input word IW-0 (FIG. 5B) which is shifted into the A-Register 788 of the data processor 112 through Scanout and I/O Channel-0 562 under control of an input instruction. Similarly, the outputs from the momentary switches 734 are used to form an intermediary binary digital output word IW-1 (FIG. 6) which is shifted into the A-Register 788 through Scanout and I/O Channel-1 672 under control of an input instruction. Computer instructions are described in detail in the parent applications.

Once an intermediary input word is within the A-Register 788, it is manipulated and interpreted by an arithmetic and control unit 794 operating under control of program instructions stored in a memory 130. After an input word has been interpreted, the data processor 112 generates appropriate system responses.

The data processor 112 also generates preprocessed intermediary output words having selected formats and transfers them from the A-Register 788 to a numeric display register 798 and a lamp display register 700 through I/O Channel-5 702 and I/O Channel-6 704, respectively. These channels provide bidirectional communication of intermediary output words with the A-Register, permitting previously output words to be returned to the A-Register 788 to check for errors occurring during transmission. The interpretation and processing of intermediary words takes place within the data processor 112.

The displays include both lamp displays 233 and numeric displays 238. As shown in FIGS. 2A and 2B, both the lamp displays 233 and the numeric displays 238 are mounted on the display subpanel board 231 which is in turn mounted on the panel mother board 232. The lamp displays 233 may be conventional bayonet type lamps and the display subpanel board 118 contains a batch fabricated block of lamp sockets which receive the lamps. These lamp sockets provide the multiple functions of mounting, electrical connection and heat sink. Each lamp may be selectively connected to ground either directly or through a flasher bus. The lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements 238 are conventional 9 segment displays capable of displaying all numerical characters and some alphabetic characters. The eight numeric display elements 238 of this embodiment are mounted horizontally on the display subpanel board 231.

Coupled to the lamp displays 233 are lamp drivers 710 which are coupled to the lamp display register 700. With the exception of a few lamp drivers 710 which are hardwired to respond to special functions such as Over Temperature, P/S Error, Power On and Data Hold; each lamp driver 710 responds to a selected bit of an intermediary binary digital output word stored in the lamp display register 700.

Figure 7B:
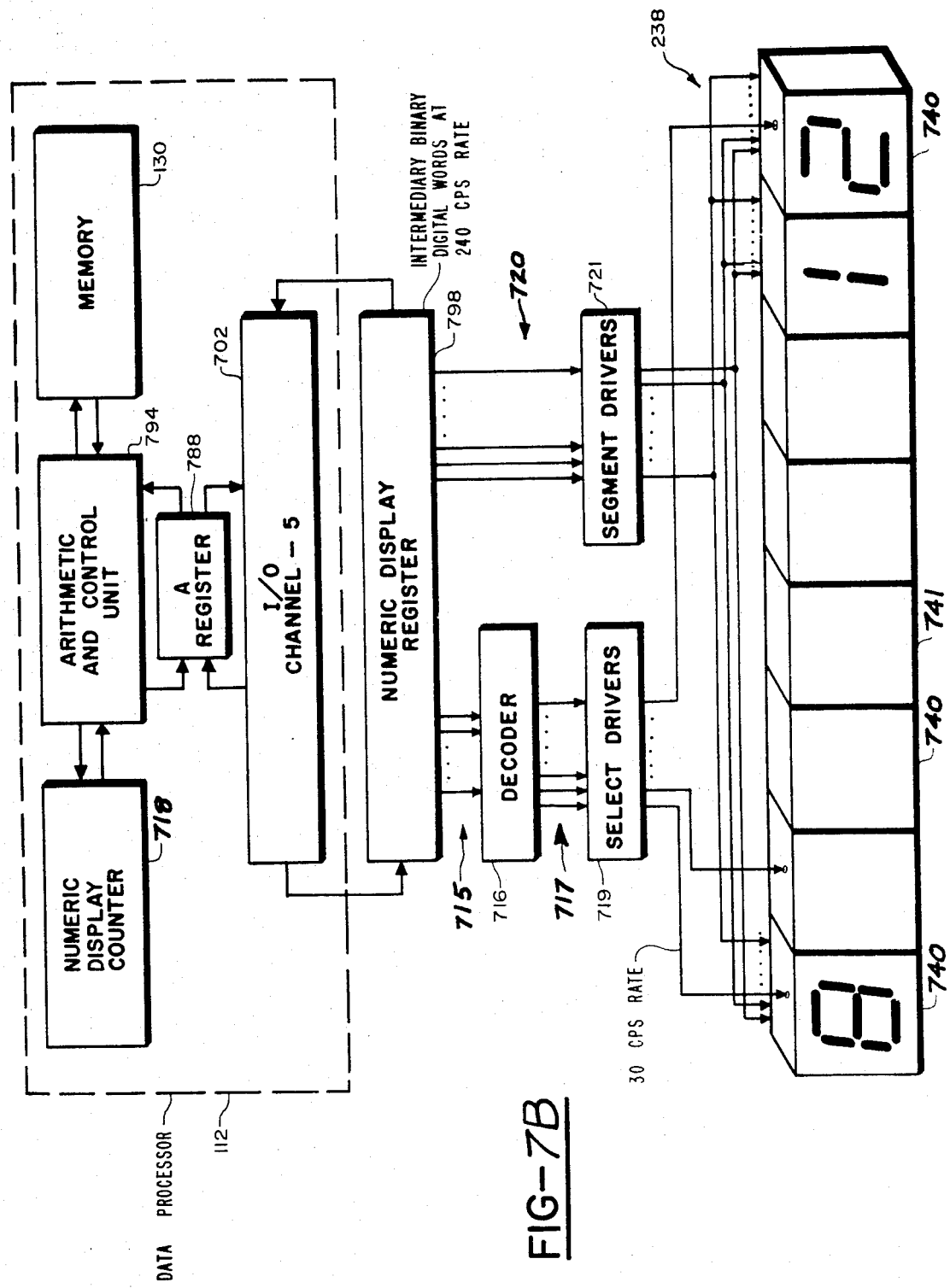

As shown in greater detail in FIG. 7B, the implementation of the 8 numeric display elements 238 is considerably more complex than that used for the lamp displays 233. Because each numeric display element 740 requires multi-bit control signals, a cyclic technique is used to drive all eight numeric display elements from a single numeric display register 798, thereby greatly reducing the amount of circuitry required. To accomplish this, the eight numeric display elements are sequentially excited at a flicker-free 30 cps rate. In order to excite each numeric display element 740 at a rate of 30 cps the contents of the numeric display register must change at a cyclic rate of 240 cps.

The numeric display operations are performed in the data processor 112 under program control and may utilize the numeric display counter 718, the update control, the refresh control, and the data registers. These operations need not be physically identifiable, but may be implemented under program control of the data processor. The display parameter is converted from a binary to a BCD code, then modified for the special segment code requirements of the numeric display tube. The tube identification code is packed or assembled into the word, which is output to the numeric display register 798 in the interactive control system 780.

In order to excite one of the numeric display elements 740 the data processor 112 utilizes the count of the numeric display counter 718 implemented under program control. For example, a binary count of three would indicate that the fourth numeric display element 741 is to be excited. The data processor accesses a location in the memory 13 storing display information to excite the fourth numeric display with the proper character. It should be noted that the binary numbers of 0 through 7 represent the first through the eighth numeric display elements, with binary number three representing the fourth numeric display element. This information is transferred from the memory 130 to at least significant portion of the A-Register 788 where it is joined by the binary count (three) from the numeric display counter parameter which is packed in the most significant portion of the word to form a packed intermediaty digital output word. This output word is transferred from the A-Register 788 through I/O Channel-5 702 to the numeric display register 798 with a data processor output instruction. After the word is output, the numeric display counter is incremented by the data processor under program control so that the fifth numeric display element will be excited next. In addition to providing intermediary output words to the numeric display register at a rate of 240 cps, the data processor also updates the locations in the memory 130 which store the information determining the numeric character to be displayed. This updating may occur at a cyclic rate of 16 cps. This is about as fast as the operator can follow changes in the characters displayed by the numeric display elements 740.

The contents of the three numeric display select bits in the most significant portion of the numeric display register 798 are communicated by three pairs of lines 715, each pair of lines representing the Q and $\overline{Q}$ outputs from a register flip-flop to decoder 716. Decoder 716 activates one of eight select drivers 719, the fourth select driver being activated in this example. Simultaneously, nine segment drivers 721 are selectively excited with signals 720 according to the numeric display character information stored in the least significant portion of the word in the numeric display register 798, each driver being responsive to a different register bit signal.

The segment drivers 721 present drive signals forming the stored character to the appropriate segments of all eight numeric display elements 740. However, only the fourth numeric display element 741, which receives a select signal from the select drivers 719, displays the selected character in response to the select signal.

The elemental nature of system subsystems and the related data processor coaction under program control may be utilized to simplify system setup procedures, thereby minimizing setup time as well as errors. For this purpose, an operator's manual may be used in conjunction with the numeric displays 238 on the control panel and a special program in the data processor 112. The operator's manual is divided into several sections, each pertaining to a particular mode of machine operation. The Parameter switch 242 would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears showing whether the last step was properly performed until the system can be started. This permits a totally inexperienced operator to sequentially perform the entire system set up or initialization.

The operator panel is further discussed in detail in the material that is herein incorporated by reference from U.S. Pat. No. 4,121,284 and U.S. Pat. No. 4,038,640.

Numerical Control Operations

Various machine control capabilities including operator panel; tape control, feedrate control; motion resolution, conversion and scaling; dimensioning; tool offsets; tabular memory control; acceleration and deceleration control; and rotary axis control capabilities are disclosed in related application Ser. No. 752,751 at page 108 line 2 to page 143 line 6 (now U.S. Pat. No. 4,120,583 at column 53 line 10 to column 73 line 18); which disclosure is herein incorporated by reference.

CNC Command Arrangement

A CNC command arrangement is disclosed in related application Ser. No. 752,751 at page 144 line 2 to page 160 line 6 (now U.S. Pat. No. 4,120,583 at column 73 line 21 to column 81 line 34); which disclosure is herein incorporated by reference.

Machine Interface

Machine automation has been widely used in the prior art such as with numerical controls for machine tools. These prior art controls are special purpose (non-computerized) devices with solid state electronics, relays, and other such devices; but without stored program digital computers. The special purpose devices do not fully utilize time sharing, therefore requiring special circuitry for each function implemented, resulting in a large number of expensive circuits each performing a special purpose function. For the numerical control of machine tools, these special purpose controls have been standardized for use with many different machines. The requirements of each type of machine are usually different, requiring a different interface to convert the standard control system signals into the special signals required by the machine. This interface is usually implemented with relays and mounted on the machine as an integral part of the machine, commonly known in the art as "the machine magnetics" or simply "the magnetics". The magnetics have been accepted in the numerical control field as a necessary part of the system, where the need for magnetics is not disputed in the prior art.

For numerical control systems that control machine tools, digital commands are input with a punched tape to describe the part to be cut on the machine such as a milling machine. These commands are accessed by the numerical control system and are executed to drive the machine to automatically cut the part.

Prior art numerical control systems have been designed around special purpose digital devices where operations such as logic, control, and computations are performed with special purpose logic. Because of the high cost and limited capability of these special purpose numerical control systems, the data is preprocessed with a remote, large scale computer using a parts program compiler such as APT. The remote computer preprocesses the information and generates a punched tape in a control oriented language (EIA) containing the initial conditions and commands required by the special purpose numerical control equipment. These parts program tapes describe the part to be generated and are used as the command inputs to the numerical control system to cut the part.

The present invention provides an improved control system for physical systems such as machines and processes incorporating a stored program digital computer to perform control operations in conjunction with the physical system. The computer performs operations that were assigned to special purpose circuitry in prior art control systems and the computer performs operations that were assigned to special purpose relay logic such as in the prior art machine systems. Special purpose interfaces that are used in the prior art are eliminated, where the computer performs most of those prior art interface operations under program control and communicates with the physical system through an elemental interface. These improvements provide low cost by eliminating special purpose circuitry, flexibility by implementing interface operations in a stored program computer under program control thereby permitting ease of modification and improved capability by utilizing the computational power of a general purpose digital computer to provide interface operations.

The present invention provides an improved and simplified electronic data processing system which performs the necessary data processing functions at least as well as prior art non-computerized systems but which, because of its simplicity and inexpensive cost, is suitable for use in applications for which, because of economic reasons, the benefits of electronic data processing systems were previously unavailable. In particular, this invention presents a simple, inexpensive system and method to provide computerized capability for numerical control applications. It should be understood that any reference to such a numerical control system is intended to include any system wherein digital data processing capability is provided for control of a physical system such as a machine or a process. The particular system discussed herein is one class of such devices.

The prior art controls and interfaces are relatively large devices that are often contained in a large cabinet that is set apart from the machine and machine interface. The machine interface is typically composed of magnetic relays which perform computational operations to process and execute the commands from the control system.

In a preferred embodiment of the present invention, the machine interface relays used for computational operations which can be performed in the data processor under program control are eliminated. Certain relays that are used as "amplifiers" to provide high power signals, such as for motor excitation, obviously can't be eliminated with computer processing, where such relays or their equivalents are still required in the system. To practice this invention it is required that machine control operations be performed with the data processor, but it is not necessary to perform all machine control operations with the data processor. Therefore, some or all of the computational type operations may be performed with the data processor.

The terms related to computational operations or computational processing used herein are intended to mean machine control operations or processing, timing, sequencing, and logical operations.

The terms "discrete" and "static" such as with discrete machine control operations and static machine control operations are used to define what may also be termed on-off type operations. These terms may be contrasted to contouring operations which can be termed "dynamic" operations.

In one embodiment, the interface electronics shown in FIGS. 5 and 6 can be physically mounted in the machine subsystem, apart from the control subsystem. In another embodiment, portions of the interface electronics shown in FIGS. 5 and 6, particularly the C-Register 560 and 670, can be physically mounted in the machine subsystem, apart from the control subsystem.

The machine interface shown in FIGS. 5 and 6 and described herein can be partitioned, where the machine interface electronics can be physically contained in a pendent or alternately in machine mounted modules.

The terms interface, interface assembly, and IFA relate to the computer I/O structure, machine interface and various auxiliary devices. This interface assembly is not an interface in the prior art terminology, but is an elemental interface. It may be considered to be a distributed collection of communications devices such as the computer I/O and interface registers. This elemental interface operates in an on-line manner, dependent on computer-action, operating with computer intrinsic signals, and performing its operations in response to the computer stored program operations.

The interface assembly (IFA-1, IFA-2, and IFA-3) is not an interface in the conventional sense but constitutes a distributed group of circuits that are normally associated with the data processor and the various system entities. The interface assembly also performs the operation of signal distribution between the data processor and various system extremities.

The IFA-1 printed circuit board is shown in FIG. 5A and contains logic gates 550, 551, 552, and 553 providing input/output circuits. The IFA-1 board accepts input and output type instruction micro-operation signals as well as address signals to encode or decode the various inputs and outputs. The input and output words are exchanged with the A-Register in the data processor 112, discussed in the referenced application, Data Processing System. The input words (IW) are multiplexed by logic gates 553 into signal P108 which is input to the A-Register. Information is output from the A-Register to the various system extremities by connecting the extremities to the A-Register output signal $A_oQ$ and clocking a selected extremity with a gated clock P104 as determined by logic gates 552. Discrete inputs are multiplexed into discrete input signal P105 by logic gates 550. Discrete outputs are decoded and gated by logic gates 551 with micro-operation signal FAH providing the gating. The discrete input signals are accessed with skip on discrete decision instructions. A short negative going pulse is provided when selected with a discrete output instruction. The I-Register flip-flops $I_1$, $I_2$, $I_3$, and $I_4$ perform the operations of latches which are toggled or set with the discrete outputs DO-4 through DO-8. The $I_1$ flip-flop is used to directly provide a Scratch Pad Memory paging operation. Outputs from the flip flops $I_2$, $I_3$ and $I_4$ are fed back to the computer 112 as discrete inputs. The signals P50-P61 are decoded operand addressed from the data processor 112.

The C-Register 560 is loaded with the $A_oQ$ signal from the computer A-Register when clocked with the OW-8 gated clock pulse to synchronize this data transfer. The C-Register output signals C15Q-C6Q are then used to control operations such as machine interface operations. The C-Register illustrates the "data pipe" concept discussed in detail hereafter, where the C-Register may be extended without limit such as shown in FIG. 6 as the C-Register extension (C31-C16) 670. The computer 112 packs together or assembles the discrete commands in the A-Register as described hereafter, then outputs this packed discrete word to the interface register (C) 560 and 670 to command system operations.

Figure 5C:
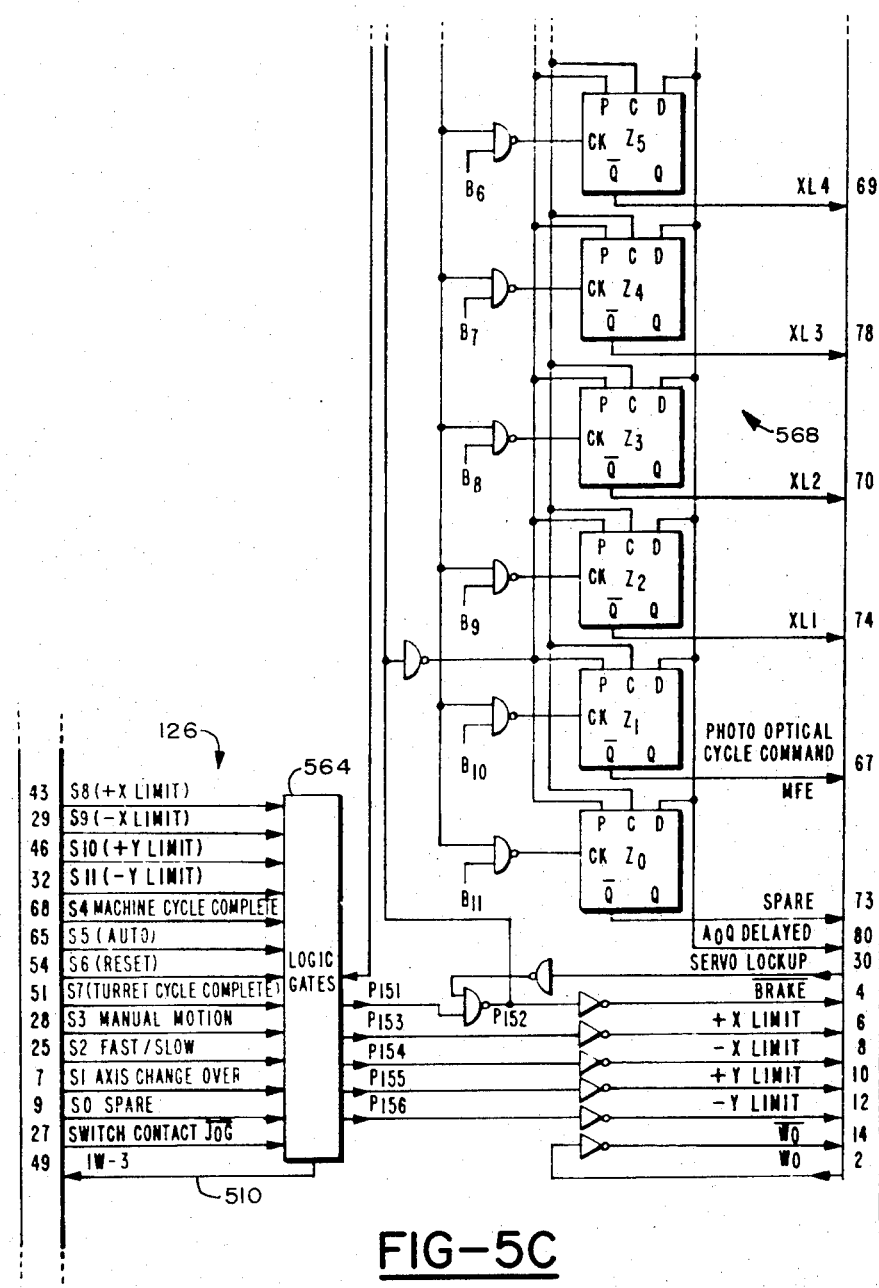

The IFA-2 printed circuit board is shown in FIGS. 5B and 5C and provides for the scan-in of input words "zero", "three", and "four" to convert the parallel input lines to a serial input that can be processed with the input word multiplexer 553 on the IFA-1 card. Logic 562 scans control panel selector switch signals into input word -0, logic 564 scans non-adapted machine condition signals into input word-3 and logic 566 scans rudimentary intrinsic tape reader input signals into input word -4. The Z-Register 568 includes flip-flops $Z_{11}$ through $Z_o$ and is a static register loaded with output word -7 for system discrete interface commands. It should be noted that this register does not have ambiguous outputs during the shift frame due to selective clocking of the flip-flops in this register.

The machine interface arrangement and logic, illustrated in FIG. 5C with logic gates 564, packs a plurality of machine feedback signals S0 through S11 into computer input word -3 (IW-3) 510. The computer 112 unpacks these signals under program control, as described hereafter. The manual machine controls S1, S2, and S3 provide the computer with operator commands from machine mounted switches which may be on a machine control panel 114 or a pendant control panel hanging from a machine overhead structure. These operator controls may be mounted on the machine to give the operator the capability to command operations while he is close to the machine such as for set-up operations.

The machine signals S4 through S7 relate to feedback from the machine. The cycle complete signal S7 can be used for a turret or a spindle condition for automatically controlling machine operations. The machine cycle complete signal S4 is a generalized machine cycle signal used to detect machine conditions such as the machine spindle stop condition described hereafter. The machine limit switches S8 through S11 are used by the computer to detect whether the machine has exceeded the physical translational dimensions, causing the computer to take the required action such as entering a slide hold condition to stop machine translation.

The scan-in logic 562, 564, and 566 provides serial data inputs to the computer A-Register. The scan-in logic acts as a multiplexer, which multiplexes parallel input conditions with the sequential bit time signals B0-B11 of the computer to provide a sequence of input conditions such as with IW-0, IW-3, and IW-4 from scan-in logic 562, 564, and 566, respectively. When an EX instruction is executed, the corresponding IW signal is selected with IW logic gates 553 for loading the input word into the A-Register with the input signal P-108. The system input conditions such as the machine signals S0-S11 from scan-in logic 564 constitute packed discrete conditions assembled into a word with the scan-in logic for loading into the A-Register.

The IFA-3 printed circuit board is shown in FIG. 6 and provides an extension of the C-Register ($C_{31}$ through $C_{16}$) to perform auxiliary operations such as to excite the turret decode logic for machine turret select 681. Logic gates 672 provide the input gating and logical functions associated with the momentary switch logic conditions from the control panel 114 and multiplex those conditions into input word -1. Special gating is also provided for computer interrupts. The servo lockup signal 690 is used to disable the machine drives when a detrimental condition is sensed.

Control of a machine turret such as for tool change will now be described with reference to FIGS. 5 and 6. When the computer 112 receives a turret change command such as from tape reader 116, the computer will test the system conditions as interlocks such as limit switch signals S8-S11 with scan-in logic 564 and will proceed with the turret change if the interlocks are properly set. The computer will then determine the required code for the commanded turret position, pack this code into the discrete command word in the A-Register, then output this command word to the C-Register 560 and 670. The turret command will be stored in the C31, C30, and C29 stages of the C-Register 670 to excite the turret select decode logic 680, to select the desired turret output line (TS-0 through TS-7) 681. The machine turret motor will drive until the appropriate machine position switch is actuated, thereby switching off the selected drive signal 681 and stopping the turret at the selected position. The computer 112 will monitor the turret cycle complete signal S7 with scan-in logic 564 such as for an interlock to disable other machine commands until the turret cycle is complete.

In a preferred embodiment, an interface register such as the C-Register 560 and 670 may be physically located in the machine subsystem. In one embodiment, the control subsystem is physically separate from the machine subsystem and connected to the machine subsystem by cables. The interface data is communicated between the control subsystem and the interface electronics in the machine subsystem in serial data form over the interconnecting cables, thereby reducing the cabling over that of a prior art control system that uses parallel data communicated through the cables. In this embodiment, the various operations are performed under program control in the control subsystem and multiplexed or packed serial data 126A, 126B is communicated to reduce interconnections to the machine subsystem 124. Multiplexing and demultiplexing may be the primary operations performed in the machine in the form of serial-to-parallel and parallel-to-serial conversions. Secondary operations that may be performed in the machine include well known power drives for output signals and line receivers for input signals. This physical partitioning with logic and computational operations performed in the control and with drive, receiving, and parallel/serial conversion operations performed in the machine has particular advantages over prior art systems, such as for reduced cabling and increased reliability.

The interface described herein is not limited to a machine interface, but can provide similar advantages when used with other arrangements such as the operator panel 114 and 118 described in detail in the parent applications.

Switch Control

Switch control operations are disclosed in related application Ser. No. 752,751 at page 171 line 2 to page 177 line 9 (now U.S. Pat. No. 4,120,583 at column 86 line 3 to column 89 line 23); which disclosure is herein incorporated by reference.

The description of panel operations performed with a computer including switch sampling, switch processing and lamp commands using discrete input samples and discrete output commands provides an arrangement similar to that used with the machine interface discrete conditions. It will now be obvious to those skilled in the art that this description of panel operations is similar to machine operations with discrete condition processing and is intended to illustrate machine interface operations.

Figure 8C:
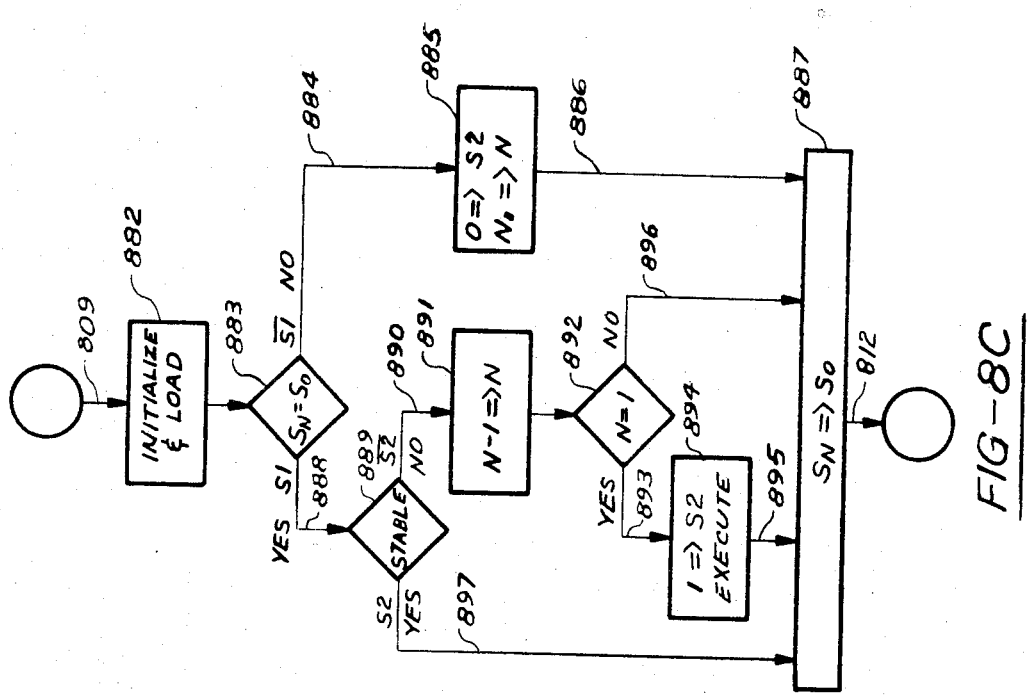
FIG. 8 is a flow diagram representation of further system operations comprising FIGS. 8A-8C showing flow diagrams of various system operations.
Figure 8A:
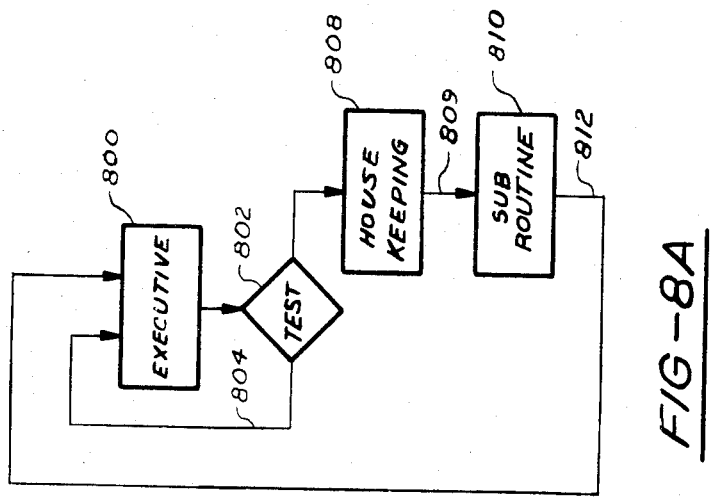

One embodiment of the data processor stored program operations that can be used to process rudimentary switch inputs is described hereafter in conjunction with FIG. 8C.

Switch signal processing is described in detail in parent application Ser. No. 288,247 now U.S. Pat. No. 4,121,284; particularly relative to FIG. 6 therein.

Machine Interface Operations

The data processor 112 executes an executive routine to control program operations and provide for time sharing with program subroutines. The data processor detects inputs and conditions with the executive routine, then transfers to the various program subroutines necessary to perform the computations and generate the outputs. The data processor can execute programs on a time shared basis by branching out of subroutines such as on a sequential, interrupt, or priority basis in a manner well known in the art. For simplicity of description, relatively complex program operations such as time sharing operations are not shown in the flow diagrams in FIG. 8; but will become obvious to those skilled in the art.

The data processor stored program operation will be described hereafter. The data processor 112 is responsive to a stored program contained in main memory 130 to provide this processing capability. Operation of the data processor 112 is controlled by the executive routine 800 to access subroutines to be executed, set the priority of these subroutines, define the timing, and other such well-known operations. The executive routine 800 controls the data processor to periodically test the real time parameter in operation 802 to determine if it is time to enter one of the real time subroutines; where the real time parameter may be derived from a real time clock, a program timer in the executive routine 800, or other well known means and methods for deriving this parameter. In one embodiment, this timer may be implicit in the stored program, where a transfer to the appropriate subroutines is provided after a certain number of instructions have been executed, thereby implying the required real time period. If the required periods have not expired, the data processor will return to the executive routine along path 804. If one of the required periods has expired to within the required tolerance, the data processor will preserve the return address and other parameters for reentry to the executive routine 800 and perform other required housekeeping functions in operation 808, then the data processor will enter the subroutine 810 along path 809 to perform the required program operations. The data processor will exit the subroutine by fetching the return address preserved in operation 808, then transferring back to the executive routine 800 along path 812.

The data processor may process the subroutines in an iterative manner, where the data processor repetitively enters the subroutine to perform a part of the programmed operations, then exits the subroutine. The data processor may successively enter, then process, then exit the subroutine providing the iterative characteristic.

Figure 8B:
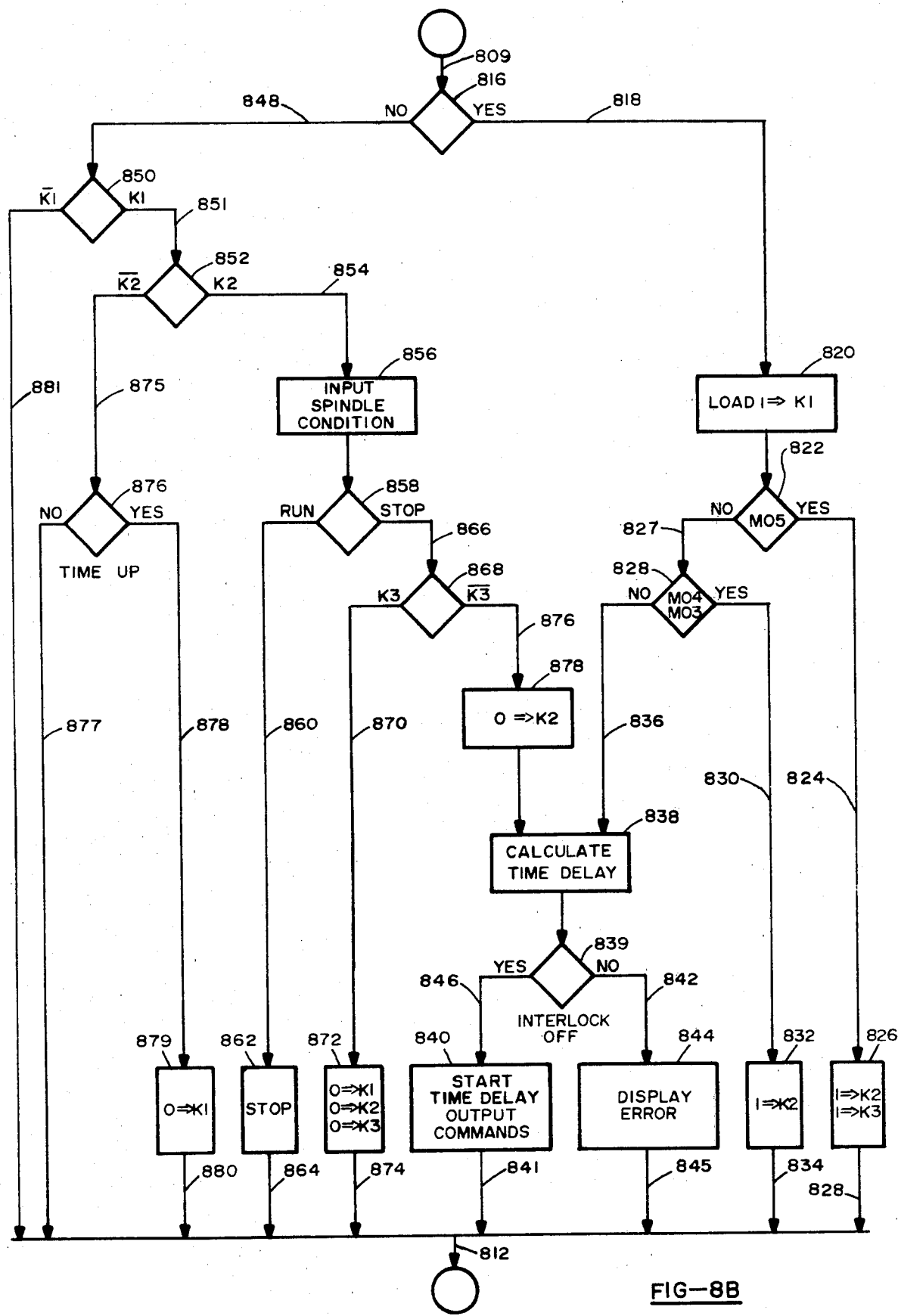

FIG. 8B shows a program flow diagram to illustrate one embodiment of machine control program operations. This illustrated operation controls the spindle and is typical of the other discrete control operations.

The data processor responds to the real time executive routine to provide entry to the machine control routine along path 809 as previously described and iteratively executes this routine to perform the required machine control operations. The data processor tests for a new spindle command in operation 816 such as from a parts program input or operator command input. If there is a new spindle command, the data processor will follow path 818 to operation 820, where the data processor will load the new commands and set the K1 condition to identify a spindle processing operation for subsequent iterations. The data processor will next test the input command to determine if it is a spindle stop command (MO5) in operation 822. If it is a spindle stop command, the data processor will branch along path 824 to operation 826 and will set the K2 and K3 conditions to identify a spindle stop command condition for subsequent iterations. The data processor will next exit the routine along paths 828 and 812, as previously described.

If a spindle stop command (MO5) is not detected in operation 822, the data processor will branch along path 827 to operation 828 to test for a spindle direction command (MO3 or MO4), indicative of a change in spindle direction; which would require bringing the spindle to a stop, then accelerating the spindle in the other direction. If a new spindle direction is commanded, the data processor will branch along the path 830 to operation 832 and set the K2 condition, which will command the spindle to first come to a complete stop before accelerating up to speed in the other direction. The data processor will then exit the routine along paths 834 and 812, as previously described.

If a spindle direction command is not detected in operation 828, the data processor will branch along path 836 to operation 838 to calculate the required time delay for the spindle to accelerate from the prior speed to the new speed. It should be noted that the K2 condition is not set because it is not necessary to bring the spindle to a complete halt to change between spindle speeds in the same spindle direction. The data processor will next exit operation 838 to test for the various interlocks in operation 839 prior to changing the spindle speed. If any of the interlocks are set, the data processor will branch along path 842 to operation 844 to perform the required operations associated with interlocks such as disabling system operations. These operations can include setting the slide hold condition to preclude machine motion, setting a lamp indicator to alert the operator to this interlock condition, and other such conditions. The data processor will then exit the subroutine along path 845 and 812 as previously discussed. If no interlocks are detected in operation 839, the data processor will branch along path 846 to operation 840 to start a time delay to permit the spindle to change speeds, then will output the interface commands to the interface register to command the spindle and then will exit the routine along paths 841 and 812 as previously described.

On subsequent iterations, the presence of additional spindle commands will be tested in operation 816. If there are no new spindle commands, the data processor will branch along path 848 to operation 850 to test for the spindle processing condition (K1) to determine if a spindle command is in the process of being executed. If the K1 condition is set indicating that a spindle command is being processed, the data processor will branch along path 851 to operation 852 to test for the requirement to bring the spindle to a stop. As previously described, the K2 condition is set to bring the spindle to a stop by either a spindle stop command (MO5) as detected in operation 822 or a spindle direction change (MO3 or MO4) as detected in operation 828, each of which will set the K2 condition. If the K2 condition is set, the data processor will branch along path 854 to operation 856 to input the machine interface conditions as a packed discrete word, then to unpack the spindle stop condition bit such as the S4 or S7 condition bits shown in FIG. 5C, then to determine whether the spindle is stopped. The spindle stopped condition is tested in operation 858, where operation will branch along path 860 to operation 862 if the spindle is still running. In operation 862, the data processor will command the spindle to stop by fetching the interface command word from memory and packing a spindle stop condition bit into the appropriate bit position, then outputting this command word to the interface register as previously described. The data processor will then branch along paths 864 and 812 to exit the subroutine as previously described. The data processor will continue to iterate through this path under control of the real time executive routine until the spindle has stopped, as detected in operation 858, causing the data processor to branch along path 866 to operation 868 to test for the K3 condition. The K3 condition was set in operation 826 for a spindle stop command (MO5), where the detection of a spindle stop condition in operation 868 will cause the data processor to branch along path 870 to operation 872 to reset the K1, K2, and K3 conditions that set the program logic for stopping the spindle, indicative of the completion of this spindle stop command. Operation will then branch along paths 874 and 812 to exit the subroutine.

If the K3 condition was not set in operation 868, the data processor will branch along path 876 to operation 878 to reset the K2 condition, indicative of the spindle having come to a stop. Because the K3 condition was not set, the spindle was stopped only to permit reversal of the spindle direction. The spindle must now be accelerated up to speed in the commanded direction. The data processor will branch to operation 838 to calculate the time delay, then branch to operation 839 to test for the interlocks, and then branch to operations 844 or 840 to either interlock operation or command the spindle to the new speed, respectively, as previously discussed.

On subsequent iterations, the requirement to accelerate the spindle to the new speed is detected in operation 852 with the $\overline{K2}$ condition, causing the data processor to branch along path 875 to operation 876 to test the time delay condition to determine if the time delay has expired for the spindle to accelerate to speed. If the time delay has not expired, the data processor will branch along path 877 and 812 to exit the routine. On subsequent iterations, the data processor will continue to test for the time delay in operation 876 until the time delay has expired, then will branch along path 878 to operation 879, where the K1 condition will be reset, indicative of the completion of the execution of the spindle commands. The data processor will then branch along paths 880 and 812 to exit the subroutine.

On subsequent iterations, the completion of the execution of spindle commands will be detected in operations 850 with the $\overline{K1}$ condition, which will cause the data processor to branch along paths 881 and 812 to exit the routine. This path will be followed on subsequent iterations until new spindle commands are input, as detected in operation 816.

Many important inventive features are embodied in the flow diagram of FIG. 8B. One important feature is the closed loop operation of the data processor 112 and the machine 124, illustrated herein with the sensing of the spindle stop condition bit as described in operation 856 and the continued iterations through the program until the computer detects the spindle stop condition. It is inconsequential as to the duration of time required for the spindle to stop because the data processor will continue to iterate through the program waiting until the spindle stop condition from the machine is detected.

Another feature illustrated herein is the open loop command of the spindle to accelerate up to speed with a data processor generated time delay, the expiration of which is indicative of the spindle achieving the speed. The time delay is set in operation 840 and continually tested in operation 876 as the data processor iterates through this routine. When the time delay has expired, the data processor will assume that the spindle has achieved the commanded speed and exit the time delay subroutine path 877 as described.

Still another feature illustrated is the optimization of time delays associated with spindle operations to minimize the time required to execute spindle commands. This optimization of time delays is accomplished with special logic that eliminates excessive or redundant time delays and with special computations that minimizes time delays. As an alternate embodiment, the spindle could be brought to a complete stop for each spindle command and then accelerated up to speed, providing a simpler program than that shown in FIG. 8B, but requiring excessive spindle time delays such as for conditions where a speed change is commanded without a direction change. The minimization of time delays is also achieved by the data processor calculating the optimum time delay in operation 838 rather than using a fixed, worse-case time delay as is used in the prior art magnetics interface devices. It will now become apparent that the time for the spindle to accelerate from one speed to a second speed is related to the change in spindle velocity and the portion of the operational envelope that the spindle is on. The data processor can calculate the precise time delay required for the commanded spindle speed change as contrasted to the simplified alternatives of commanding a worst-worst case time delay for each spindle change.

The packing and unpacking program operations will now be discussed.

A packed discrete word may be considered to be a word with a plurality of condition bits representing command conditions or status conditions. For example, the data processor can output a discrete packed word with command conditions to an interface register to command various discrete machine functions and the computer can input a packed discrete word with status conditions from an interface register to define various discrete machine status conditions. The packing and unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control the spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word; containing zeros in the bit positions to be modified to zero set the related bits in the command word, then logically ORing that command word with a second control word to pack command bits into the appropriate positions of the command word. The new command word is output to the interface register to generate machine commands and also stored in the computer as a record of the current machine command conditions.

In this manner, condition bits can be packed into or unpacked from digital words for the interface arrangement described herein. Other interface arrangements and programming methods will become obvious to those skilled in the art.

Processing of the rudimentary status condition signals to eliminate erroneous signal portions such as switch bounce will now be described.

A program flow diagram is shown in FIG. 8C to illustrate one embodiment of the switch processor operation. The real time executive routine provides entry to this switch control subroutine along path 809. Machine response time is in the order of a few tenth seconds so execution of this subroutine approximately every one tenth second will insure detection of a proper command. Other real time periods would be provided for switch occurances faster or slower than machine switches, such as for relays that operate faster than a machine.

The data processor 112 will enter the switch input subroutine through operation 882, which initializes the algorithm parameters and loads the new switch input condition. This condition may be an encoded condition, a discrete non-encoded condition, or other such input. The data processor compares this new condition (SN) with the old condition (SO) in operation 883, where the old condition (SO) was the last prior sample. If the old and the new switch conditions don't compare, then the switch condition has changed due to an operator action, electrical noise or other such cause. Data processor operation then branches along the non-compare (S1) path 884 to program operation 885, where the data processor resets the stability condition bit (S2) to the unstable state ($\overline{S2}$) and preloads the stable sample program count parameter (N) to a predetermined count (No). This unstable state ($\overline{S2}$) identifies a change in switch condition. The count (No) in the stable sample counter defines the number of stable samples required to define a stable condition. The data processor will next follow path 886 to program operation 887 which stores the various program conditions and exits to the executive routine along path 812 as previously described.

If the old and new switch conditions do compare (S1) in operation 883, then the switch condition has not changed from the last prior sample. Data processor operation then branches along path 888 to program operation 889 where the data processor checks to determine if the switch condition is a stable condition. If the check in operation 889 shows that an unstable condition ($\overline{S2}$) exists, the data processor branches along path 890 to operation 891, where the data processor decrements the stable sample count parameter (N), indicative of the switch condition remaining stable for another sample period. The data processor then makes a check in operation 892 to determine if the stable sample count parameter (N) has been decremented down to one, indicating a sufficient number of stable samples to define a stable condition and to then execute the switch command. If the stable sample count parameter (N) is one, then the data processor branches along path 893 to operation 894, where the data processor sets the unstable condition ($\overline{S2}$) to the stable condition (S2) and executes the switch command. It should be noted that the data processor executes this operation 894 only once for each change in a switch input condition. The data processor then transfers to operation 887 along path 895 and exits the subroutine as previously discussed. If the stable sample count parameter (N) in operation 891 has not counted down to one, then the data processor branches along path 896 directly to operation 887 and exits the subroutine as previously discussed. This path 896 bypasses the operation 894 and, therefore, preserves the unstable condition that exists for at least one more sample period.

If the check performed in operation 889 shows that a stable condition exists (S2), where the last prior switch command had been executed in operation 894, then the data processor branches along path 897 to operation 887 and exits the subroutine as previously described because there has been no new switch input to be processed.

The system of the present invention is generally applicable to the control of "physical systems" such as machines and processes as contrasted to computational systems, biological systems, and the like. The very broad applicability of this system will be further exemplified for control of an automobile hereinafter termed "auto".

In reference to FIG. 1C, control 100 may be used to control an auto in place of a contact print machine, where control 100 may be mounted within an automobile which may be characterized by machine 124. The internal configuration of machine 124 may be that of a contact printer as shown in FIG. 1C or may be that of a well known automobile. Communication between control 100 and machine 124 may be performed with interconnecting cabeling 101.

FIG. 1A further illustrates the system 110 comprising control 100 and machine 124. The implementation of elements shown in FIG. 1A are described herein in an embodiment for control of a contact print machine and a milling machine. As discussed above, the various elements of the system 110 may be implemented under program control of the data processor 112 thereby minimizing interfaces and enhancing flexibility. Therefore, it can be seen that by reprogramming data processor 112, the operation of the elements shown in FIG. 1A may be changed from that discussed for a contact print machine or a milling machine to that discussed for an automobile.

For example operator panel 117 provides control and display capability for interaction with an operator for control of auto 124. Operator panel 117 may be implemented as a dashboard having the configuration of well known special purpose dashboard arrangements or may be implemented in a more generalized form as will be discussed with reference to FIGS. 2A and 2B. It should be understood that operator panel 117 being implemented for a numerical control system as shown in FIGS. 2A and 2B is equally applicable to use with an auto where the shape, layout, legends, and other features may readily be adapted in accordance with the present invention.

Tape reader 116 may be a punched tape reader or, in an alternate embodiment, may be a magnetic tape reader such as a well known magnetic tape cassette.

Spare I/O channels 128 may provide further control operations but, in a preferred embodiment, these channels represent an interface to external devices 150–162 which may be connected to system 110 through well known plug connections such as for checkout of system 110, calibration of system 110, or other such purposes.

Servos 120–122 may be used to control auto operations such as for control of steering, braking, and other well known auto operations. Discrete interface control may be provided with discrete signals 126A and 126B. Discrete commands 126A may control operations such as ignition, transmission, fan, and other well known auto devices. Discrete feedback signals 126B may be related to operations performed by the transmission, engine, and other well known auto devices.

Operator panel 117 is shown in detail in FIG. 2A. The operation and configuration of Panel 117 will now be discussed for an automotive embodiment of the present invention.

Numeric display 238 is used to communicate with an operator in numeric form and may further be provided with alpha-numeric capability using the teachings of the present invention for numeric displays in conjunction with well known alpha-numeric display elements. Display 238 may be a single numeric display as shown in FIG. 2A or may have a plurality of characters for displaying different parameters. For simplicity, the present invention is described for a single display 238 having a switchable characteristic with selector switch 242 as described for a numerical control system. Selector switch 242 may be used by an operator to select each of a plurality of parameters for display with numeric display 238. Selector switch 242 may select parameters for display such as velocity or speed, total mileage of the vehicle, mileage from a predetermined condition, time of day, oil pressure, oil temperature, engine temperature, fuel level, engine RPM, and other automotive related parameters. In addition, selector switch 242 may display auxiliary information such as an error code related to a malfunction or other condition.

Keyboard 244, clear switch 250, and enter switch 254 may be used for entering information as discussed for the numerical control system embodiment. An operator may provide a keyboard input by selecting a desired input parameter with selector switch 242 and monitoring the display 238. If the operator desires to change the display parameter, he would depress clear switch 250 to blank the display, sequentially input the desired numbers with keyboard 244, verify that the parameter entered is proper using display 238, then depress enter switch 254 to enter the displayed parameter into the computer.

The purpose of keyboard 244 and related controls may be better understood with a specific example. If an operator switches to command computer 112 to control the auto 124 to travel at a specific velocity, the operator would insert the desired velocity by positioning parameter switch 242 to a velocity set position then monitor the previous parameter stored in the system. If the operator desires to change the last velocity set parameter, he would depress the clear switch and verify the blanking of display 238, then he would depress the appropriate keys on keyboard 244 to insert the desired velocity set parameter such as depressing keys 6 and O for a velocity of 60 miles per hour, then the operator would verify the parameter 60 on display 238 and, if correct, the operator would then depress enter switch 254 to command the computer to enter the new parameter. If the operator made an error in entering the parameter, he would again depress clear switch 250 and again attempt to enter a proper parameter. When the operator desires to use the speed parameter, he would command the computer to operate in a speed set mode such as by depressing momentary switch 283. As described herein, the computer 112 would illuminate a speed set lamp 234 in response to the operator command with switch 283 for feedback to the operator that the speed set mode had been entered. When the operator again depresses speed set switch 283, the computer 112 would exit the speed set mode and would extinguish speed set lamp 234. Further, the computer would be responsive to other system conditions such as discrete feedback conditions 116B which may also be used to exit the speed set mode and extinguish lamp 234. For example, if the computer detects a feedback signal related to a brake command, the computer would exit the speed set mode and would extinguish speed set lamp 234.

Slowing or stopping of the auto may be provided by actuating brake command signals included in discrete output signals 126A in response to brake command signals. A brake command may be provided with machine interface signals 126A such as from a switch on a machine brake pedal or may be provided with a switch that may be considered to be on control panel 114. For example, stop switch 256 may be physically mounted in conjunction with a brake pedal so that switch 256 is actuated when the brake pedal is depressed. Therefore, an operator input to stop switch 256 would be a foot control and would provide a brake command. The computer 112 would interrogate the operator commands and would interpret the operator commands for execution. Execution of the brake command such as from stop switch 256 would result in the computer 112 generating output brake signals such as with brake signals 126A. In still another embodiment, a multiposition switch such as switch 241 may be connected to a brake pedal so that the position of the switch is related to the distance that the brake pedal is depressed. The computer 112 would interrogate and interpret the position of switch 241 to determine the position of the brake pedal as being indicative of which of a plurality of braking conditions was commanded. This plurality of braking conditions might include a non-brake position and a plurality of different magnitude braking conditions from slow deceleration to rapid deceleration. Still further, a brake pedal might be connectable to an analog pickoff such as a potentiometer or resolver which could provide feedback to the computer either directly as discussed in the parent patent applications or with a well known analog-to-digital converter. The computer receives the input brake signal related to the analog pickoff condition and commands a deceleration operation in response thereto.

Direction control is usually provided with a steering wheel providing a directional input to a steering mechanism. The system of the present invention provides for directional control such as in conjunction with a servo 120 operating in response to commands from computer 112 to control machine direction. In the numerical control embodiment of the present invention, directional control is provided by commanding relative velocities of a plurality of axes. In an automotive embodiment, computer processor 112 would receive a direction command signal from an operator or as an automatic input and would generate output commands that may be servo positioning commands to drive the steering mechanism of the auto. Input position commands may be provided with a keyboard for a digital input, with slew switches such as discussed for jog operations using switches 252, or with an analog pickoff connected to a steering column, or other steering input device. For a digital input, computer 112 receives the information directly as described for input signals from control panel 114 or machine feedback signals 126B. Further, an analog pickoff may provide feedback as discussed in the parent applications for resolver feedback to the data processor or using well known analog-to-digital converters. The data processor controls steering servo 120 in response to input steering signals. In addition, the computer may override the input steering signal as a function of other system conditions such as in response to an accelerometer input to provide radial acceleration limitations on turning rate such as a function of vehicle velocity or in response to an auto velocity parameter or other vehicle conditions.

Lamps 233 may provide operator feedback in response to various vehicle conditions such as performed with the well known automobile lamp indicators for low oil pressure, high temperature, generator discharge and further including operator feedback conditions. In prior art devices, a sensor for generating a signal relating to a displayed condition is directly wired to an indicator lamp. In the system of the present invention, the computer 112 interrogates a plurality of sensors to determine system conditions such as with machine inputs S0–S12 (FIG. 5C) and interprets the input signals under program control to generate the output display parameters in response thereto.

The system of the present invention has broad applicability to control of physical systems. In a preferred embodiment, control of a high registration contact print machine and a machine tool have been described in detail to exemplify the present invention. Still further, an automobile control embodiment has been described to illustrate another application of the present invention. The broad scope of the present invention will be further illustrated with an embodiment that may be used in a home or other building.

System 110 may be used by a businessman or home occupant to control machines commonly found in a business establishment or in a home. In a business establishment, machine 124 may be a dictating machine, a limited access control, an elevator control, or other well known machines contained in the business establishment. In a home embodiment, machine 124 may be a washing machine, a dryer, an oven, a refrigerator, a dishwasher, a television, an alarm such as a fire alarm or burglar alarm, or other well known machines common in homes. The system of the present invention may be used to control a single machine or a combination of machines to perform their respective operation. In a preferred embodiment, system 110 has been described for controlling a plurality of operations associated with a single machine. In other embodiments, system 110 may control a plurality of operations associated with more than one machine whch may include different types of machines.

The system has been described for a particular group of extremities or peripherals such as devices 150-158, 114, and 118 for a machine control system embodiment. Other extremities or peripherals may be used with the system 110 to adapt this system to the particular requirements of the application. For example, CRT 158 may be a well known television set controlled to provide alpha-numeric messages or graphic displays under control of system 110. Further, the peripherals or extremities discussed in detail for system 110 above may be adapted to the requirements of the particular application. For example, operator panel 117 has been described in an embodiment for a machine control system and the versatility of this panel configuration has been described for general applications where the switches and displays are under control of a data processor operating under program control. Therefore, the operation of each element on panel 117 may be adapted to a particular application primarily by reprogramming the data processor. Further, the legends associated with each switch and display may be changed and the layout of the panel may be changed to meet the requirements of a particular application using techniques well known in the art. For example, legends may be provided with silk screen or photographic processes, switches may be relocated by changing the well known printed circuit board or wire bundle interconnections on the panel back plane in conjunction with providing mounting holes in different portions of the panel, and displays may be added or removed and may be located in different areas of the panel as required by the particular application, implemented by using the teachings of the present invention. Further, the panel 117 is exemplary of a generalized input and output arrangement, where the switches may be operator actuable with a hand such as for the embodiment shown in FIG. 2A, by a foot such as with an automobile brake pedal, or with other actuation arrangements. Further, the arrangement discussed for lamp displays 233 and numeric displays 238 can similarly be used to control other devices such as machine actuators, automobile headlights, and other well known devices.

Figure 3D:
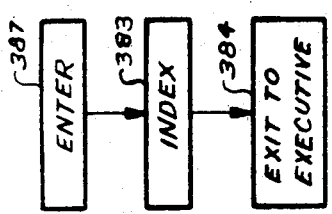
FIG. 3 is a flow diagram representation of system operations comprising FIGS. 3A-3G showing flow diagrams of various sytem operations.
Figure 3E:
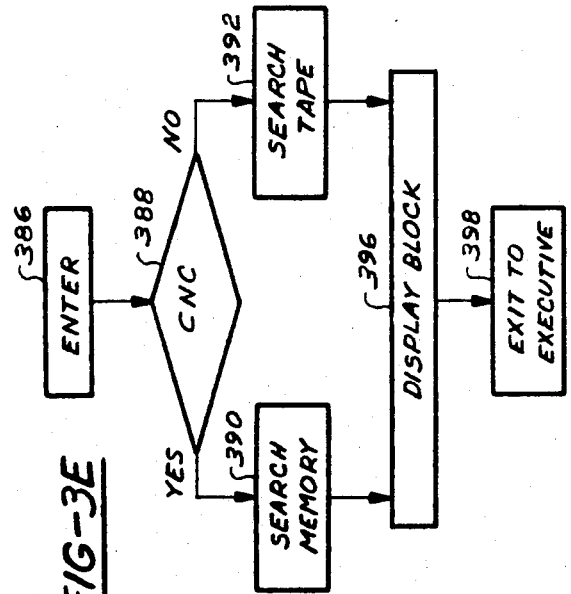
Figure 3C:
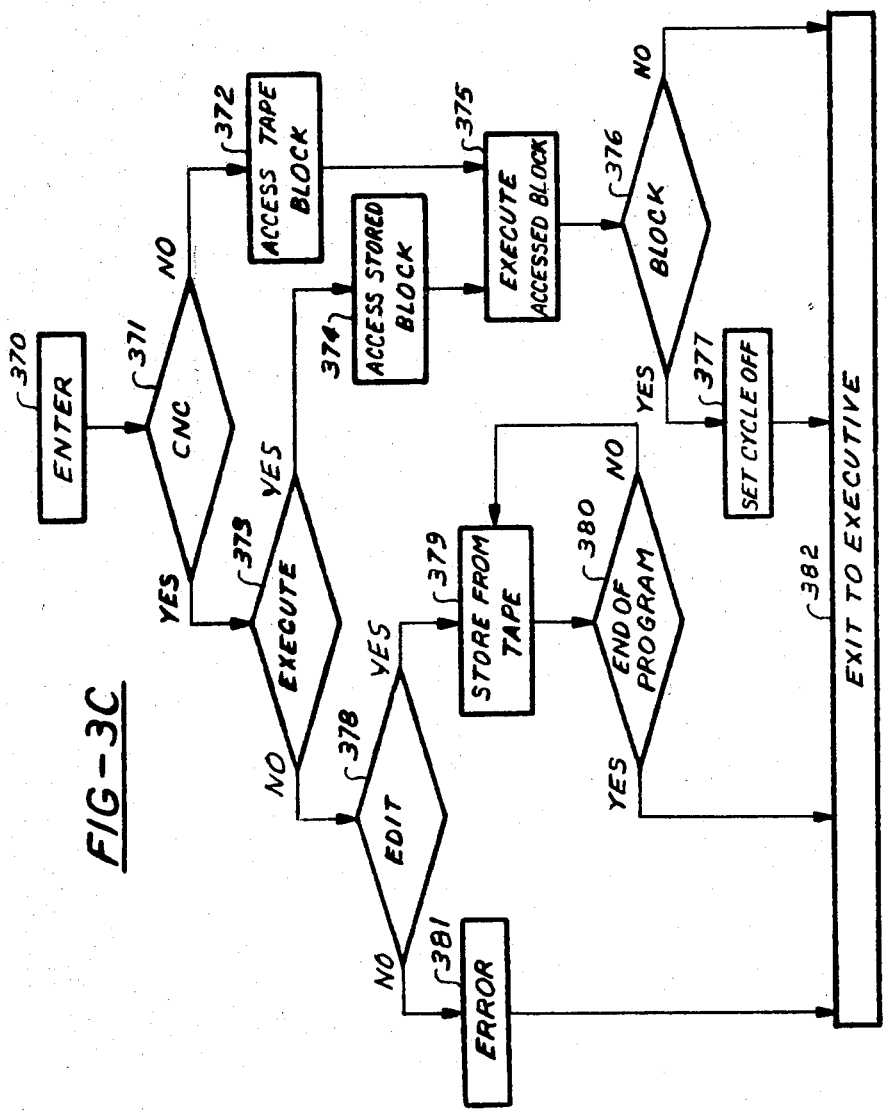
Figure 3G:
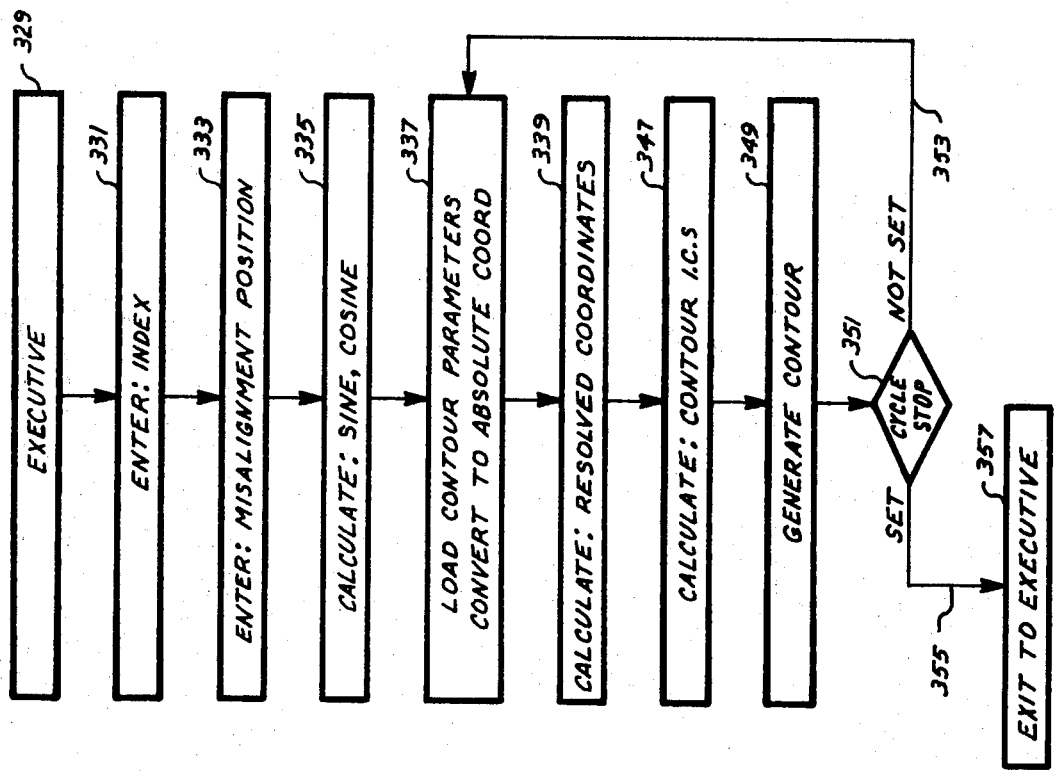
Figure 3F:
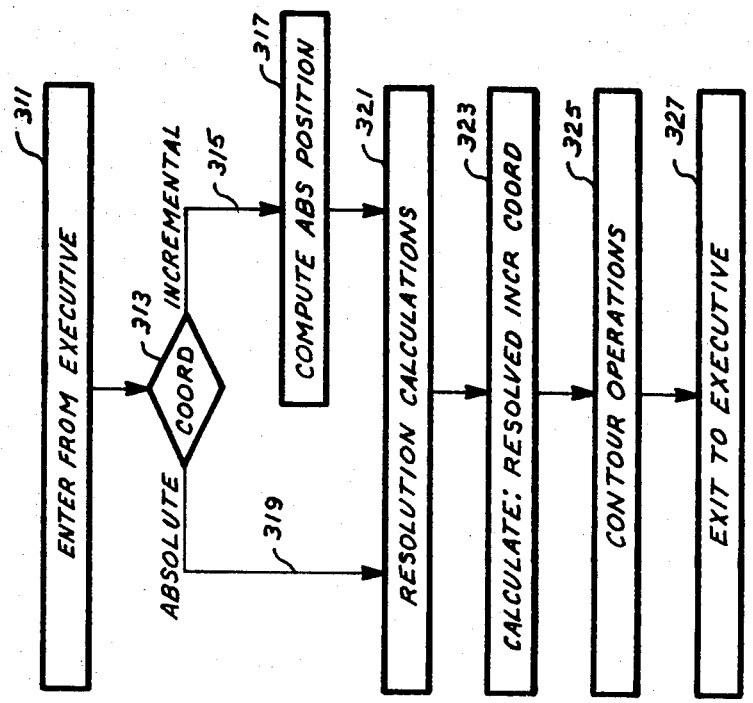

The mode control logic discussed with reference to flow diagrams shown in FIGS. 3A-3E may control different modes of operation. For example: keyboard subroutine 326 may be used to permit an operator to manually enter commands for many different types of machines or other systems; block subroutine 328 may be used to permit an operator to control a machine or other system in a semi-automatic manner; continuous subroutine 330 may permit an operator to control a machine or other system in an automatic manner; and index subroutine 332 may be used to permit an operator to control a machine or other device to enter a predetermined condition, which may be an initial condition; search subroutine 334 may be used to permit an operator to control a machine or other system by searching for information and programs; and error subroutine 336 may be used as a generalized operator feedback indication on system performance, status, and other conditions. The flow diagram shown in FIG. 3B is exemplary of a subroutine for permitting an operator to manually control or change the operation of a machine or other device. Similarly, FIGS. 3C-3E are exemplary of subroutines that may be used to control many different types of machines or systems. Further, the subroutines shown in FIGS. 3F and 3G illustrate computational operations for simplifying operation of machines by resolving coordinates, converting between coordinate systems, eliminating misalignments and other such undesirable characteristics and exemplifying other computational capabilities. It will become obvious to those skilled in the art from the teachings of the present invention that the flow diagrams set forth in FIGS. 3A-3G; having been described for a numerical control embodiment to exemplify the features of the present invention; are adaptable to many different types of control operations.

In a control system embodiment having existing wiring, such wiring may be shared between the original signals carried by the wiring and by the control signals; thereby further enhancing system economy. In one example, AC power plugs and interconnections in a home embodiment are available in virtually every room and may be used for communicating control signals. Further, electrical machines are typically plugged into the power system. Therefore, the AC power distribution network may be shared with control signals to provide a communication system for machine control. For example, signals 126 such as command signals 126A can be communicated between the data processor 112 and the machine 124 by modulating a carrier and impressing this carrier on the AC power distribution line. Machine 124 may include a well known coupler and demodulator to receive the digital signals transmitted on the power network.

Communication through the power distribution system is well known in the intercom art for communicating voice information. Therefore, communication of digital information can be provided in the same manner. Digital information is easier to transmit than voice information, where digital information involves only two states and the voice information involves a continuous amplitude spectrum, as is common with analog signals. Therefore, well known prior art power line modulation arrangements may be used to provide the communication capability described herein.

Therefore, transmission device 127 may be a well known arrangement including devices for modulating a high frequency carrier (such as 10 KHz to 100 KHz) with digital signals and for coupling the modulateed signals onto the power line such as with a coupling transformer at the transmission source and including devices for coupling the signals off of the power line at the destination such as with a coupling transformer and for demodulating signals at the destination to obtain the transmitted digital information. An embodiment is discussed herein for transmitting information on a single transmission line for a teletypewriter arrangement and for a machine communication arrangement, where the transmission and receiving of self-synchronizing signals are discussed in detail therewith for a preferred embodiment and is known in the art for prior art embodiments. Therefore, self-synchronizing data may be transmitted between system 100 and machine 124 using a single pair of power transmission lines without the need for clock signals. As an alternate embodiment, data and clock signals may each modulate different subcarrier frequencies, where both the data subcarrier and the clock subcarrier may be impressed upon the power line, received at the destination and demodulated to provide separate data and clock signals. A data transmission arrangement using a gated clock signal is discussed herein for the data pipe shift register embodiment and for the gated clock arrangement of the present invention.

The interface arrangement set forth in FIGS. 5A-5D, 9A, and 9B have been described for a machine tool embodiment to exemplify the present invention. It is herein intended that the machine tool embodiment be exemplary of the broad scope of the present invention for controlling physical systems and, in particular, various types of machines. For example, the tape reader control signals in the C-Register 560 can be used to control other machines such as a washing machine. The C15Q signal may be used to start and stop the wash cycle, the C14Q signal may be used to start and stop the spin cycle, and signals C14Q-C16Q may be used to control various other machine devices such as a pump, a hot water intake valve, a cold water intake valve, and various other devices exemplified by the machine. Further, as discussed for a machine tool embodiment, C-Register 560 may be physically mounted in the machine 124 and may be loaded from transmitted information which may be transmitted over the power lines as discussed above. Logic gates 552 are provided for gating other clock signals to other shift registers for shifting the AOQ signal into such other registers, as illustrated in FIG. 5A for the C-Register 560. Similarly, input information is obtained by shifting data from such other registers with the gated clock signals obtained from logic gates 552 through logic selection gates 553 into an input register such as the A-Register in the data processor. Still further, discrete outputs to machine 124 such as DO signals from logic gates 551 and discrete input signals such as DI signals into logic gates 550 provide control and machine communication. Yet further, parallel input logic 562, 564 and 566 and parallel output register 568 may be used to control other types of machines. Although the machine input signals 126 to logic gates 564 have been described for a machine tool embodiment, it is herein intended that these signals be usable for other types of machines such as the washing machine described herein. Still further, select decode 680 has been described for a turret select but may also be used for a mode select such as for a washing machine to control the solenoids and actuators for controlling devices generating operations such as wash modes, spin modes, drying modes, and other such operations.

Figure 9A:
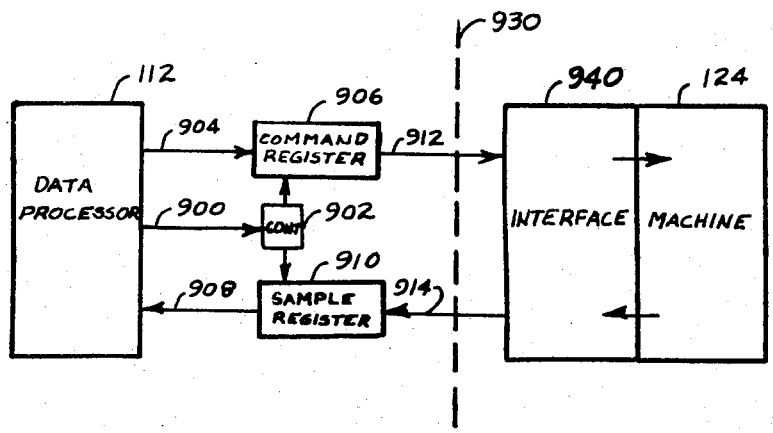
FIG. 9 is a schematic and block diagram representation of an arrangement for communication between a data processor and a machine comprising FIGS. 9A and 9B showing different embodiments of the communication arrangement.
Figure 9B:
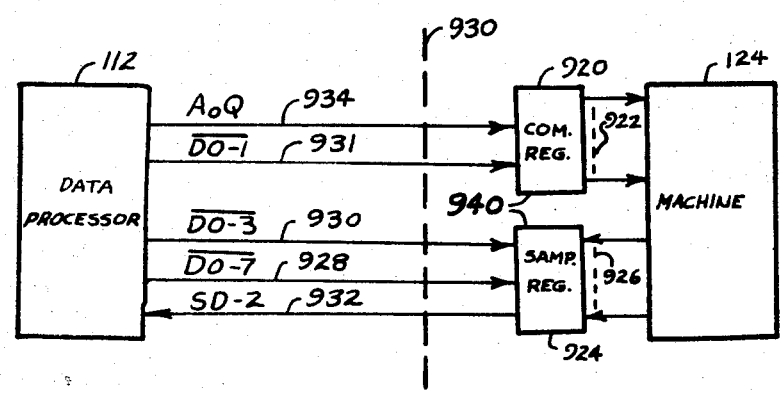

The interface arrangement shown in FIGS. 9A and 9B may be used with a machine such as a washing machine wherein interface 940 may include the power line transmission arrangement discussed above. Command registers 906 and 920 and sample registers 910 and 924 may be configured in various arrangements to implement an interface with other types of machines such as a washing machine. Yet further, the generation of a sequential stream of control signals has been described above with reference to FIGS. 9A and 9B exemplary of a self-synchronizing data stream such as might be usable on a single transmission line arrangement like an AC power line.

The flow diagrams of system operations set forth in FIGS. 3A-3G and 8A-8C are applicable to a general machine arrangement such as a washing machine arrangement. Although the flow diagram set forth in FIG. 3B has been described with reference to a spindle of a lathe, it is applicable for control of another machine operation such as for control of the rotating element in a washing machine, for control of the shaft of an automobile, and, consistent with the broad scope of the present invention, for control of operation of a generalized machine element with various sequencing and control operations.

The elements and cooperation between elements described for the embodiments of the present invention are discussed herein for a preferred embodiment to exemplify the inventive features, where these inventive features are intended to be generally applicable based upon the broad scope of the present invention. Further, many of the features have been described independently for simplicity. It is herein intended that the various features discussed shall be usable in combination to provide a system with various combinations of these features. For example, a control panel has been described for one embodiment, a machine interface has been described for a second embodiment, and transmission line communication with a washing machine has been described for a third embodiment. It is herein intended that the control panel, interface communication, transmission line arrangement, and washing machine be combinable in an embodiment using combinations of the features described herein. Similarly, any features described with respect to one preferred embodiment are intended to be equally usable in various combinations therebetween and in other embodiments, wherein the structure and operation for other combinations and with other embodiments will become obvious to those skilled in the art from the teachings of the present invention.

Machine And Control Unit Communication

Transmission of data through cabling and across an interface may cause problems for high speed digital data. Therefore, an arrangement is discussed that provides low frequency data and clock signals between a computer 112 and an interface register. These low frequency data channels can be provided with various arrangements such as (1) auxiliary registers and (2) discrete input and discrete output computer instructions.

In prior art computers, data transfers are performed in parallel to enhance computer speed. Also, in prior art machine control system, the machine condition signals 126B are communicated between the machine 124 and the control 100 in parallel data form. Parallel data transfer require an excessive number of lines and associated electronics such as line receivers and line drivers. Therefore, a preferred embodiment of this invention uses serial data transfers between electronic subsystems and also provides a serial data transfer arrangement between the control subsystem and the machine. Serial data transfers are intended to mean sequential data transfers of a plurality of bytes, where the preferred embodiment discussed herein provides serial data transfers of sixteen single-bit-bytes per word.

The auxiliary register embodiment, illustrated in FIG. 9A, provides buffer registers 906 and 910 that are loaded at a first data rate and unloaded at a second data rate. For example, computer output command words 904 are loaded into the auxiliary register 906 at the high computer clock rates and are unloaded at low interface clock rates while computer input sample words 908 are loaded into the auxiliary register 910 at the low interface clock rates and are unloaded at the high computer clock rates. The data processor 112 provides command signals 900 to an auxiliary register control 902 to control the transfer of high data rate output command words from the computer 112 along line 904 to the command register 906 and to control the transfer of high data rate input sample words from the sample register 910 along lines 908 to the computer 112. Also, the auxiliary register control 902 controls the transfer of low data rate output command words from the command register 906 to the machine interface 302 along lines 912 for machine control and also the transfer of low data rate input sample words from the interface 302 to the sample register 910 along lines 914 to define machine conditions.

This auxiliary register interface embodiment can be the same as described for the servo commands in the parent applications, where the computer loads servo commands into the auxiliary Δ register and/or unloads servo data from the auxiliary Δ register, then generates a discrete output instruction such as a DC-13 instruction to initiate the off-line operations at the servo clock rates.

For parallel computer input/output structures, the operation of parallel-to-serial and serial-to-parallel conversions can also be provided with the auxiliary registers 906 and 910 in addition to the data rate conversion for the communication function.

Discrete output and discrete input instructions can be used to communicate with an interface register in much the same manner a discussed for the 110 baud auxiliary channel for communication with a typewriter described in the parent applications.

For this interface embodiment, the computer 112 will clock the selected interface register with a discrete output, which can be used in place of the previously discussed OW-8 clock signal, to load each command bit into that interface register, which may be the $A_oQ$ bit as described for the typewriter embodiment, and/or to make a new bit available at the output of that interface register which can be sampled with a discrete input instruction.

This embodiment is illustrated in FIG. 9B. The interface command register 920 is used to provide command conditions 922 to the machine 124 and the interface sample register 924 is used to sample machine conditions 926 and provide these conditions to the computer 112.

The computer 112 initiates an input sample operation with a discrete output instruction which generates a DO-7 command pulse 928 to command the loading of the machine conditions 926 into the interface sample register 924; then the computer 112 clocks the sample register 924 with discrete output instructions which generate DO-3 command pulses 930. The computer samples the output 932 of the sample register 924 with a skip-on-discrete-2 (DI-2) instruction after each discrete output clock instruction and packs the new machine sample condition 932 into a machine sample word under program control. The computer 112 samples all of the machine conditions in register 924 in sequence in this manner.

The computer 112 initiates an output command operation by packing the discrete command conditions into a discrete command word, then loading this packed discrete command word into the interface command register 920. This loading operation is performed by placing the command word in the A-Register so that the least significant bit of the A-Register ($A_oQ$) 934 is presented as the input to the command register 920, then executing a discrete output -1 instruction which generates a DO-1 command pulse 931 to clock the register 920 to shift-in the $A_oQ$ 934 command bit. The computer then executes a shift right instruction to place the next command bit in the $A_oQ$ position and then sequentially executes combinations of discrete output -1 instructions and shift right instructions until the command word in the A-Register has been clocked into the command register 920.

In another embodiment, the discrete output -3 (DC-3) pulse 930 can simultaneously clock both, the command register 920 and the sample register 924 to simultaneously input a sample bit and output a command bit. The computer 112 interleaves the input sample operations and the output command operations as will be obvious to those skilled in the art.

It can be seen with reference to FIGS. 9A and 9B that a low data rate interface 930 and serial multiplexed communication exists for each embodiment discussed, thereby providing the advantages of few interconnections and low data rate signals between the computer subsystem 112 and the machine subsystem 124.

The "data pipe" arrangement will now be discussed. A data pipe concept is illustrated in FIGS. 5A and 6 with the C-Register 585 and C-Register extension 670. The computer A-Register is a 16 bit register; described in the parent applications; yet the interface registers, such as the C-Register that communicate with the A-Register may be of greater length. The combination of the A-Register and the C-Register comprises a data pipe, where the C-Register may be sequentially loaded from the A-Register with parameters output with sequential EX instructions to load these sequential parameters into the interface register and/or to sequentially unload the interface register into the A-Register. The length of the interface register is virtually unlimited, where a sequence of many 16 bit words can be clocked into or clocked out of the interface register. This data pipe concept is further illustrated with the servo registers where the three servos channels, the common board and the A-Register are serially connected as a "data pipe", as illustrated in the parent applications. Data passes from the A-Register and is input to a register of the X axis servo through I/O channel -2. Data then passes from the X axis servo to I/O channel -2 of the Y axis servo. Similarly, data passes out of the Y axis servo into the Z axis servo and out of the Z axis servo to the common board and back to the A-Register. Thus, communication is provided between the data processor, the three servos and the common board.

The interface registers are shown as shift registers, where the output states go through loading transitions as the register is asynchronously preloaded or synchronously shifted such as with the C-Register 560. Typically, the transient nature of these transitions are fast enough so that they will not effect electro-mechanical devices such as relays. If high response equipment senses these register outputs, such as solid state electronic circuits, it may be necessary to eliminate this transient condition. This can be accomplished with logic shown in conjunction with the Z-Register 568, where the bit time signals B0 through B11 gate the clocks to each flip-flop $Z_{11}$ through $Z_o$ so that the flip-flops will be clocked when the corresponding data bit $A_oQ$ is shifted out of the A-Register of the computer 112. Therefore, the Z-Register output lines YL1–YL5, XL1–XL5, and MFE will change only between the last commanded state and the new commanded state without going through transient preload or shift states.

Servo Description

A description of the interaction of the data processor with a preferred embodiment of the servo arrangement for the system of this invention will now be provided. A detailed description of the servo arrangement is provided in the parent applications, which have been incorporated by reference. In particular, a detailed description of a servo control arrangement in accordance with the system of the present invention is set forth in said parent application Ser. No. 135,040 and a servo command structure in accordance with the present invention is set forth in said parent applications Ser. No. 134,958 and Ser. No. 246,867. Said parent application Ser. No. 246,867 is now U.S. Pat. No. 4,310,878. Said parent application Ser. No. 135,040 was refiled as application Ser. No. 339,817 now U.S. Pat. No. 4,034,276.

An apparatus and method is presented wherein a digital device precisely controls a path of an analog device. By providing integral path defining commands with an independent variable resolution finer than the resolution of the analog device with respect to that variable, the digital device is able to drive the analog device along a smooth but precisely controlled path substantially without discontinuities associated with the digital commands.

In a servo control system in accordance with the invention, a general purpose stored program computer generates integral commands to control a multi-axis servo system. The computer can operate open loop to command the execution of predefined commands as in a numerical control system or can operate closed loop to provide a response to parameters of controlled analog devices. The analog device itself may operate open loop or may have a closed servo loop using analog or time domain feedback signals.

The use of integral commands and time domain signals intrinsic to both the digital and analog domains permits the elimination of expensive analog to digital converters, digital to analog converters and digital differential analyzers. When a time domain integral command signal is compared with a time domain feedback signal, a very precise time domain error signal is attained from which an analog control signal may be generated simply and inexpensively.

The use of integral commands provides substantial advantages when applied to a servo control system. Because each integral command can substantially resolve the relative slopes of the controlled axes, the commands can be presented in real time at a rate commensurate with the response rate of the controlled mechanism and substantially independent of the slopes being resolved. In contrast, presently known systems require a data rate commensurate with the resolution of the system, as for instance one part in 10,000, which is substantially greater than the rate required for integral commands.

A stored program digital computer in accordance with the invention provides integral commands between set points to define a precisely controlled path. These integral commands may be provided directly as a time domain signal in the form of a phase referenced square wave. Alternatively, the computer may provide digital integral commands from which the time referenced square wave command signal is readily generated. The phase referenced square wave command signal is compared with similar feedback signals to produce a very precise time domain error signal which may take the form of an asymmetrical square wave. By providing the integral commands at a rate which exceeds the time resolution or response rate of the servos, a smoothing or filtering effect is attained wherein the servos follow the discontinuous integral commands with a smooth path closely following the intermediate commanded points.

A system is presented wherein a digital device controls an analog device to cause system variables to define precisely controlled paths substantially free of the discontinuities associated with the digital commands. This freedom from discontinuities will exist when the resolution of the independent variables is finer than the resolution of the system with respect to those variables. The dependent variables are system conditions which are being controlled and the independent variables are controlling system conditions. A dependent variable might be a system condition such as pressure or temperature or it might be the status of a mechanism with respect to an axis, such as position, velocity, or acceleration. An independent variable might be time, a system condition or the status of a mechanism.

In accordance with the invention, a data processor operates under program control to generate integral commands precisely controlling the position of a multi-axis servo with respect to time. Each integral command completely defines the relationship of each axis with respect to the other axes and with respect to time. By generating path defining commands with a time resolution equal to or finer than the time resolution of the analog device, the discontinuous integral commands are smoothed by the integrating or filtering effect of the physical inertia and electronics of the analog device. As long as the rate at which an analog system can respond to a command is substantially equaled or exceeded by the rate at which integral commands are generated, and if the magnitude of the commands does not exceed the response capability of the system, the actual path will closely follow the integral commands.

Communication between digital and analog devices is provided with time domain signals intrinsic to both the digital and analog domains. These time domain signals contain a very precise information content and can be manipulated with relatively simple equipment without loss of precision. They may also be used to easily generate signals in the analog or digital domains. As disclosed herein, integral time domain command signals may be generated directly by a computer or by a command structure in response to digital integral number commands generated by the computer. Time domain position feedback signals are generated directly by a properly excited analog resolver.

Although many different arrangements will become obvious to those skilled in the art, in the preferred embodiment of this invention a phase referenced square wave signal is generated directly by a digital computer under program control. The phase referenced square wave signal is a time domain signal and provides integral path defining commands to a closed loop square wave servo.

As an alternative arrangement shown in FIG. 1B, the data processor 112 receives a square wave position signal, a position error signal, and a velocity signal 123 to form a closed digital loop. The computer is responsive to discrete inputs with the Skip-On-Discrete instructions to precisely measure the duration or phase of these feedback signals and process them as digital integral numbers. Because the data processor 112 is now in a closed loop it can utilize the feedback signals to modify the integral commands and control the servos 120-122 as an adaptive controller. Use of adaptive control permits precise control over the instantaneous position error of each axis such as by varying the gain of a power amplifier.

Independent of the advantages attained by placing the data processor 112 in a closed loop, direct communication between the data processor and the servo in the time domain permits most components and operations of the command structure to be eliminated. By using the data processor 112 to perform additional real time operations, the command structure may be reduced to a reference square wave generator and a flip-flop, which serves a function similar to the flip-flop $N_{30}$ shown in FIG. 6 of parent application, APPARATUS AND METHOD FOR PRODUCING HIGH REGISTRATION PHOTO-MASKS. All square waves including the reference and command square waves may be derived in this manner.

The data processor 112 is responsive to the reference square wave as well as the feedback signals as discrete inputs and clocks a toggling flip-flop such as flip-flop $I_2$ with discrete outputs. These discrete outputs are synchronized with a reference squarewave and have a selected phase relationship indicating a commanded position.

Additionally, the data processor 112 may be programmed to provide time domain error signals by toggling a flip-flop $I_3$ using a technique similar to that used to generate the position command signal in conjunction with flip-flop $I_2$. The pulse width square wave signal is communicated to a digital to amplitude converter which generates the servo control signal. This time domain error signal may be provided either as an override of the normal time domain error signal under appropriate circumstances or in lieu thereof with the comparator circuits being completely eliminated.

Additional circuits may be used to reduce the task of the computer in generating command signals and sensing feedback signals. For instance, a counter may be used to measure or control the time between square wave transitions for phase or pulse width signals.

OSCILLOSCOPE DISPLAY

Figure 10A:
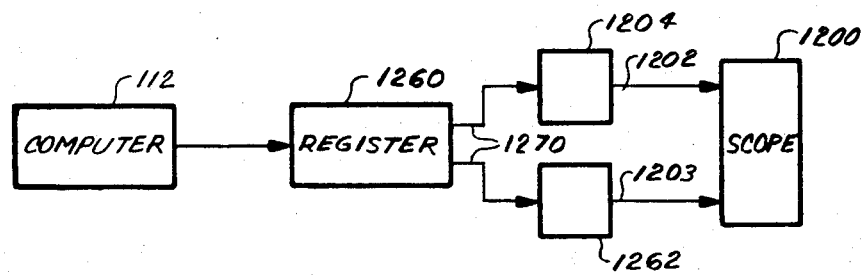
FIG. 10 is a schematic and block diagram representation of a display arrangement.

Output devices such as oscilloscopes and plotting machines may be used for part program checkout and for operational verification such as with a memory oscilloscope sold by Tektronix, Model No. 601/602 which will be described hereafter to exemplify one embodiment of this arrangement. As shown in FIG. 10A, oscilloscope 1200 accepts analog input signal X 1202 and analog input signal Y 1203 to control the X and Y deflection plates to trace an image on the oscilloscope tube face. The X and Y channels may be identical, so only the X channel will be described herein.

A first command embodiment is shown in FIG. 10A where the computer 112 outputs absolute position commands to register 1260 which may be the $C_I$ Register 560 (FIG. 5A). Register outputs 1270 excite D/A converters 1204 and 1062 to generate X analog signal 1202 and Y analog signal 1203 to control the deflection plates of oscilloscope 1200. The computer 112 provides absolute position information for contouring program operations which is also applicable for oscilloscope display operations.

Figure 10B:
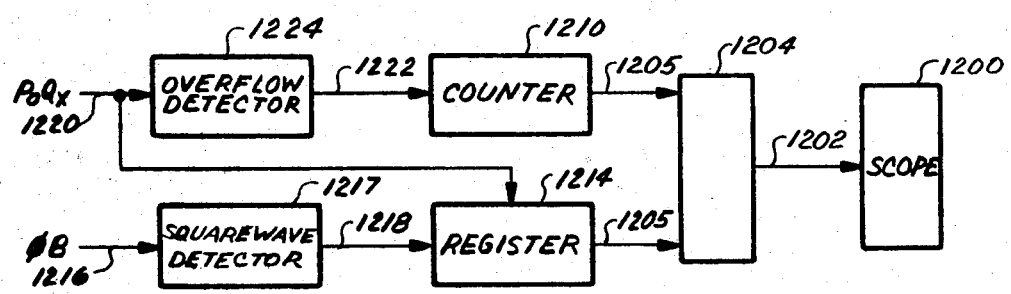

A second command embodiment is shown in FIG. 10B, where the most significant portion of the absolute position parameter is stored in counter 1210 and the least significant portion of the absolute position parameter is stored in register 1214. The digital signals from register 1214 and counter 1210 excite D/A converter 1204 to generate analog signal 1202 to control the X deflection plate of oscilloscope 1200.

Register 1214 contains the least significant portion of the command position from the P-Register 772 (FIG. 7F of parent U.S. Pat. No. 4,310,878) As described in parent U.S. Pat. No. 4,310,878; the contents of the P-Reigster 772 when the reference squarewave 1216 makes a selected transition represents the phase difference of the feedback and command parameters. Detector 1216 detects a selected transition of squarewave 1216 and generates enable signal 1218 to load the P-Register parameter 1220 into register 1241 as further described in the referenced parent applications. An arrangement for loading the P-Register parameter into register 1214 under control of a transition of a selected squarewave may be similar to that illustrated in FIGS. 5 and 6 and described for loading the P-Register parameter 275 into the D/A converter register 602 in parent application Ser. No. 302,771. Therefore register 1214 contains a digital number representative of the least significant portion of the commanded position.

Figure 10C:
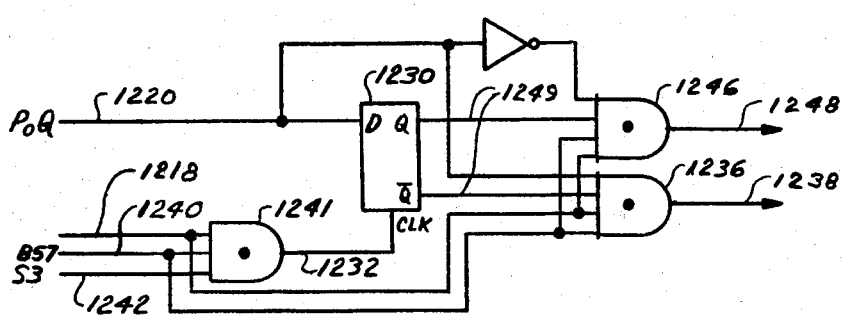

Counter 1210 contains the most significant portion of the command position, derived by counting overflow increments 1222 from the P-Register as detected by overflow detector 1224. One form of overflow detector is shown in FIG. 10C for illustrative purposes.

The serial P-Register signal 1220 is sensed by flip-flop 1230 and is clocked with signal 1232 that is gated with reference detector signal 1218 to define a P-Register number related to position, the BS7 signal 1240 to define the eighth bit time of the P-Register iteration and therefore the sign bit of the P-Register parameter and the clock pulse S3. The BS7 and S3 signals are described in detail in the parent applications. Flip-flop 1230 is clocked for one bit time for each cycle of the reference waveform 1216 to load the sign bit of the position parameter into flip-flop 1230. When this sign bit 1230 changes, it is indicative of an underflow or an overflow. Gates 1236 and 1246 detect an overflow and an underflow respectively to generate overflow signal 1238 and underflow signal 1248 to increment or decrement counter 1210 for updating the most significant part of the position parameter. The reference detector signal 1218 and the BS7 signal 1240 enable gates 1236 and 1246 when the flip-flop 1230 is clocked with signal 1232. If the input signal 1220 is different from the output signal 1249 at that particular time, then an overflow or underflow condition exists. If the change is from the zero to the one state, an overflow exists and if the change is from the one to the zero state, an underflow exists as detected with input signal POQ 1220 and flip-flop output signal 1249 to gates 1236 and 1246.

A system with a primary task of controlling a physical system and a subtask of displaying path related commands to an operator provides a desireable combination for on-line monitoring of system operations and off-line checkout, where the off-line operation does not necessitate a separate checkout system that becomes redundant in conjunction with the control system that performs the primary task.

The oscilloscope arrangement can be operated in several modes. In a first mode, the oscilloscope is used to trace and display the operation of the machine in real time as the machine servos are driven such as during the cutting of a part. This first mode provides feedback to the operator related to machine operations. In a second mode, the oscilloscope is used to trace and display the execution of the part program commands at high speed for part program verification without the control system 110 driving the machine 124. Other forms of operation will become obvious to those skilled in the art.

GENERAL CONSIDERATIONS

From the above description it will be apparent that there is thus provided a device of the character described possessing the particular features of advantage before enumerated as desireable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A machine control system comprising:
  an operator control panel for generating operator command signals;
  a memory CRT display for storing path information and for displaying path information in response to path display signals;
  feedback means for generating feedback signals related to machine operations;
  an integrated circuit read only memory for storing a plurality of instructions;
  an integrated circuit end point memory for storing digital path end point information;
  a data link to a host computer for communicating the path end point information from said host computer to said end point memory, said data link including means for storing the path end point information communicated from said host computer in said end point memory;
  a digital data processor for processing the digital path end point information stored in said end point memory under control of the instructions stored in said read only memory, said digital data processor including
    (a) means for processing the digital path end point information stored in said end point memory in response to the operator command signals from said operator control panel under control of the instructions stored in said read only memory,
    (b) feedback processing means for processing the digital path end point information stored in said end point memory in response to the feedback signals from said feedback means under control of the instructions stored in said read only memory,
    (c) means for generating the path display signals to said memory CRT display in response to the digital path end point information stored in said end point memory under control of the instructions stored in said read only memory, and
    (d) means for generating machine path control signals in response to the digital path end point information stored in said end point memory under control of the instructions stored in said read only memory; and
  control means for controlling a machine along a path in response to the machine control signals.

2. A display system comprising:
  a display for displaying real time smoothed and reduced multi-dimensional rotated and translated path information in response to a real time display signal;
  a data link for communicating path end point signals from a host computer;
  a disk memory for storing path end point signals communicated from said host computer over said data link;
  a keyboard for generating the multi-dimensional rotation command signal;
  translation command means for providing a multi-dimensional translation command signal; and
  an integrated circuit data processor for processing the path end point signals stored in said disk memory in real time in response to the multi-dimensional rotation command signal from said keyboard and the multi-dimensional translation command signal from said translation command means to generate real time display signals, wherein said data processor includes
    a. multi-dimensional rotation processing logic for performing multi-dimensional rotation processing of the path end point signals stored in said disk memory to generate multi-dimensional rotated path end point signals in response to the multi-dimensional rotation command signal from said keyboard,
    b. multi-dimensional translation processing logic for performing multi-dimensional translation processing of the path end point signals stored in said disk memory to generate multi-dimensional translated path end point signals in response to the multi-dimensional translation command signal from said translation command means under control of the program stored in said main memory,
    c. multi-dimensional scaling processing logic for performing multi-dimensional scaling processing of the path end point signals processed with said multi-dimensional rotation processing logic and with said multi-dimensional translation processing logic to generate reduced multi-dimensional rotated and translated path signals,
    d. path smoothing processing logic for performing path smoothing processing of the multi-dimensional reduced rotated and translated path signals processed with said multi-dimensional scaling processing logic to generate smoothed and reduced multi-dimensional rotated and translated path signals, and e. output logic for generating the real time display signal to said display as a real time smoothed and reduced multi-dimensional rotated and translated path display signal in response to the smoothed and reduced multi-dimensional rotated and translated path signals from said path smoothing processing logic.

3. A machine control system comprising:

an operator rotation control for generating an operator rotation command signal;

a CRT display for displaying rotated path information in response to analog rotated path display signals;

feedback means for generating feedback signals related to machine operations;

an integrated circuit read only memory for storing a plurality of instructions;

an integrated circuit object memory for storing digital object information;

a digital incremental processor for incrementally processing the digital object information stored in said object memory in response to the operator rotation command signal, said digital incremental processor including (a) rotation processing means for rotation processing of the digital object information stored in said object memory in response to the operator rotation command signal from said operator rotation control to generate rotated incremental digital object information;

(b) feedback processing means for processing the digital object information stored in said object memory in response to the feedback signals from said feedback means under control of the instructions stored in said read only memory, (c) display processing logic for generating incremental digital rotated path display signals in response to the rotated incremental digital object information from said rotation processing means under control of the operator rotation command signal from said operator rotation control, and (d) means for generating machine control signals under control of the instructions stored in said read only memory;

control means for controlling a machine in response to the machine control signals; and a digital to analog converter for generating the analog rotated path display signals to said CRT display in response to the incremental digital rotated path display signals from said display processing logic.

4. The system as set forth in claim 1 above, further comprising:

means for storing numeric information in said end point memory in response to numeric switch signals;

wherein said path display signal generating means includes means for generating the path display signals related to the digital path end point information in response to the numeric switch signals;

wherein said digital data processor further includes means for processing the end point information stored in said end point memory in response to at least one operation switch signal; and wherein said operator control panel includes numeric switch elements for generating the numeric switch signals and operation switch elements for generating the operation switch signals.

5. A machine control system comprising:

an operator control panel for generating a stop command signal;

a CRT display for displaying size reduced path information in response to size reduced path display signals;

machine feedback means for generating feedback signals related to machine operations;

an integrated circuit read only memory for storing a plurality of instructions, an integrated circuit object memory for storing digital object information;

a digital incremental processor for incrementally processing the digital object information stored in said object memory, said digital incremental processor including (a) size reduction processing means for size reduction processing of the digital object information stored in said object memory to generate size reduced incremental digital object information, (b) feedback processing means for processing the digital object information stored in said object memory in response to the feedback signals from said machine feedback means under control of the instructions stored in said read only memory, (c) display processing means for generating the size reduced path display signals to said CRT display in response to the size reduced incremental digital object information generated with said size reduction processing means, and (d) means for generating a stop control signal in response to the stop command signal from said operator control panel under control of the instructions stored in said read only memory; and control means for stopping motion of a machine in response to the stop control signal.

6. A machine control system comprising:

an operator translation and rotation control for generating operator translation and rotation command signals;

a CRT display for displaying smoothed scaled translated and rotated objects in response to incremental motion smoothed scaled translated and rotated digital display signal from a display signal generating means, said CRT display including (a) means for receiving the incremental motion smoothed scaled translated and rotated digital display signals, (b) means for storing information to be displayed, (c) means for incrementally updating the stored information to be displayed in response to the incremental motion smoothed scaled translated and rotated digital display signals received with said receiving means, and (d) means for generating a visual image of the incrementally updated stored information;

feedback means for generating a feedback signal related to a machine operation;

an integrated circuit read only memory for storing a plurality of instructions;

an integrated circuit scratch pad memory for storing digital information;

a digital data processor for processing the digital information stored in said scratch pad memory, said digital data processor including
(a) translation and rotation processing means for performing translation and rotation processing of the digital information stored in said scratch pad memory in response to the operator translation and rotation command signals from said operator translation and rotation control under control of the instructions stored in said read only memory to generate translated and rotated digital information,
(b) scaling processing means for performing scaling processing of the translated and rotated digital information generated with said translation and rotation processing means to generate scaled translated and rotated digital information,
(c) smoothing processing means for performing smoothing processing of the scaled translated and rotated digital information generated with said scaling processing means to generate smoothed scaled translated and rotated digital information,
(d) means for generating an incremental motion smoothed scaled translated and rotated digital display signal to said CRT display in response to the smoothed scaled translated and rotated digital information generated with said smoothing processing means to display smoothed scaled translated and rotated information to an operator, and
(e) means for generating machine control signals in response to the feedback signals from said machine feedback means under control of the instructions stored in said read only memory; and
control means for controlling a machine in response to the machine control signals.

7. A machine control system comprising:
an operator control panel for generating operator command signals;
a CRT display for design verification of a path in response to path display signals;
machine feedback means for generating feedback signals related to machine operations;
an integrated circuit read only memory for storing a plurality of instructions;
an integrated circuit end point memory for storing digital end point information;
read only memory address means for generating read only memory adress signals;
means for accessing stored instructions from said read only memory in response to the read only memory address signals;
end point memory address means for generating end point memory address signals in response to the stored instructions accessed from said read only memory;
means for accessing stored digital end point information from said end point memory in response to the end point memory address signals;
a digital data processor for processing digital information accessed from said end point memory in response to instructions accessed from said read only memory, said digital data processor including
(a) means for processing the digital end point information stored in said end point memory in response to the operator command signals from said operator control panel under control of instructions accessed from said read only memory,
(b) feedback processing means for processing digital end point information accessed from said end point memory in response to the feedback signals from said machine feedback means under control of the instructions accessed from said read only memory,
(c) means for generating the path display signals to said CRT display in response to digital end point information accessed from said end point memory under control of instructions accessed from said read only memory, and
(d) means for generating machine control signals in response to digital end point information accessed from said scratch pad memory under control of instructions accessed from said read only memory; and
control means for controlling a machine along a path in response to the machine control signals.

8. A machine control system comprising:
an operator control panel for generating operator command signals;
a CRT display for displaying smoothed and reduced multi-dimensional rotated and translated path information in response to path display signals;
machine feedback means for generating feedback signals related to machine operations;
an integrated circuit read only memory for storing a plurality of instructions;
an integrated circuit scratch pad memory for storing digital information, said scratch pad memory incuding means for storing a table of digital words;
means for accessing a digital word from the table of digital words stored in said scratch pad memory table storing means in response to an operator command signal;
a digital data processor for processing the digital information stored in said scratch pad memory under control of the instructions stored in said read only memory, said digital data processor including
(a) multi-dimensional rotation processing for performing multi-dimensional rotational processing of the digital information stored in said scratch pad memory to generate multi-dimensional rotated path signals in response to the operator command signals from said operator control panel,
(b) multi-dimensional translation processing means for performing multi-dimensional translation processing of the multi-dimensional rotated path signals from said multi-dimensional rotation processing means to generate multi-dimensional translated and rotated path signals in response to the operator command signals from said operator control panel,
(c) multi-dimensional scaling processing means for performing multi-dimensional scaling processing of the multi-dimensional translated and rotated path signals from said multi-dimensional translation processing means to generate reduced multi-dimensional rotated and translated path signals;
(d) path smoothing processing means for performing path smoothing processing of the multi-dimensional reduced rotated and translated path signals processed with said multi-dimensional scaling processing means to generate smoothed and reduced multi-dimensional rotated and translated path signals, and (e) feedback processing means for processing the digital information stored in said scratch pad memory in response to the feedback signals from said machine feedback means under control of the instructions stored in said read only memory, (f) means for generating the path display signals to said CRT display in response to the smoothed and reduced multi-dimensional rotated and translated path signals from said path smoothing processing means, and (g) means for generating machine control signals in response to the digital word accessed from the table of words stored in said scratch pad memory under control of the instructions stored in said read only memory; and control means for controlling a machine in response to the machine control signals.

9. A machine control system comprising:

an operator translation and rotation control for generating operator translation and rotation command signals;

a CRT display for displaying smoothed scaled translated and rotated information to an operator in response to an analog display signal from a digital to analog converter;

feedback means for generating a feedback signal related to a machine operation;

an integrated circuit read only memory for storing a plurality of instructions;

an integrated circuit scratch pad memory for storing digital information;

a digital data processor for processing the digital information stored in said scratch pad memory, said digital data processor including (a) translation and rotation processing means for performing translation and rotation processing of the digital information stored in said scratch pad memory in response to the operator translation and rotation command signals from said operator translation and rotation control under control of the instructions stored in said read only memory to generate translated and rotated digital information, (b) scaling processing means for performing scaling processing of the translated and rotated digital information generated with said translation and rotation processing means to generate scaled translated and rotated digital information, (c) smoothing processing means for performing smoothing processing of the scaled translated and rotated digital information generated with said scaling processing means to generate smoothed scaled translated and rotated digital information, (d) means for generating a smoothed scaled translated and rotated digital display signal in response to the smoothed scaled translated and rotated digital information generated with said smoothing processing means to display smoothed scaled translated and rotated information to an operator, and (e) means for generating machine control signals in response to the feedback signal from said feedback means under control of the instructions stored in said read only memory;

control means for controlling a machine in response to the machine control signals; and a digital to analog converter for generating the analog display signal to said CRT display in response to the smoothed scaled translated and rotated digital display signal generated with said display signal generating means.

10. The system as set forth in claim 1 above, wherein said digital end point information processing means includes:

a. multi-dimensional rotation processing means for performing multi-dimensional rotation processing of the digital path end point information from said end point memory to generate multi-dimensional rotated object path end point signals, b. multi-dimensional translation processing means for performing multi-dimensional translation processing of the digital path end point information from said end point memory to generate multi-dimensional translated object path end point signals, c. multi-dimensional scaling processing means for performing multi-dimensional scaling processing of the digital path end point information processed with said multi-dimensional rotation processing means and with said multi-dimensional translation processing means to generate reduced multi-dimensional rotated and translated path signals, and d. path smoothing processing means for performing path smoothing processing of the multi-dimensional reduced rotated and translated path signals processed with said multi-dimensional scaling processing means to generate smoothed and reduced multi-dimensional rotated and translated path signals;

wherein said path display signal generating means includes means for generating the path display signals as real time smoothed and reduced multi-dimensional rotated and translated path display signals in response to the smoothed and reduced multi-dimensional rotated and translated path signals from said path smoothing processing means; and wherein said memory CRT display includes means for storing the real time smoothed and reduced multi-dimensional rotated and translated path information in response to the path display signals and for displaying the real time smoothed and reduced multi-dimensional rotated and translated stored path information.

11. The system as set forth in claim 10 above, wherein said data link includes means for communicating the path end point information as parts program information, wherein said end point memory is a parts program memory for storing parts program commands; wherein said digital data processor is a stored program data processor for processing the digital path end point information under control of a program stored in said read only memory; wherein the real time display signals are generated at a rate for smooth display operation without discontinuities; wherein said rotation processing means includes incremental axis alignment processing for incrementally performing the multi-dimensional rotation processing of the digital path end point information to obtain incremental multi-dimensional rotated axis alignment digital path end point information; wherein said translation processing means includes incremental x, y, and z axis processing means for incrementally performing the multi-dimensional translation processing of the digital path end point information to obtain incremental multi-dimensional translated object path end point signals, wherein said scaling processing means includes incremental size reduction x, y, and z scaling means for incrementally reducing the x, y, and z dimensions with incremental scaling processing of the x, y, and z digital path end point information to obtain incremental reduced x, y and z digital path end point information; and wherein said path smoothing processing means includes incremental fairing contour processing means for incrementally performing the path smoothing processing of the digital path end point information to obtain incremental smoothed digital path end point information.

12. The system as set forth in claim 1 above, wherein said operator control panel includes an operator translation and rotation control for generating operator translation and rotation command signal; wherein said memory CRT display includes means for displaying the path information as smoothed scaled translated and rotated path information to an operator in response to analog path display signals from a digital to analog converter; wherein said digital data processor further includes (e) translation and rotation processing means for performing translation and rotation processing of the the path display signals from said path display signal generating means in response to the operator translation and rotation command signals from said operator translation and rotation control to generate translated and rotated path display signals, (f) scaling processing means for performing scaling processing of the translated and rotated path display signals generated with said translation and rotation processing means to generate scaled translated and rotated path display signals, (g) smoothing processing means for performing smoothing processing of the scaled translated and rotated path display signals generated with said scaling processing means to generate smoothed scaled translated and rotated path display signals, and (h) path display signal generating means for generating smoothed scaled translated and rotated digital path display signals in response to the smoothed scaled translated and rotated path display signals generated with said smoothing processing means to display smoothed scaled translated and rotated information to an operator; and wherein said system further comprises a digital to analog converter for generating the analog path display signal to said memory CRT display in response to the smoothed scaled translated and rotated digital path display signal generated with said path display signal generating means.

13. The system as set forth in claim 12 above, wherein said data link includes means for communicating the path end point signals as parts program motion command signals; wherein said end point memory is a parts program memory for storing parts program end point commands; wherein said operator translation and rotation control include operator switches for generating the translation and rotation command signals as switch translation and rotation command signals; wherein said digital data processor is a stored program data processor for processing the digital path end point information under control of a stored program; wherein the machine control signals are generated at a machine related rate for smooth path operation without discontinuities; wherein said translation and rotation processing means includes incremental axis alignment processing means for incrementally performing multi-dimensional rotation processing of the path end point information to obtain incremental multi-dimensional rotated axis alignment path display signals in response to the translation and rotation command signals; wherein said translation and rotation processing means further includes incremental x, y, and z axis processing means for incrementally performing multi-dimensional translation processing of the incremental multi-dimensional rotated axis alignment path display signals to obtain incremental multi-dimensional translated and rotated path display signals in response to the multi-dimensional translation and rotation command signals; wherein said scaling processing means includes incremental size reduction x, y, and z scaling means for incrementally reducing the x, y, and z dimensional with incremental scaling processing of the incremental multi-dimensional translated and rotated path display signals to obtain incremental reduced translated and rotated x, y, and z path display signals; wherein said smoothing processing means includes incremental fairing contour processing means for incrementally performing the path smoothing processing of the incremental reduced translated and rotated x, y, and z path display signals to obtain incremental smoothed reduced translated and rotated x, y, and z path display signals; wherein said digital to analog converter includes means for generating the path display signal as a smoothed and reduced multi-dimensional rotated and translated path control signal in response to the incremental smoothed reduced translated and rotated x, y, and z path display signals.

14. The system as set forth in claim 1 above, wherein said memory CRT display provides for design verification of a path in response to the path display signals.

15. The system as set forth in claim 2 above, wherein said multi-dimensional rotation processing logic includes incremental processing means for performing the multi-dimensional rotation processing in incremental processing form.

16. The system as set forth in claim 2 above, wherein said multi-dimensional rotation processing logic includes axis alignment processing means for performing the multi-dimensional rotation processing to generate the multi-dimensional rotated path end point signals to align an axis that was misaligned.

17. The system as set forth in claim 2 above, wherein said multi-dimensional rotation processing logic includes axis alignment processing means for performing the multi-dimensional rotation processing of the path end point signals to align axis that are misaligned to generate the multi-dimensional rotated path end point signals as aligned end point signals in response to the multi-dimensional rotation command signal from said keyboard.

18. The system as set forth in claim 2 above, wherein said multi-dimensional rotation processing logic includes axis alignment processing means for performing the multi-dimensional rotation processing of the path end point signals as two dimensional rotation processing to align two axis that are misaligned to generate the multi-dimensional rotated path end point signals as two dimensional aligned end point signals in response to the multi-dimensional rotation command signal from said keyboard.

19. The system as set forth in claim 2 above, wherein said multi-dimensional translation processing logic includes means for performing the multi-dimensional translation processing of the path end point signals as three dimensional translation processing to generate the multi-dimensional translated path end point signals as two dimensional translated path end point signals in response to the multi-dimensional translation command signals from said translation command means.

20. The system as set forth in claim 2 above, wherein said an integrated circuit data processor includes an incremental data processor for incrementally incrementally processing the path end point signals stored in said disk memory in real time in response to the multi-dimensional rotation command signal from said keyboard and the multi-dimensional translation command signal from said translation command means to generate the real time incremental display signals.

21. The system as set forth in claim 2 above, wherein said multi-dimensional scaling processing logic includes means for performing the multi-dimensional scaling processing of the path end point signals processed with said multi-dimensional rotation processing means and with said multi-dimensional translation processing means to generate the reduced multi-dimensional rotated and translated path signals as reduced three dimensional rotated and translated path signals.

22. The system as set forth in claim 2 above, wherein said path smoothing processing logic includes fairing contour means for performing the path smoothing processing of the multi-dimensional reduced rotated and translated path signals as fairing contour smoothing processing to provide a smooth contour between two paths to generate the smoothed and reduced multi-dimensional rotated and translated path signals.

23. The system as set forth in claim 2 above, wherein said path smoothing processing logic includes continuous means for performing the path smoothing processing of the multi-dimensional reduced rotated and translated path signals as high rate continuous smoothing processing to provide a smooth path to generate smoothed and reduced multi-dimensional rotated and translated path signals.

24. The system as set forth in claim 2 above, wherein said data link is a parts program data link for generating the path end point signals as parts program path end point signals; where said translation command means is an operator translation switch for generating the translation command signal as a switch rotation command signal; wherein said data processor is a stored program data processor for processing the path end point command signals under control of the program; wherein said rotation processing logic includes incremental axis alignment processing logic for incrementally performing the multi-dimensional rotating processing of the path end point signals to generate incremental multi-dimensional rotated axis alignment path end point signals in response to the multi-dimensional rotation command signal from said keyboard; wherein said translation processing logic includes incremental x, y, and z axis processing logic for incrementally performing multi-dimensional translation processing of the rotated path end point signals to generate incremental multi-dimensional translated and rotated path end point signals in response to the translation command signal; wherein said smoothing logic includes incremental fairing contour processing means for incrementally performing path smoothing processing of the multi-dimensional reduced rotated and translated path signals to generate incremental smoothed rotated and translated path signals; and wherein said output logic includes means for generating the real time smoothed and reduced multi-dimensional rotated and translated path display signals under control of a stored program.

25. The system as set forth in claim 3 above, further comprising an operator translation control for generating an operator translation command signal; wherein said CRT display includes means for displaying smoothed scaled translated and rotated information in response to the analog rotated path display signals; wherein said digital incremental processor further includes (e) translation processing means for performing translation processing of the rotated incremental digital object information from said rotation processing means in response to the operator translation control to generate translated and rotated incremental digital object information, (f) scaling processing means for performing scaling processing of the translated and rotated incremental digital object information generated with said translation processing means to generate scaled translated and rotated incremental digital object information, (g) smoothing processing means for performing smoothing processing of the scaled translated and rotated incremental digital object information generated with said scaling processing means to generate smoothed scaled translated and rotated incremental digital object information, and (d) means for generating a smoothed scaled translated and rotated digital display signal in response to the smoothed scaled translated and rotated incremental digital object information generated with said smoothing processing means to display smoothed scaled translated and rotated information to an operator; and wherein said digital to analog converter includes means for generating the analog rotated path display signal to said CRT display in response to the smoothed scaled translated and rotated digital display signal generated with said digital display signal generating means.

26. The system as set forth in claim 5 above, wherein said operator control panel includes an operator translation and rotation control for generating operator translation and rotation command signals; wherein said CRT display includes means for displaying smoothed translated and rotated reduced path information in response to a smoothed translated and rotated size reduced path display signal from a digital to analog converter; wherein said digital incremental processor further includes (e) translation and rotation processing means for performing translation and rotation processing of the size reduced incremental digital object information from said size reduction processing means in response to the operator translation and rotation command signals from said operator translation and rotation control to generate translated and rotated size reduced incremental digital object information, (f) smoothing processing means for performing smoothing processing of the translated and rotated size reduced incremental digital object information generated with said translation and rotation processing means to generate smoothed translated and rotated size reduced incremental digital object information, and (g) means for generating the size reduced path display signals as smoothed translated and rotated size reduced path display signals in response to the smoothed translated and rotated size reduced incremental digital object information generated with said smoothing processing means to display smoothed translated and rotated size reduced path information to an operator; and wherein said system further comprises a digital to analog converter for generating the smoothed translated and rotated size reduced path display signal to said CRT display in response to the smoothed translated and rotated size reduced path information generated with said display signal generating means.

27. The system as set forth in claim 6 above, wherein said data processor includes incremental processing means for processing the digital information stored in said scratch pad memory in incremental processing form.

28. The system as set forth in claim 6 above, wherein said translation and rotation processing means includes axis alignment processing means for performing rotation processing of the digital information to generate the translated and rotated digital information to align axis that were misaligned.

29. The system as set forth in claim 6 above, wherein said translation and rotation processing means includes axis alignment processing means for performing the rotation processing of the digital information to align axis that are misaligned to generate the translated and rotated digital information as aligned digital information in response to the translation and rotation command signal from said operator translation and rotation control.

30. The system as set forth in claim 6 above, wherein said translation and rotation processing means includes axis alignment processing means for performing rotation processing of the digital information as two dimensional rotation processing to align two axis that are misaligned to generate the translated and rotated digital information as two dimensional aligned digital information in response to said operator translation and rotation command signals from said operator translation and rotation control.

31. The system as set forth in claim 6 above, wherein said translation and rotation processing means includes means for performing the translated and rotation processing of the digital information as three dimensional translation and rotation processing to generate the translated and rotated digital information as two dimensional translated and rotated digital information in response to the operator translation and rotation command signals from said operator translation and rotation control.

32. The system as set forth in claim 6 above, wherein said digital data processor includes an incremental data processor for incrementally processing the digital information stored in said scratch pad memory in real time in response to the operator translation and rotation command signals from said translation and rotation to generate the incremental motion smoothed scaled translated and rotated digital display signals to said CRT display.

33. The system as set forth in claim 6 above, wherein said scaling processing means includes means for performing the scaling processing of the translated and rotated digital information to generate the scaled translated and rotated digital information as reduced three dimensional translated and rotated digital information.

34. The system as set forth in claim 6 above, wherein said smoothing processing means includes fairing contour means for performing the smoothing processing of the scaled translated and rotated digital information as fairing contour smoothing processing to provide a smooth contour between two paths to generate smoothed and reduced multi-dimensional translated and rotated digital information.

35. The system as set forth in claim 6 above, wherein said smoothing processing means includes continuous means for performing the smoothing processing of the scaled translated and rotated digital information as high rate continuous smoothing processing to provide a smooth path to generate smoothed and reduced multi-dimensional translated and rotated digital information.

36. The system as set forth in claim 6 above, further comprising a data link to a host computer for communicating digital information from the host computer to be stored in said scratch pad memory.

37. The system as set forth in claim 6 above, wherein said operator translation and rotation control includes an operator rotation switch for generating the translation and rotation command signals as switch translation and rotation command signals; wherein said digital data processor is a stored program data processor for processing the digital information under control of a program stored in said read only memory; wherein the smoothed scaled translated and rotated digital information generated with said smoothing processing means is generated in real time for smooth path operation without discontinuities; wherein said translation and rotation processing means includes incremental axis alignment processing logic for incrementally performing rotation of the digital information to obtain incremental multi-dimensional rotated axis alignment motion command signals in response to the translation and rotation command signals from said operator translation and rotation control; wherein said translation and rotation processing means further includes incremental x, y, and z axis processing logic for incrementally performing multi-dimensional translation processing of the rotated motion command signals to obtain incremental multi-dimensional translated and rotated motion command signals in response to the translation and rotation command signals; wherein said smoothing processing means includes incremental fairing contour processing means for incrementally performing path smoothing processing of the rotated and translated motion command signals to obtain incremental smoothed rotated and translated motion control signals; and wherein said digital display signal generating means includes a program responsive data processor output circuit for generating the smoothed scaled translated and rotated digital display signal under control of the program stored in said read only memory.

38. The system as set forth in claim 7 above, wherein said operator control panel includes an operator translation and rotation control for generating operator translation and rotation command signals; and wherein said CRT display includes means for displaying smoothed scaled translated and rotated information to an operator in response to an analog display signal from a digital to analog converter; wherein said digital end point information processing means further includes (1) translation and rotation processing means for performing translation and rotation processing of the digital end point information stored in said end point memory in response to the operator translation and rotation command signals from said operator translation and rotation control to generate translated and rotated digital end point information, (2) scaling processing means for performing scaling processing of the translated and rotated digital end point information generated with said translation and rotation processing means to generate scaled translated and rotated digital end point information, and (3) smoothing processing means for performing smoothing processing of the scaled translated and rotated digital end point information generated with said scaling processing means to generate smoothed scaled translated and rotated end point digital information;

and wherein said path display signal generating means includes means for generating the path display signal as smoothed scaled translated and rotated digital display signals in response to the smoothed scaled translated and rotated digital end point information generated with said smoothing processing means to display smoothed scaled translated and rotated information to an operator; and wherein said system further comprises a digital to analog converter for generating the analog display signal to said CRT display in response to the smoothed scaled translated and rotated digital end point information responsive path display signal generated with said path display signals generating means.

* * * * *